United States Patent
Zeng et al.

(10) Patent No.: US 11,736,074 B2
(45) Date of Patent: Aug. 22, 2023

(54) NOISE REDUCTION IN HIGH FREQUENCY AMPLIFIERS USING TRANSMISSION LINES TO PROVIDE FEEDBACK

(71) Applicant: The Regents of the University of California, Oakland, CA (US)

(72) Inventors: Tianchi Zeng, Santa Cruz, CA (US); Kenneth Pedrotti, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 178 days.

(21) Appl. No.: 16/989,727

(22) Filed: Aug. 10, 2020

(65) Prior Publication Data
US 2021/0044260 A1 Feb. 11, 2021

Related U.S. Application Data
(60) Provisional application No. 62/884,299, filed on Aug. 8, 2019.

(51) Int. Cl.
*H03F 1/34* (2006.01)
*H03F 3/193* (2006.01)
*H03F 1/56* (2006.01)

(52) U.S. Cl.
CPC ............. *H03F 3/193* (2013.01); *H03F 1/56* (2013.01); *H03F 2200/294* (2013.01); *H03F 2200/372* (2013.01); *H03F 2200/451* (2013.01)

(58) Field of Classification Search
CPC ...................................................... H03F 1/34
USPC ........................................ 330/94, 97, 107
See application file for complete search history.

(56) References Cited

U.S. PATENT DOCUMENTS

| | | | |
|---|---|---|---|
| 2,210,503 A * | 8/1940 | Shaw | H03F 1/36 330/83 |
| 3,122,648 A * | 2/1964 | Rufer | G04F 10/04 368/119 |
| 3,315,180 A * | 4/1967 | Racy | H01P 7/04 330/56 |
| 4,370,624 A * | 1/1983 | Ogawa | H04B 3/36 330/304 |
| 4,856,095 A * | 8/1989 | Rauscher | H04B 10/60 398/203 |
| 5,276,406 A * | 1/1994 | Samay | H03F 3/1935 330/277 |
| 6,225,756 B1 * | 5/2001 | Gitsevich | H05B 41/24 333/17.3 |

(Continued)

FOREIGN PATENT DOCUMENTS

| | | |
|---|---|---|
| KR | 100856131 B1 | 9/2008 |
| KR | 100952666 B1 | 4/2010 |
| KR | 1020160069376 A | 6/2016 |

OTHER PUBLICATIONS

PCT International Search Report and Written Opinion dated Nov. 24, 2020 for PCT Application No. PCT/US2020/045668.

(Continued)

*Primary Examiner* — Henry Choe
(74) *Attorney, Agent, or Firm* — Gates & Cooper LLP

(57) ABSTRACT

A circuit including an amplifier having an input and an output; and a feedback path comprising a transmission line electrically coupled or electrically connected to the output and the input. A low noise amplifier including the circuit wherein the feedback path cancels noise generated in the low noise amplifier.

18 Claims, 68 Drawing Sheets

(56) References Cited

U.S. PATENT DOCUMENTS

| | | | | |
|---|---|---|---|---|
| 6,552,620 | B2* | 4/2003 | Gitsevich | H03B 1/02 |
| | | | | 331/177 V |
| 7,456,691 | B2* | 11/2008 | Minichshofer | H03F 1/34 |
| | | | | 330/311 |
| 8,310,309 | B2 | 11/2012 | Behera et al. | |
| 10,868,503 | B2* | 12/2020 | Choi | H03F 3/211 |
| 2006/0001492 | A1* | 1/2006 | Chang | H03F 3/191 |
| | | | | 330/306 |
| 2009/0121791 | A1* | 5/2009 | Lu | H03F 3/605 |
| | | | | 330/311 |
| 2016/0277049 | A1 | 9/2016 | Kang et al. | |

OTHER PUBLICATIONS

Blaakmeer et al., "Wideband Balun-LNA with Simultaneous Output Balancing, Noise-Canceling and Distortion-Canceling," IEEE Journal of Solid-State Circuit, vol. 43, No. 6, Jun. 2008, pp. 1341-1350.

Blaakmeer et al.,, "A wideband Noise-Canceling CMOS LNA exploiting a Transformer", IEEE 0 RFIC Symposium, 2006, pp. 16-20.

Bruccoleri et al., "Wide-Band CMOS Low-Noise Amplifier Exploiting Thermal Noise Canceling," IEEE Journal of Solid-State Circuit, vol. 39, No. 2, 2004, pp. 275-282.

Zeng, "Transmission Line Based Noise-Canceling LNA Design in 60GHz Communication ". University of California Santa Cruz, Dec. 2019, 204 pages.

* cited by examiner

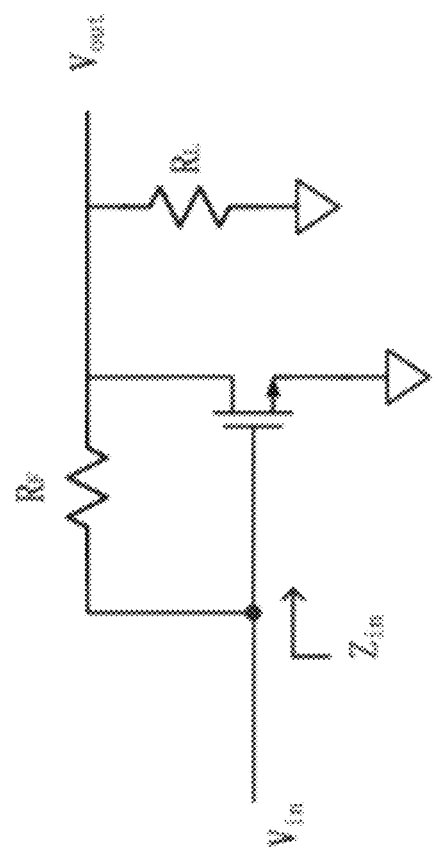
Fig. 1A

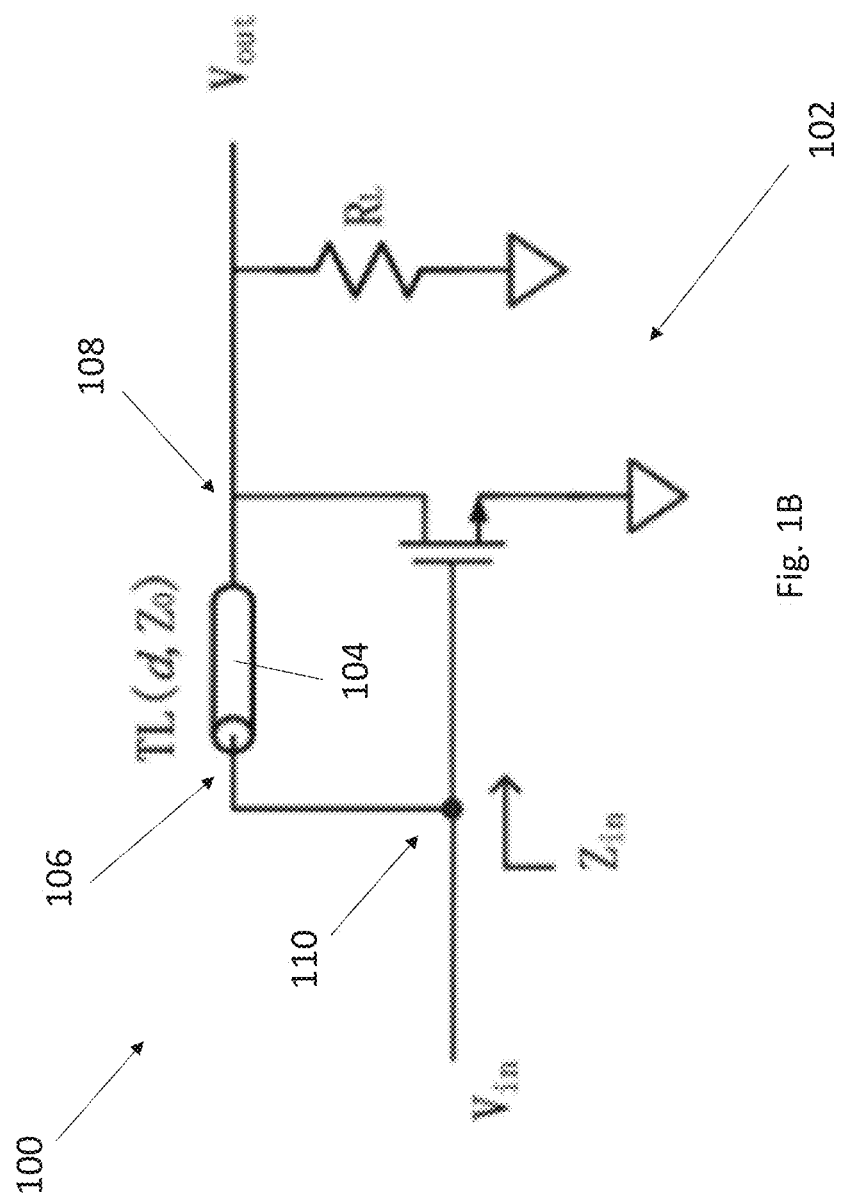
Fig. 1B

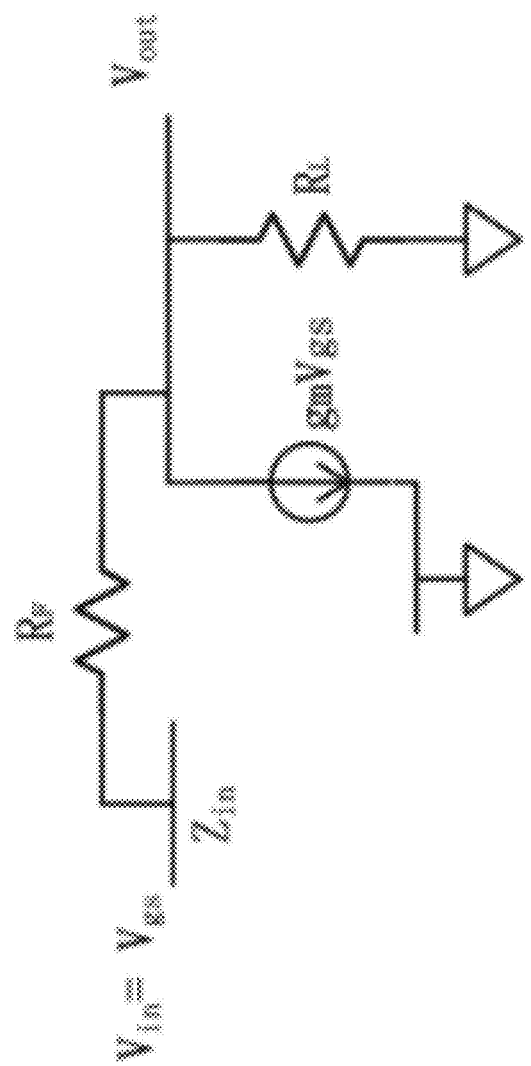
Fig. 2

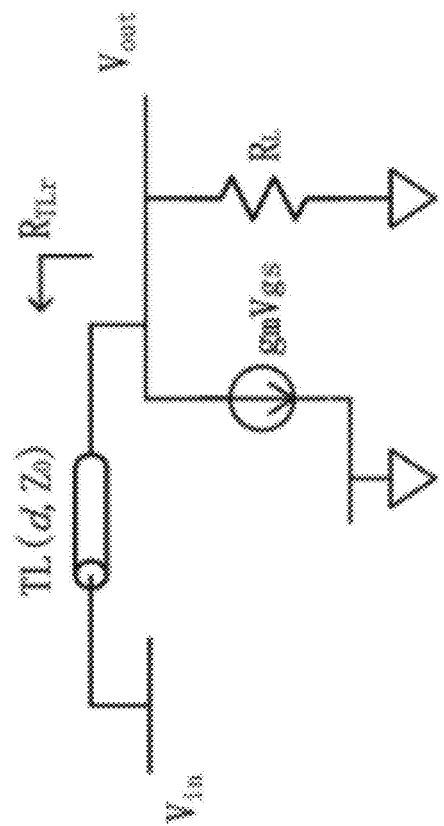
Fig. 3

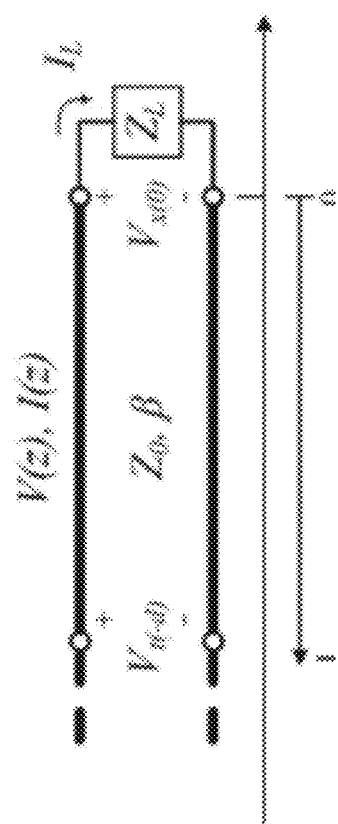
Fig. 4

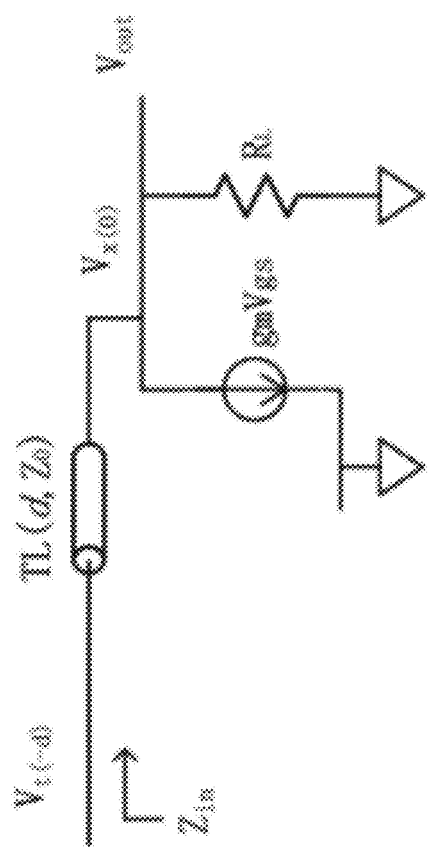
Fig. 5

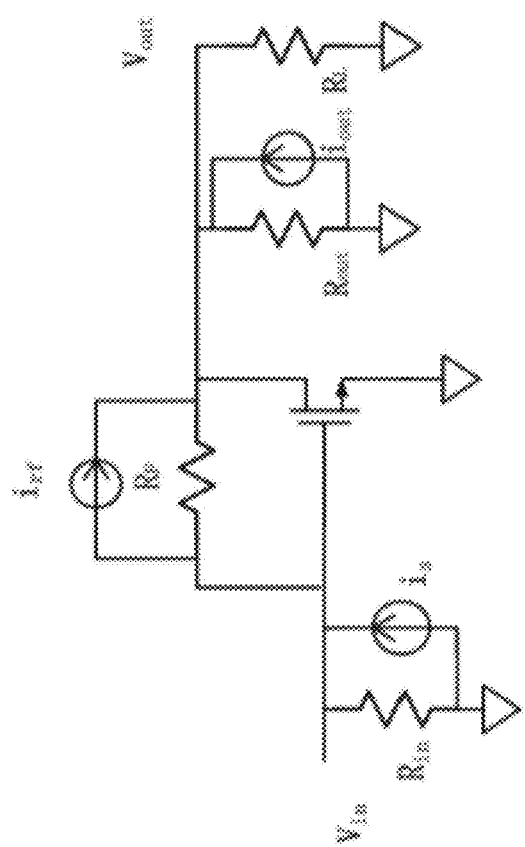
Fig. 6

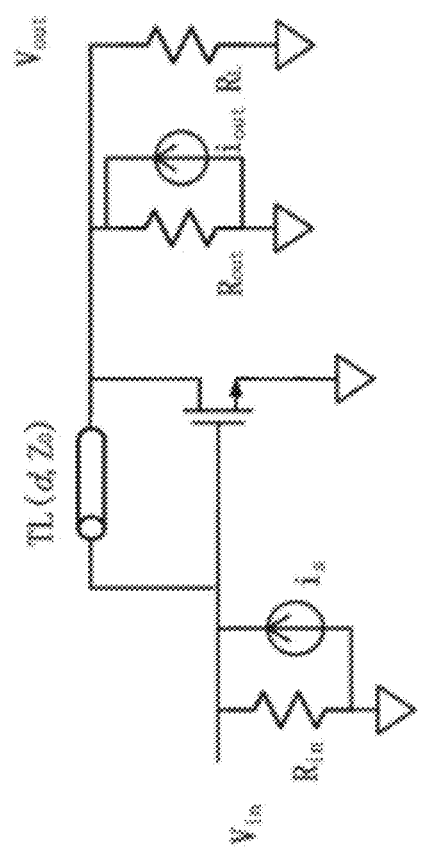
Fig. 7

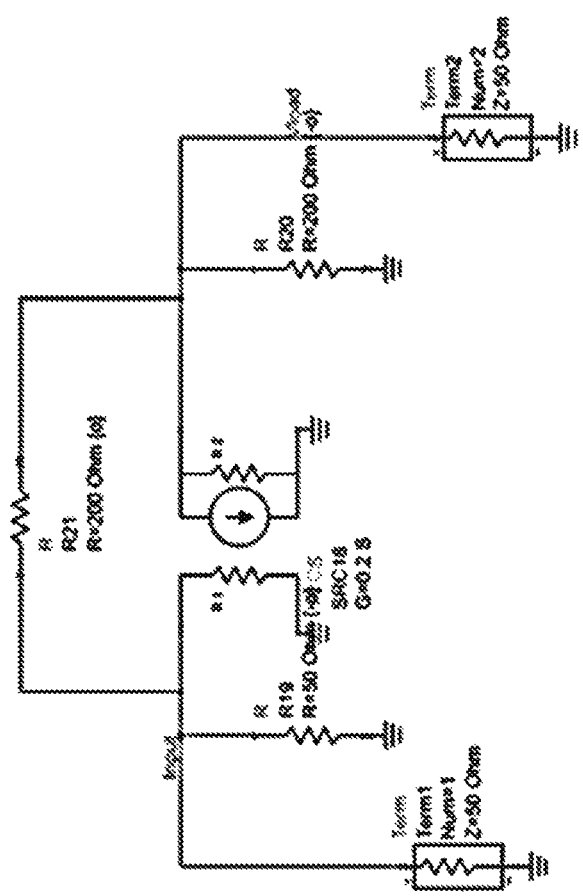
Fig. 8A

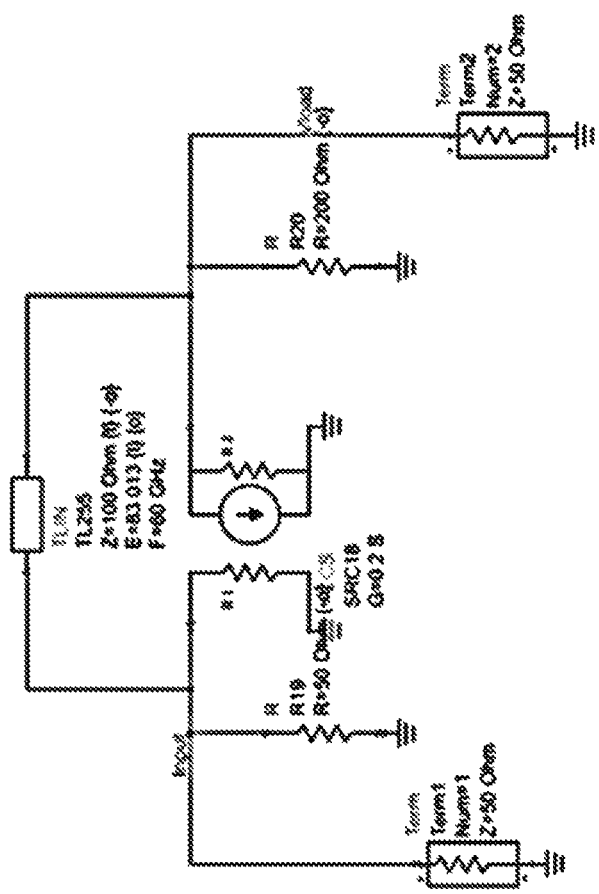
Fig. 8B

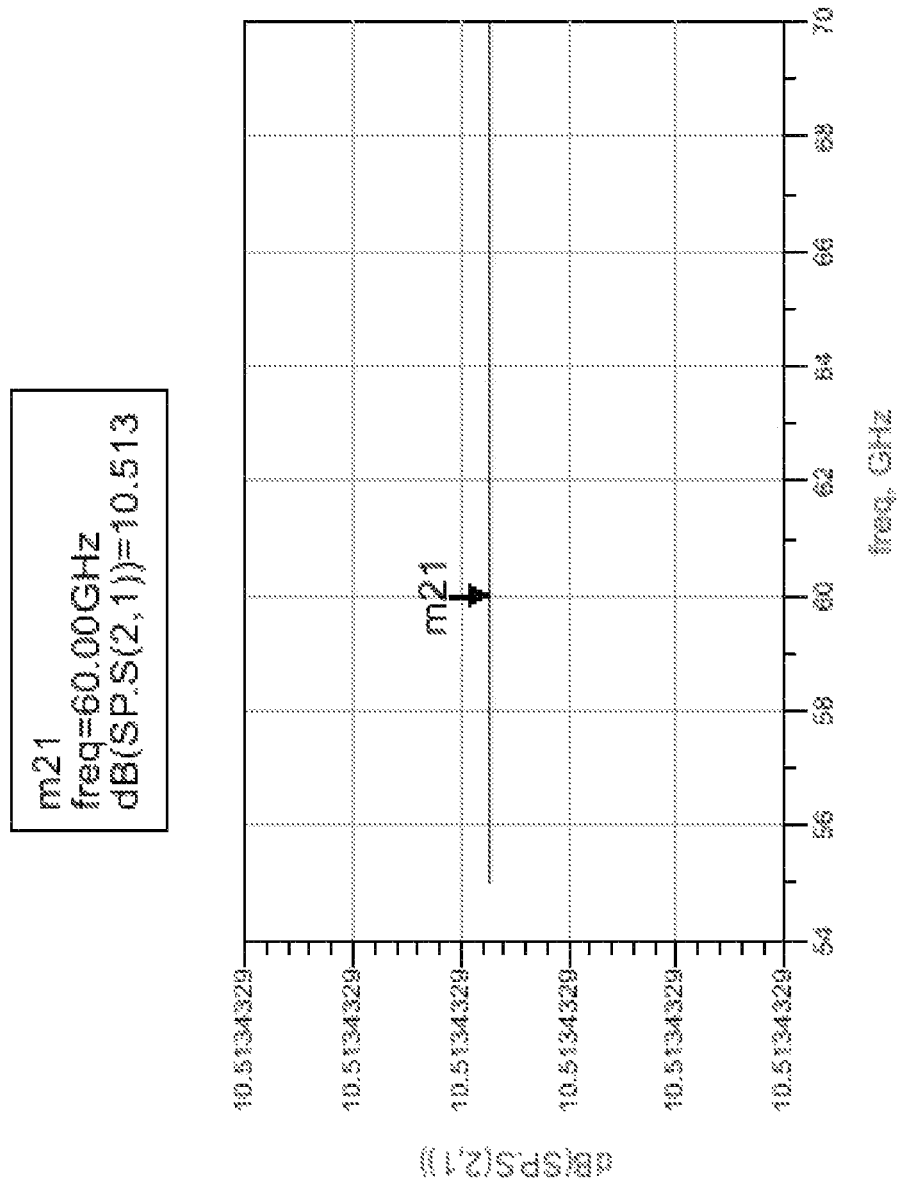
Fig. 9A

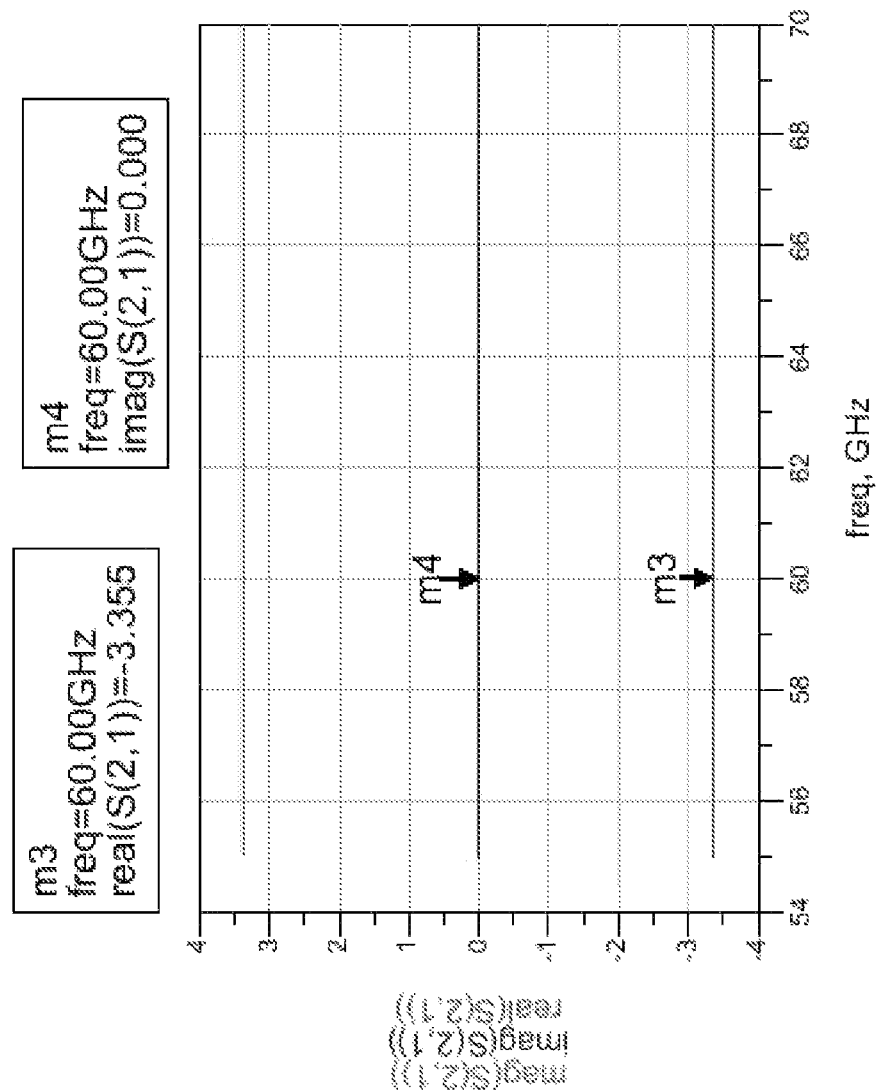
Fig. 9B

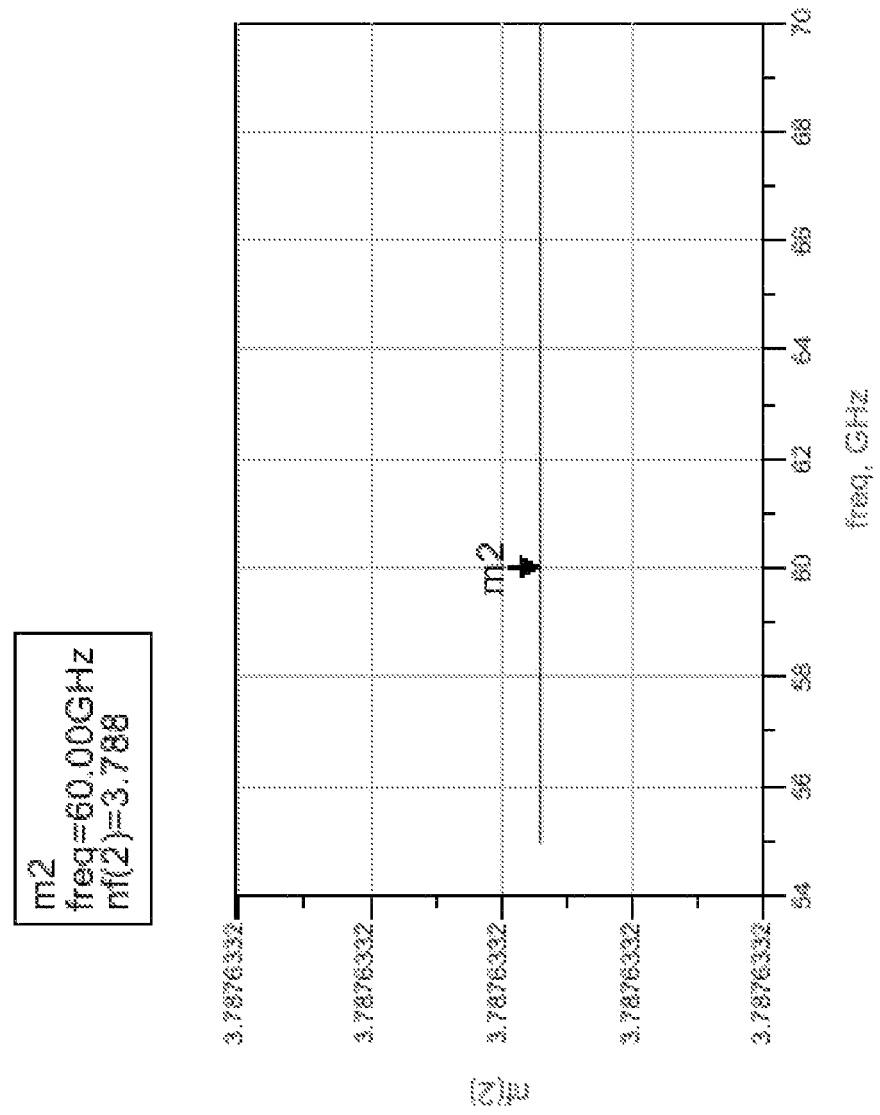
Fig. 9C

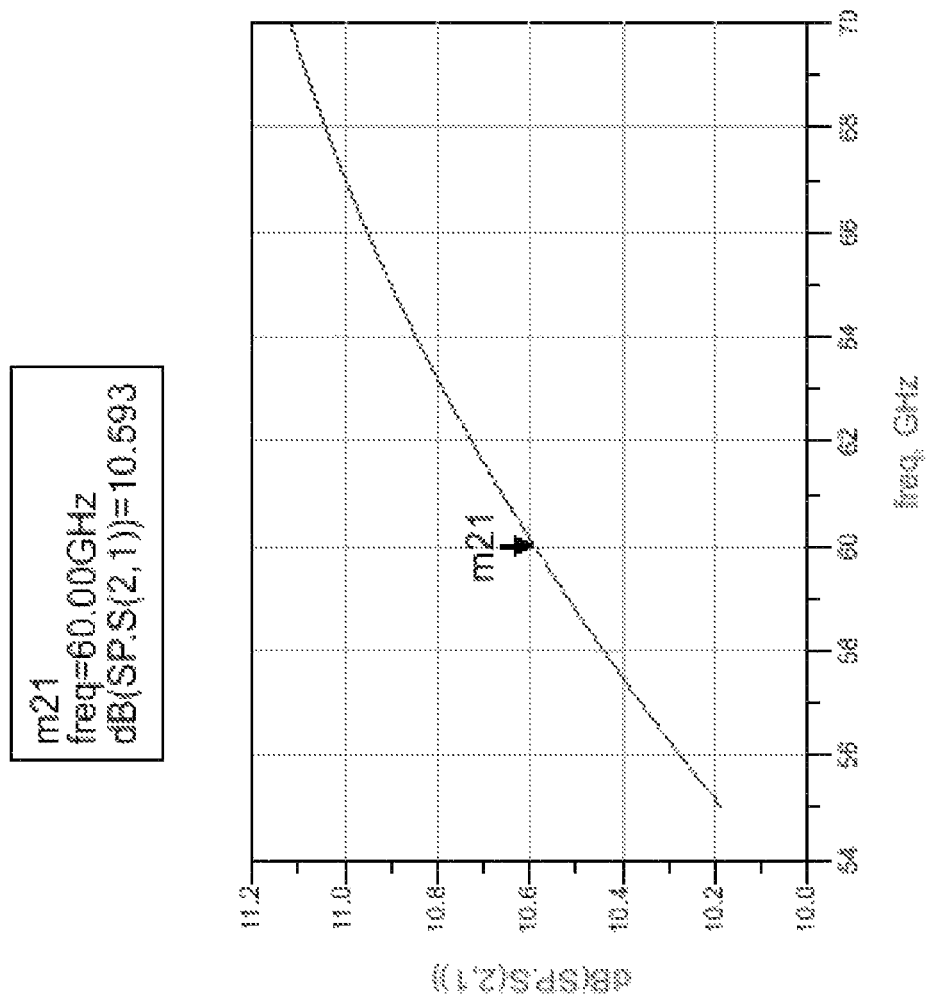
Fig. 10A

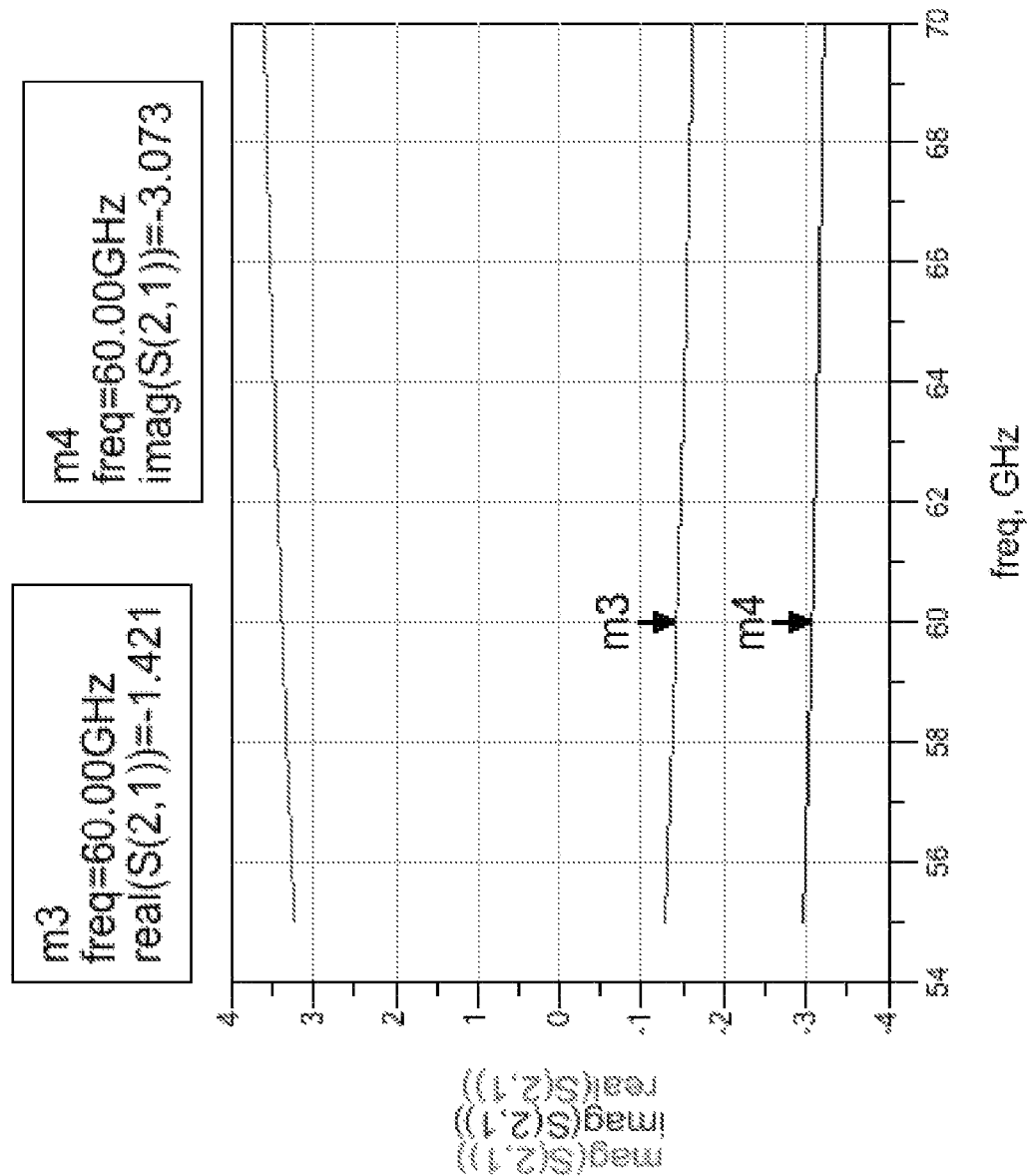
Fig. 10B

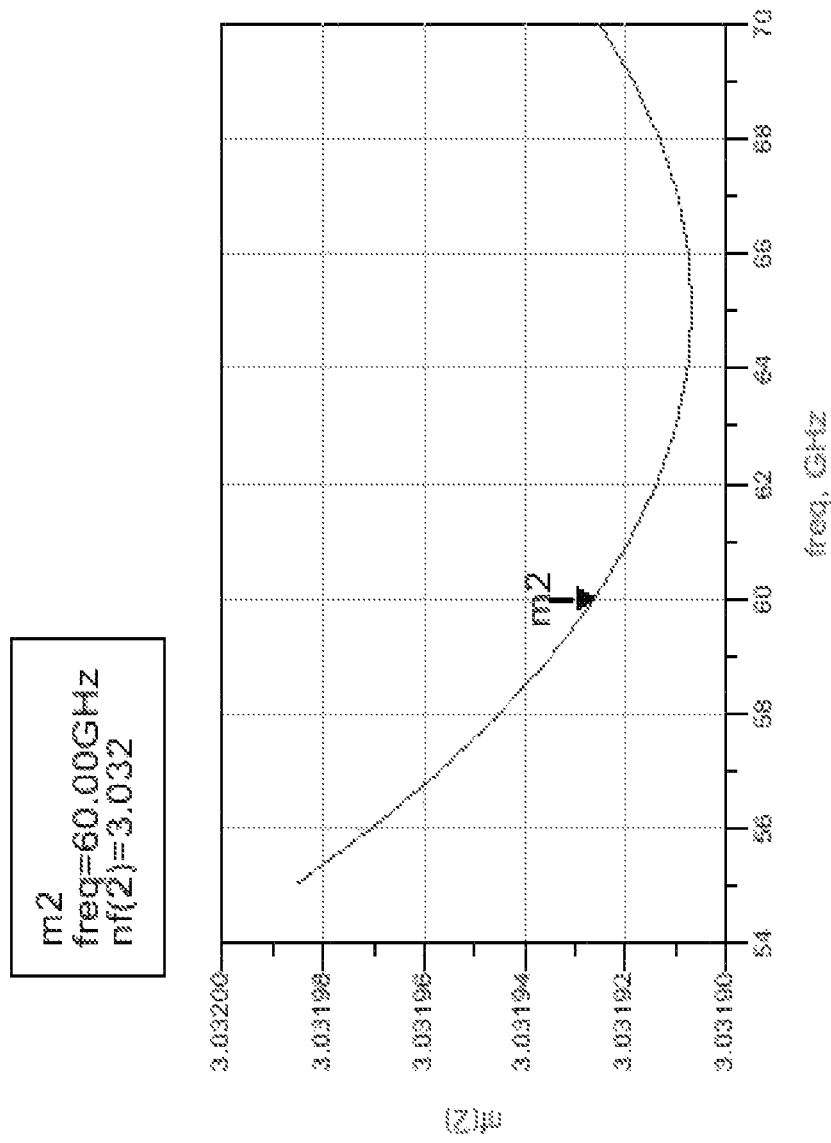
Fig. 10C

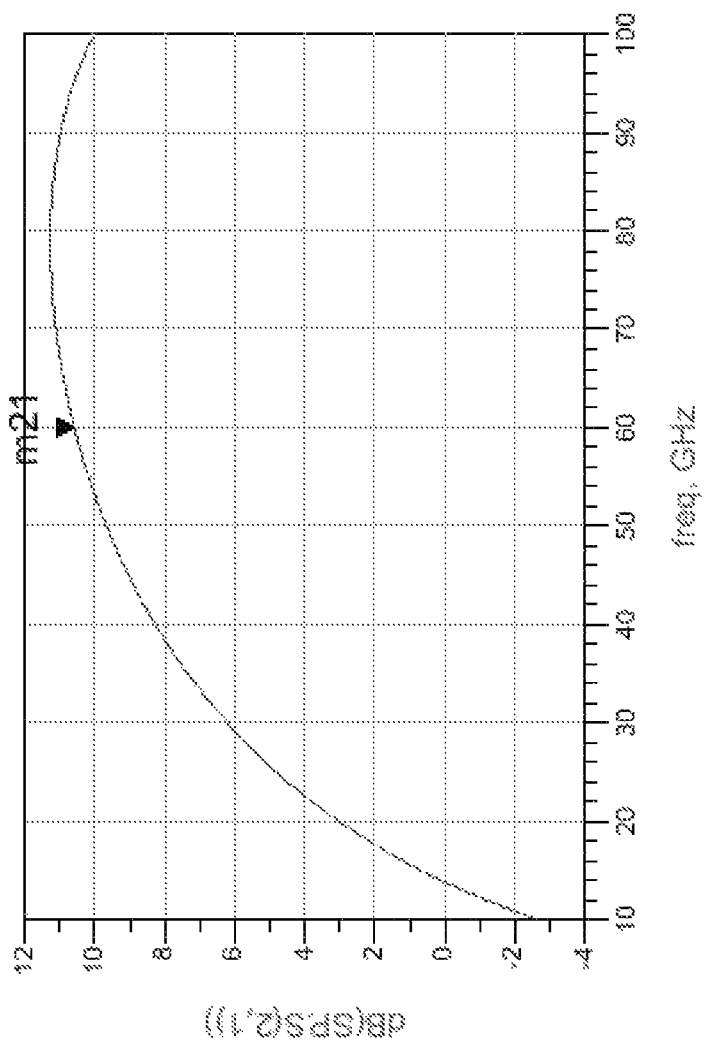
Fig. 11

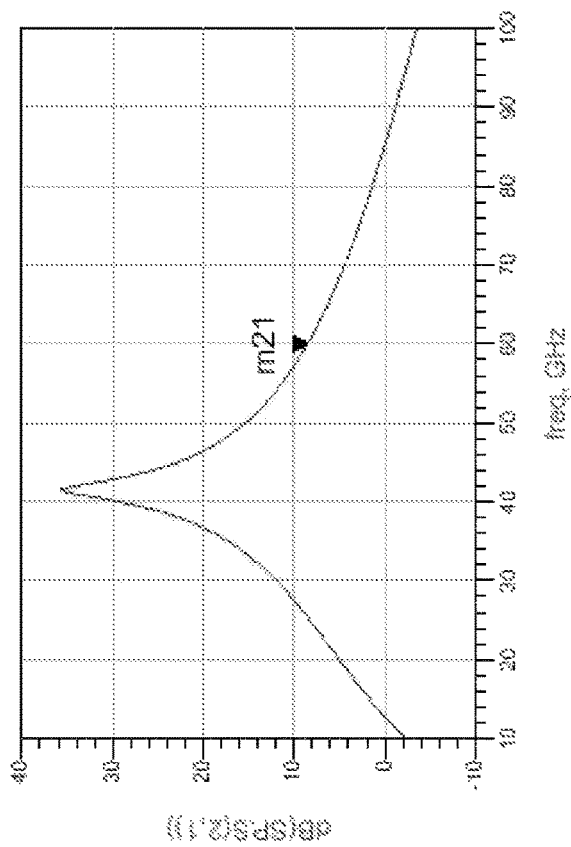
Fig. 13
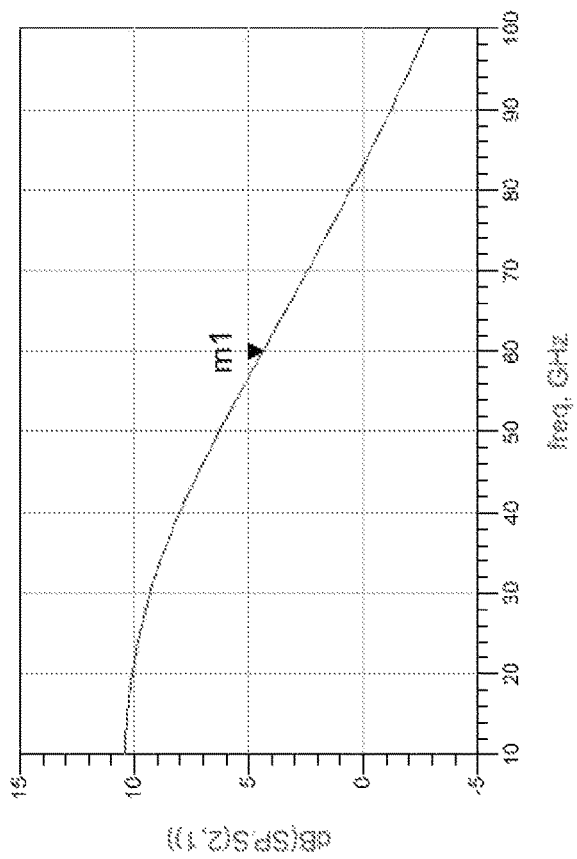
Fig. 12

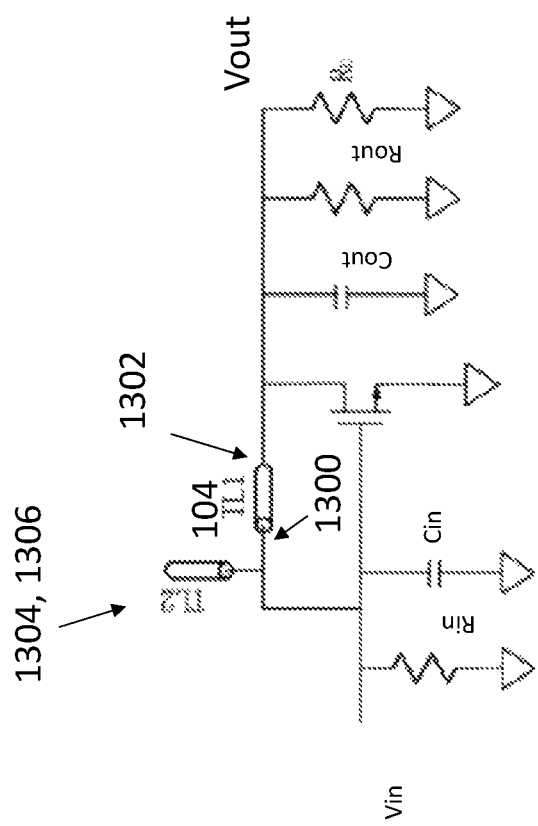
Fig. 14

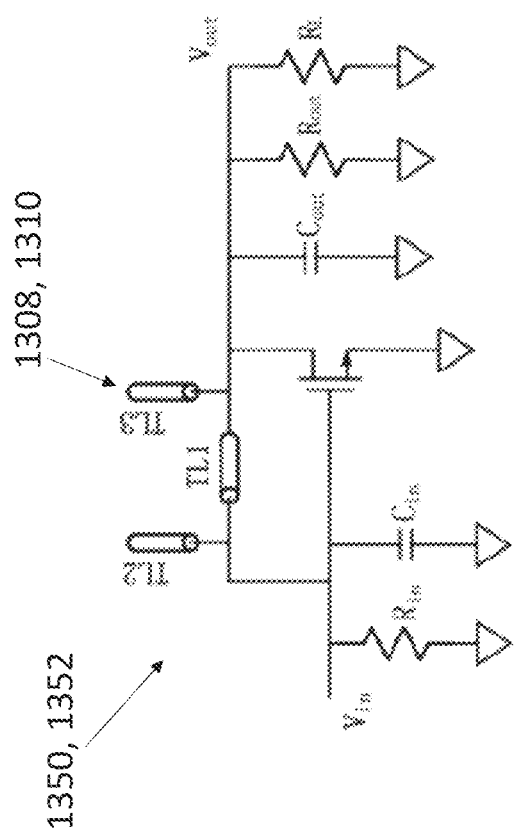
Fig. 15

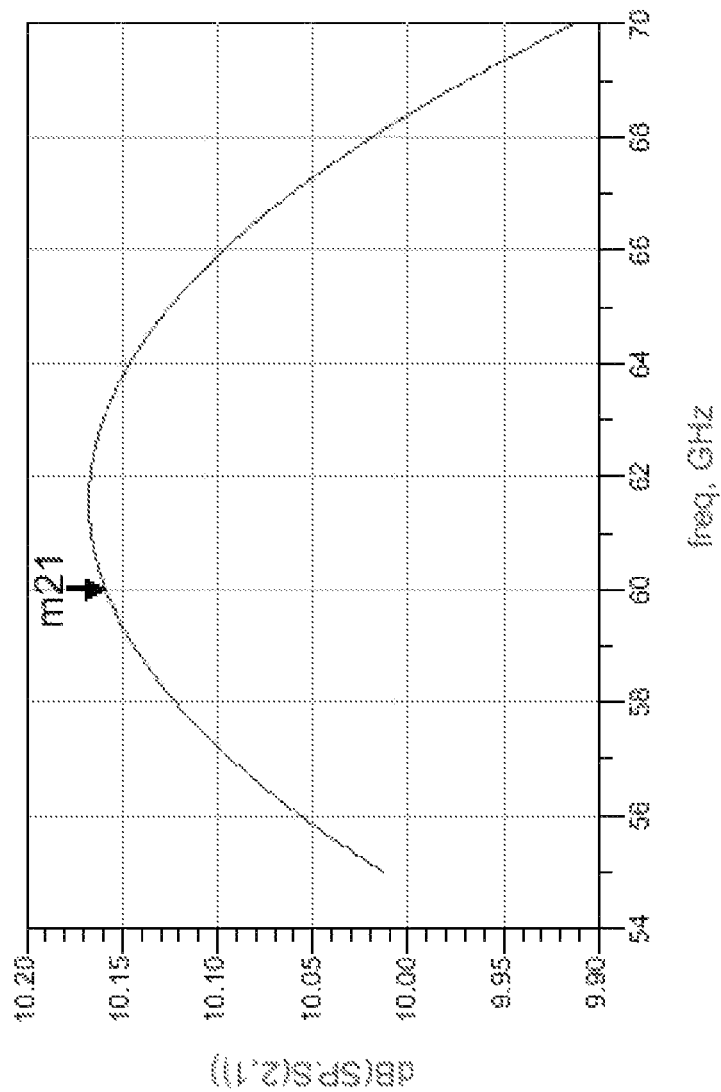
Fig. 16A

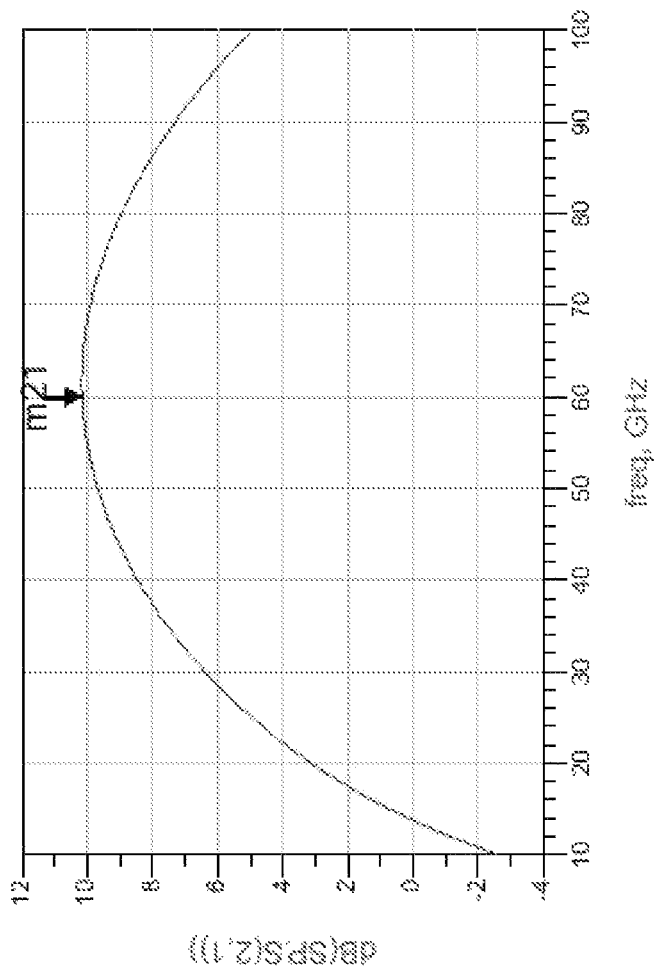
Fig. 16B

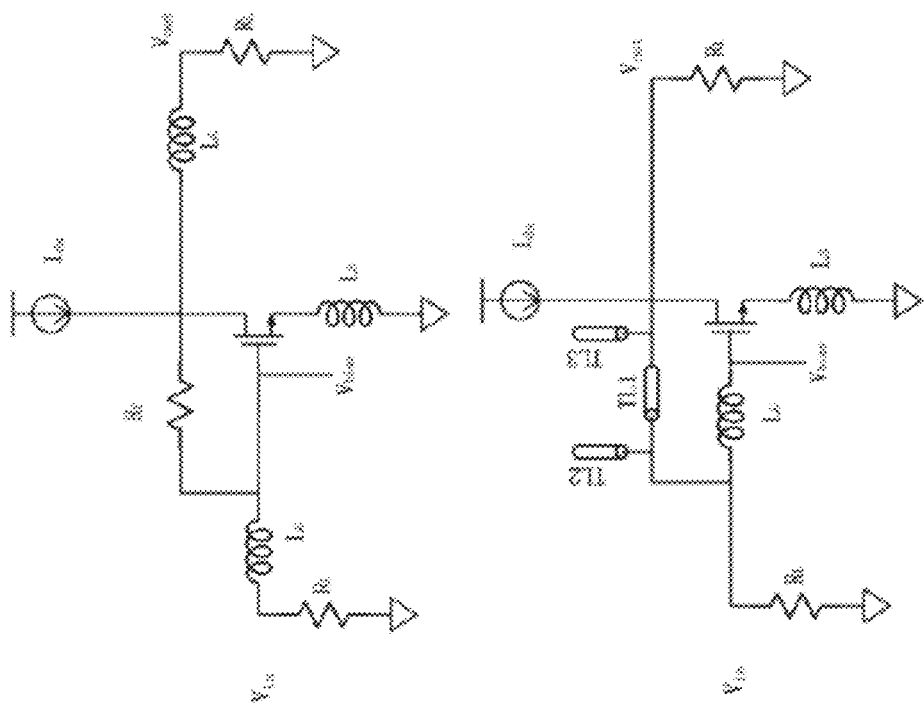
Fig. 17A  Fig. 17B

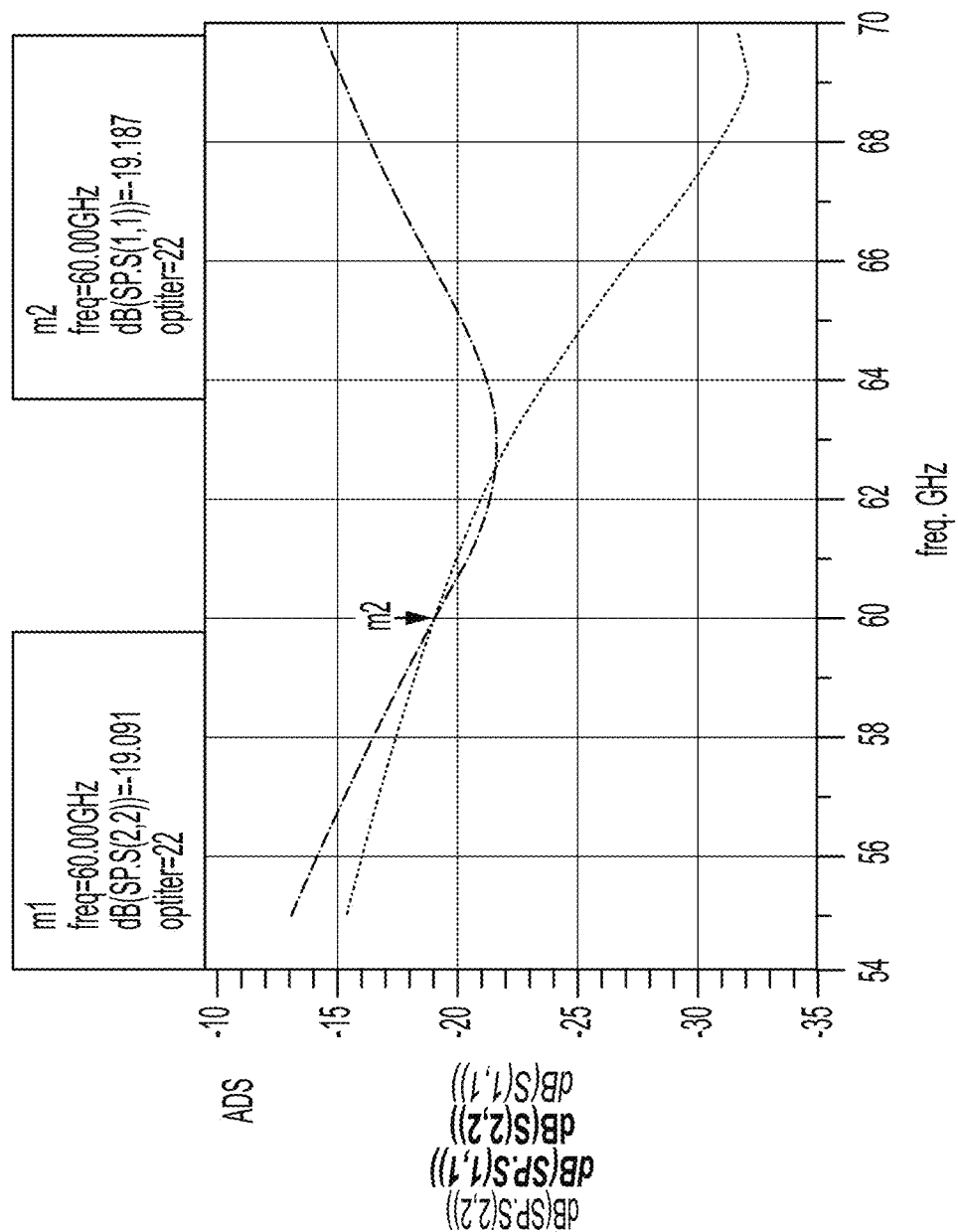
FIG. 18A

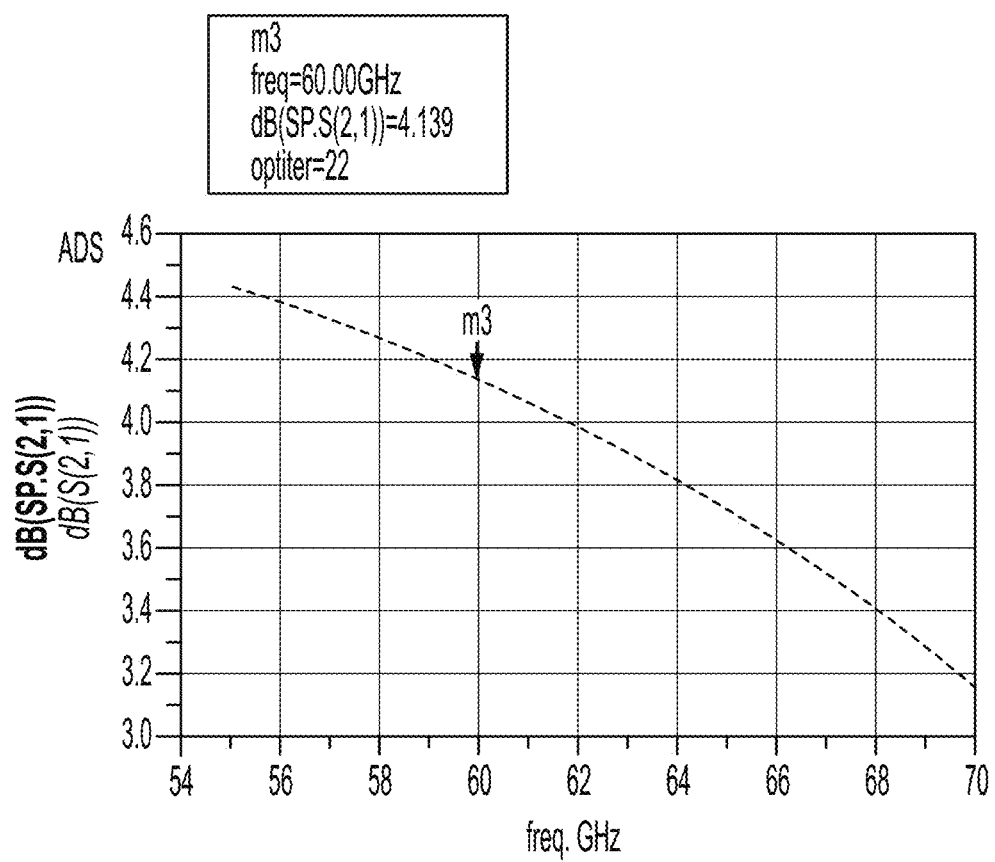
FIG. 18B

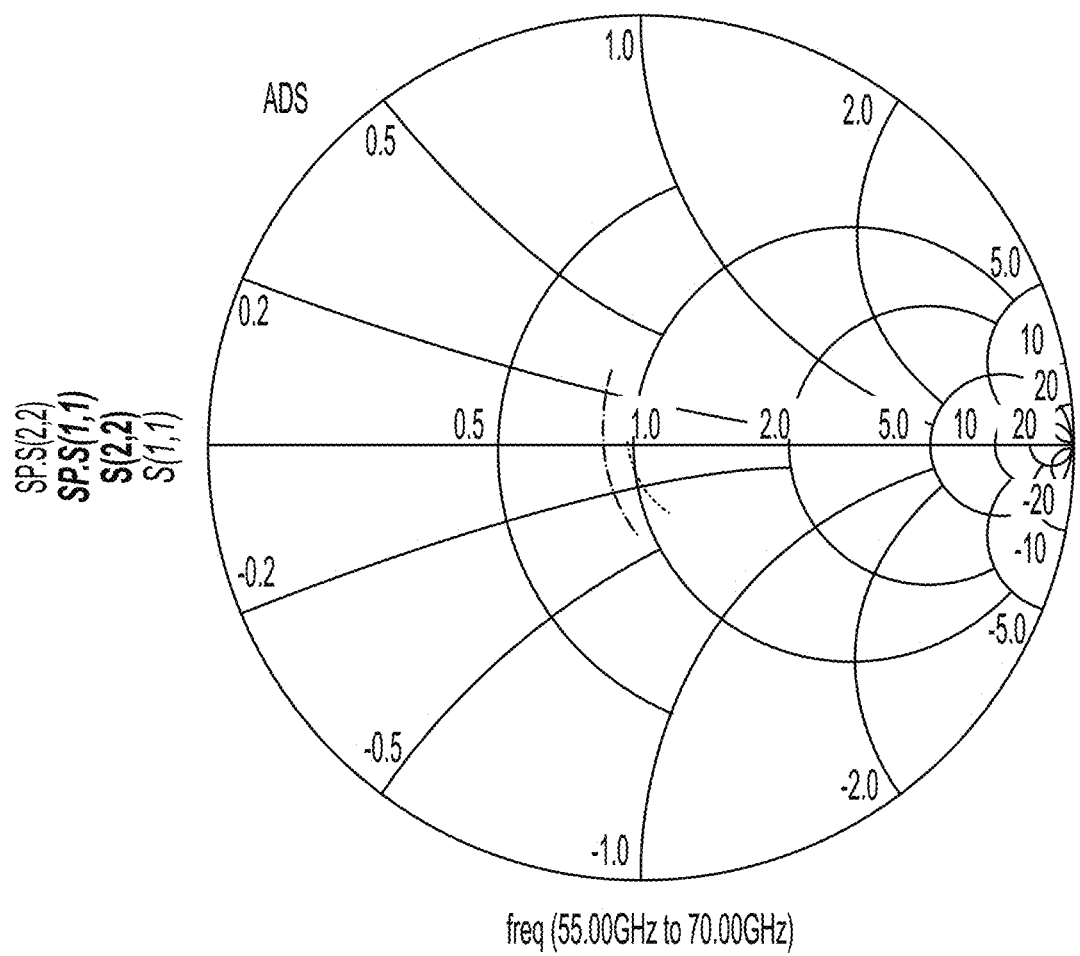
FIG. 18C

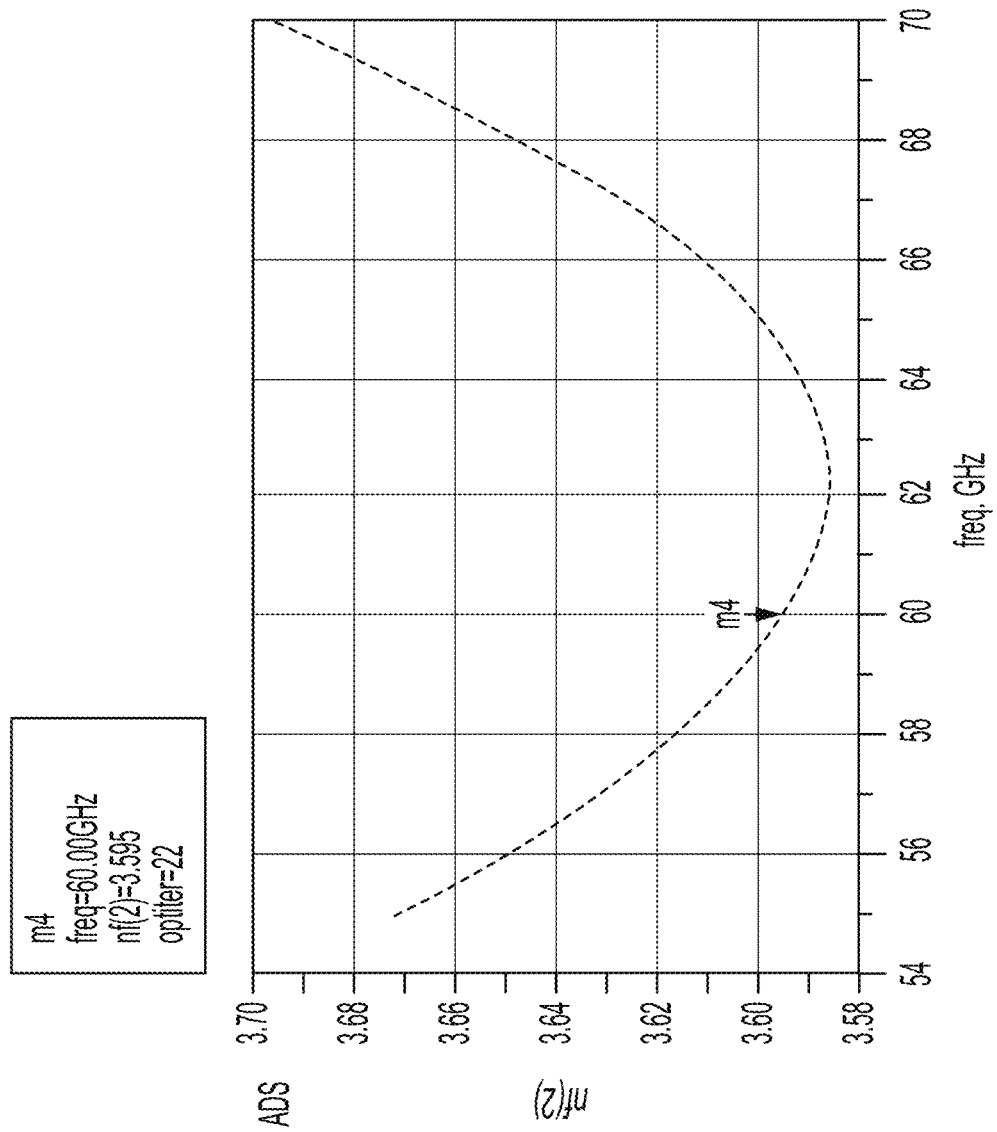
FIG. 18D

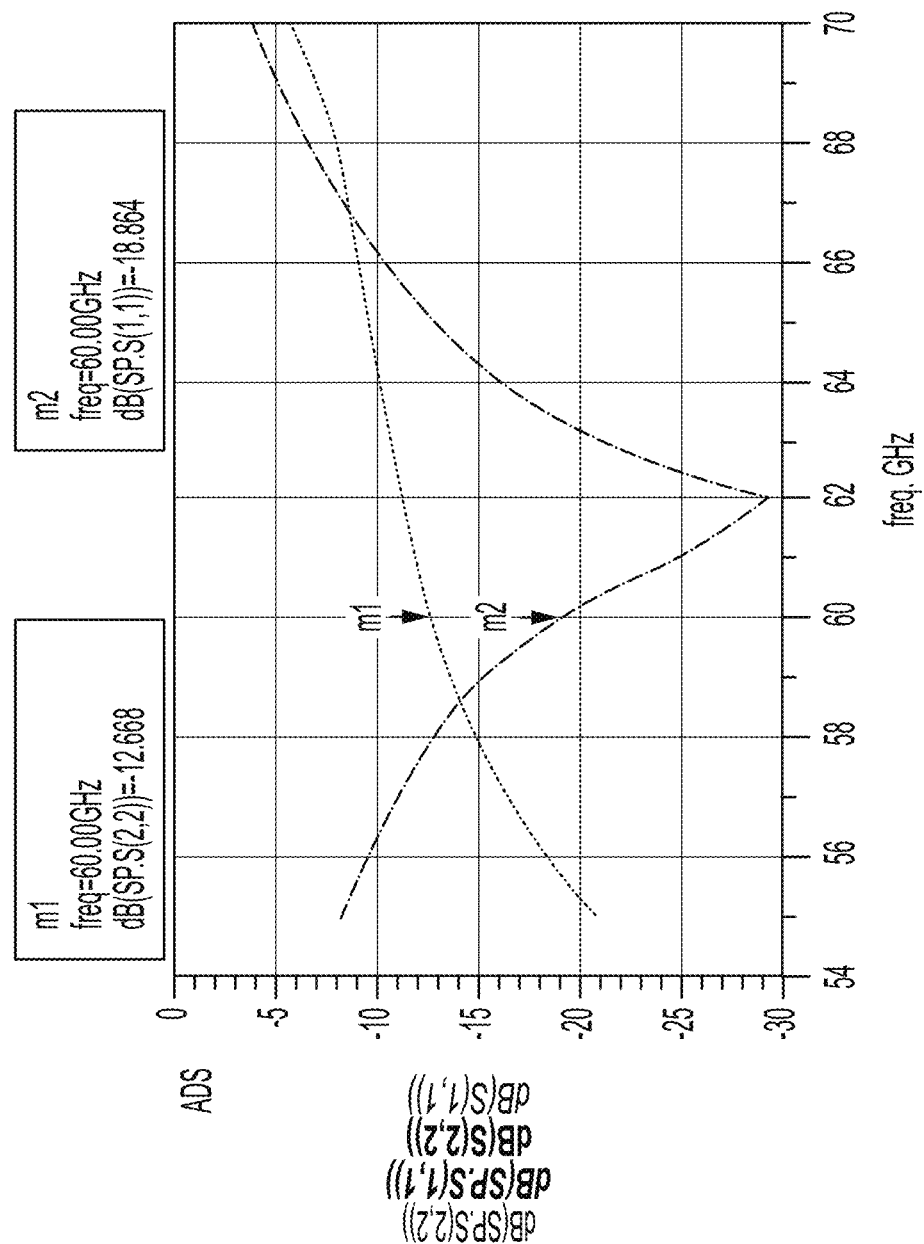
FIG. 18E

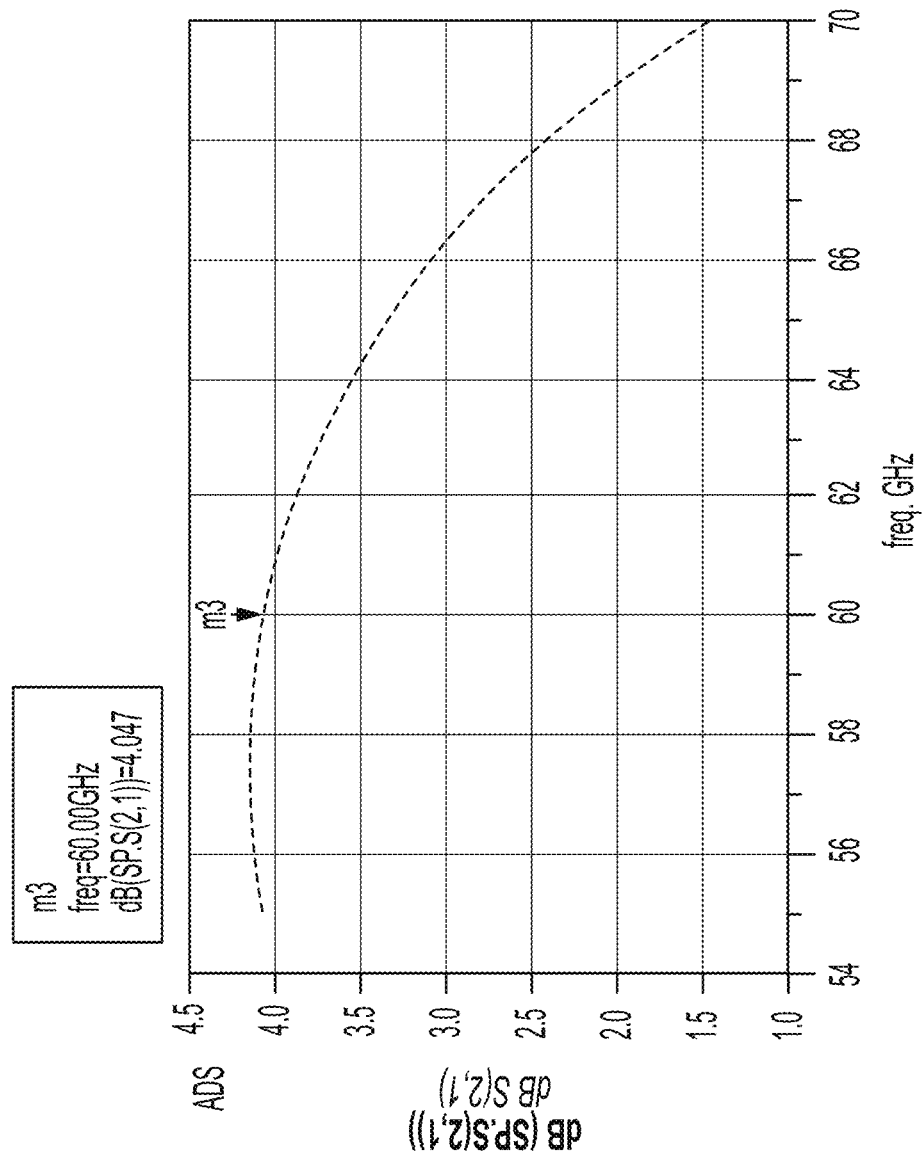
FIG. 18F

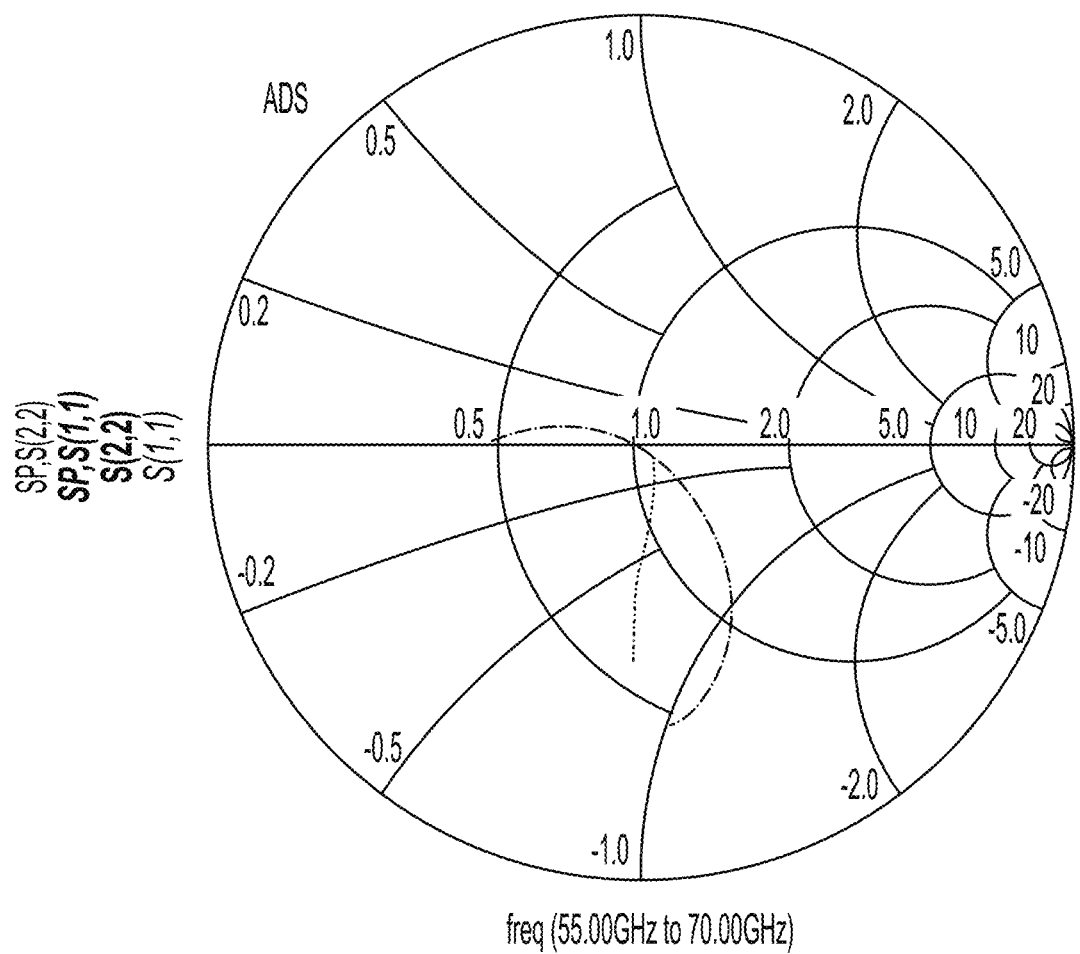
FIG. 18G

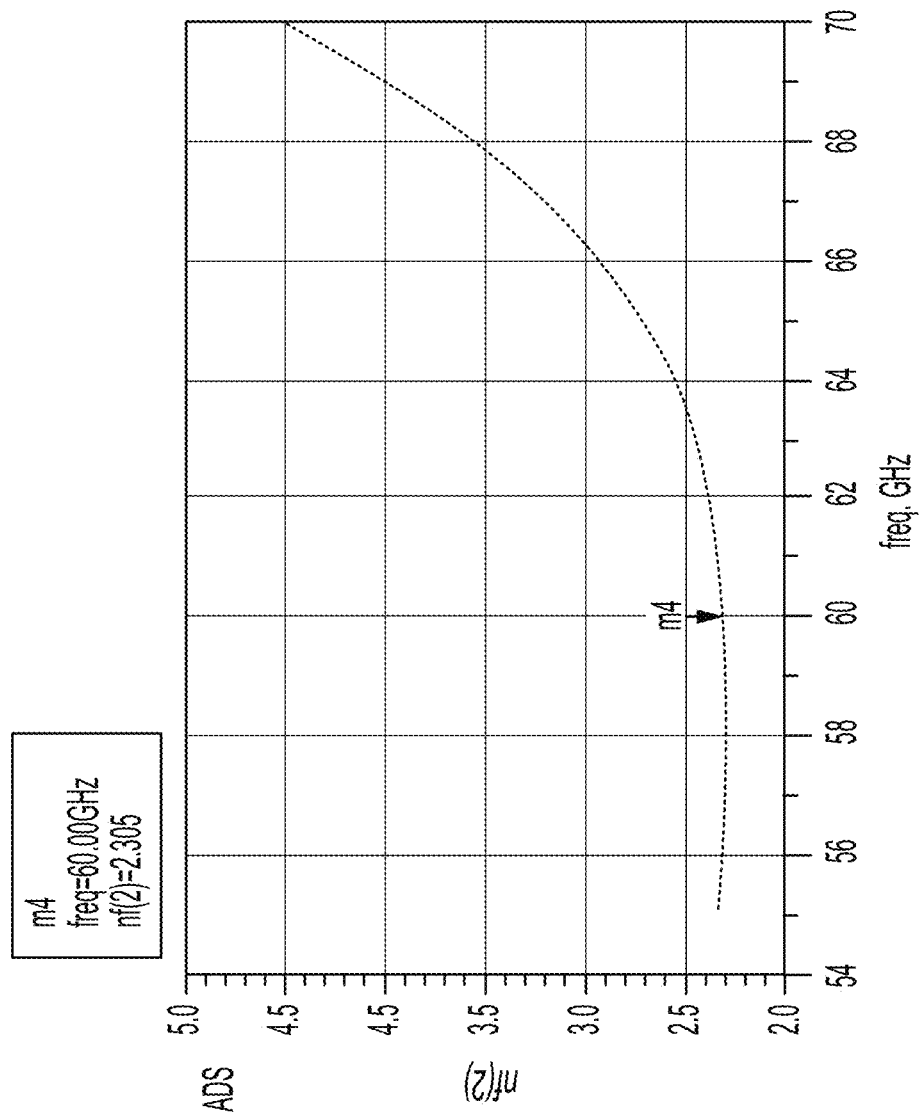
FIG. 18H

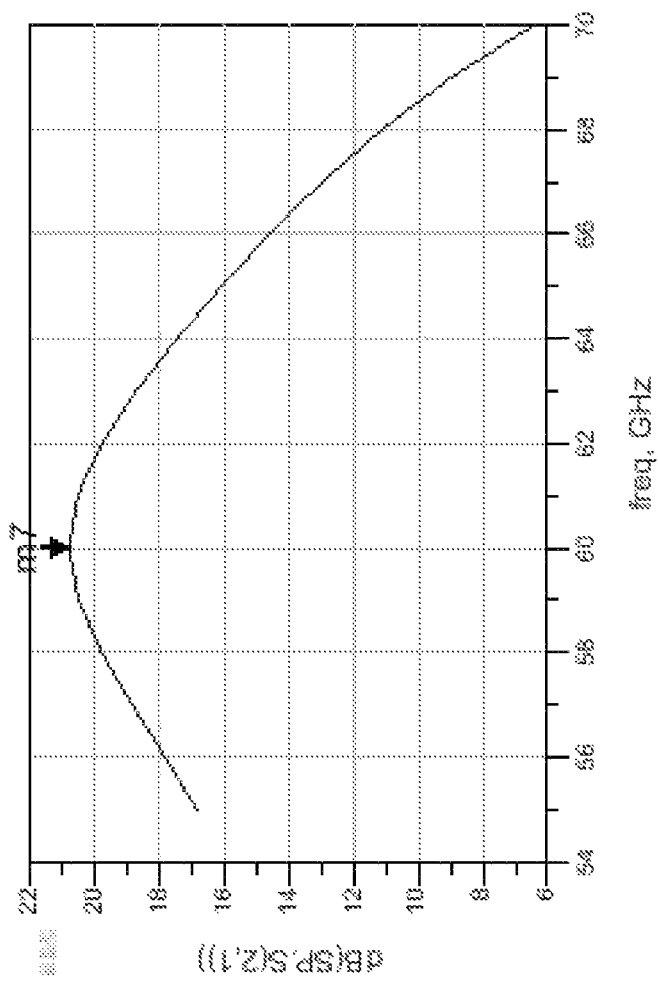
Fig. 19A

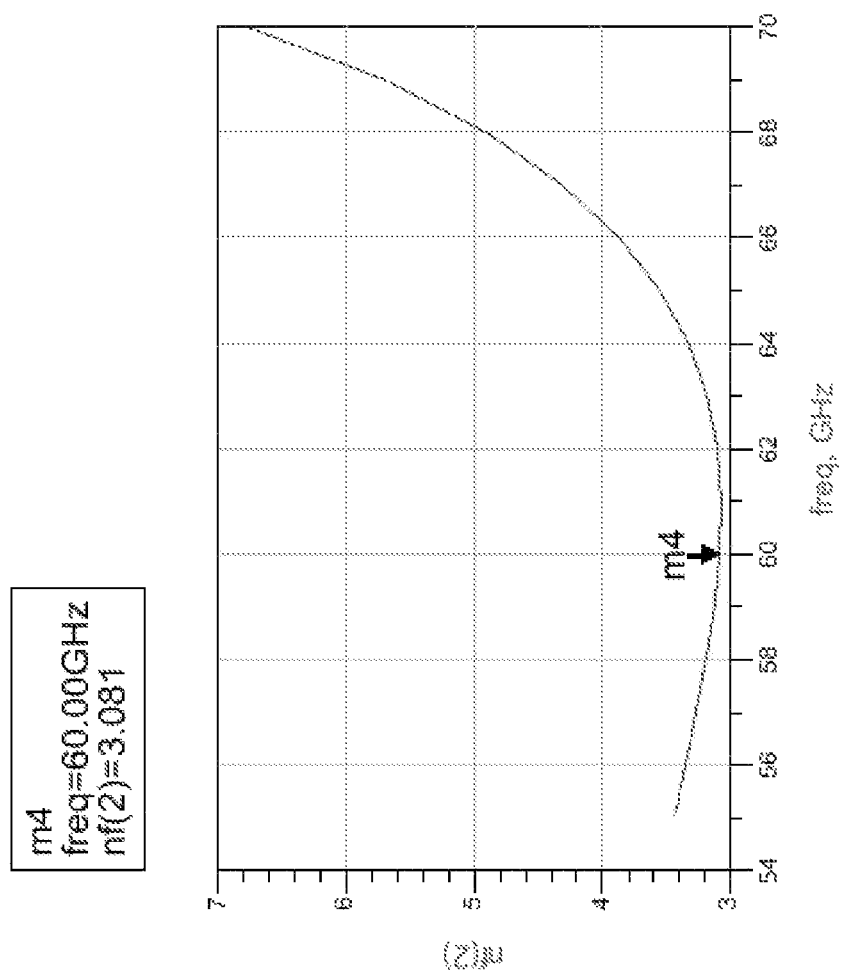
Fig. 19B

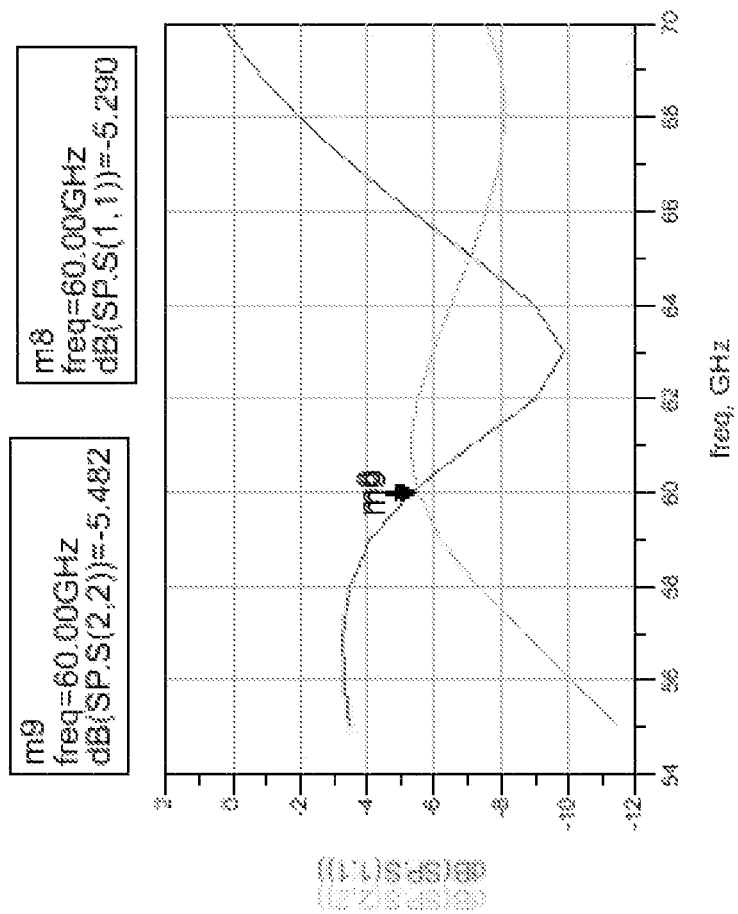
Fig. 19C

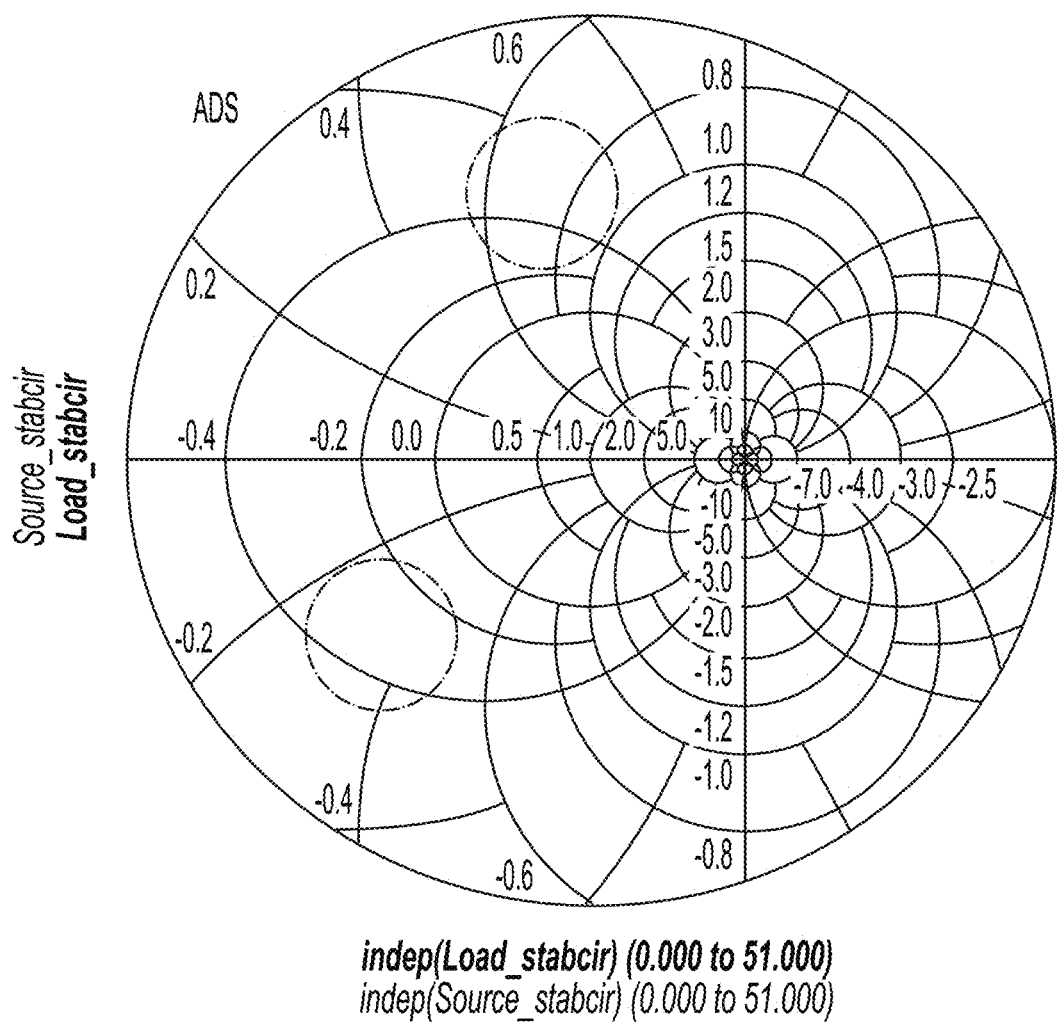
FIG. 19D

| Ref | Tech [nm] | Freq [GHz] | Max Gain [dB] | P-1dB [dBm] | min NF [dB] | Vdd [V] | Power [mW] | Technology |
|---|---|---|---|---|---|---|---|---|
| [10] | 65 | 56 | 22.4 | -3.4 | 4.5 | 1.5 | 10.8 | 3 cascode |
| [110] | 65 | 58 | 18.7 | -6.5 | 5.2 | 1.0 | 8.5 | 2 cascode |
| [111] | 65 | 60 | 23 | -3.5 | 4 | 1.25 | 8 | 3 CS TF-CF* |
| [102] | 65 | 59 | 16.2 | -4.85 | 3.8 | 1 | 8.3 | 3 CS-CPW |
| [113] | 65 | 60 | 20.6 | -8.4 | 4.9 | 1.2 | 33.6 | TL based |
| [113] | 65 | 60 | 18 | -5 | 4.0 | 1.2 | 28.8 | Inductor based |
| [14] | 65 | 60 | 15 | -6 | 5.9 | 1.5 | 31 | 4 cascode |
| [115] | 65 | 60 | 22.3 (19.3) | 2.7 | 6.1 | 1.2 | 35 | differential |
| [10] | 65 | 61.2 | 18.9 | -22.3 | 6.06 | 1.8 | 45 | 3 cascode |
| This work | 65 | 60 | 20.8 | +4 | 3.08 | 1.2 | 14 | 3 T-Line FB |

Table * Comparison of the proposed design with other 60 GHz results reported using 65 nm processes.

Fig. 20

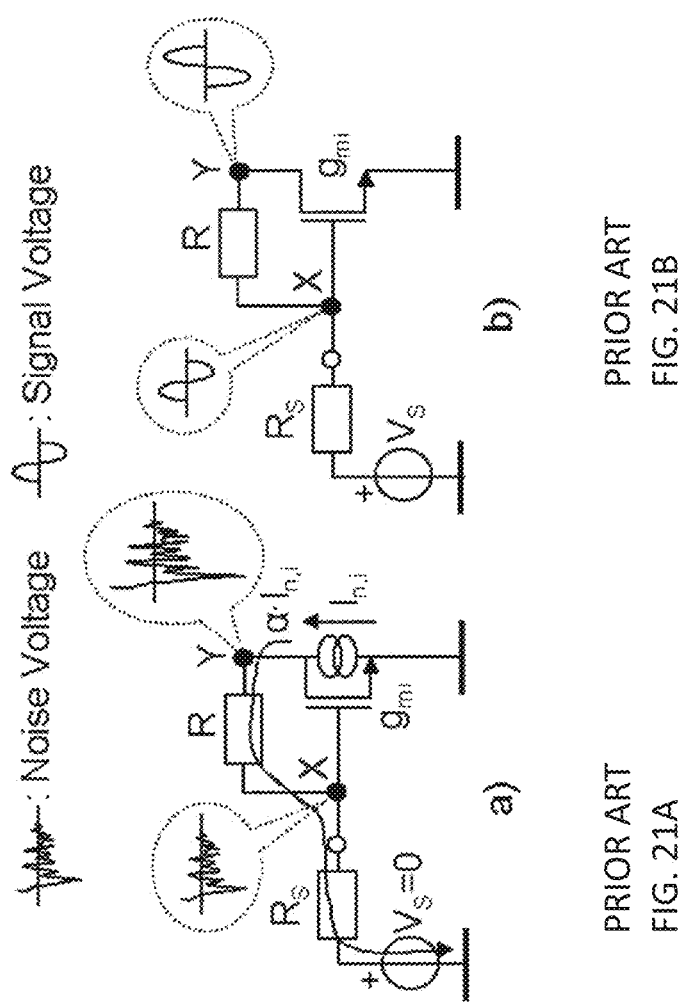
PRIOR ART
FIG. 21A
PRIOR ART
FIG. 21B

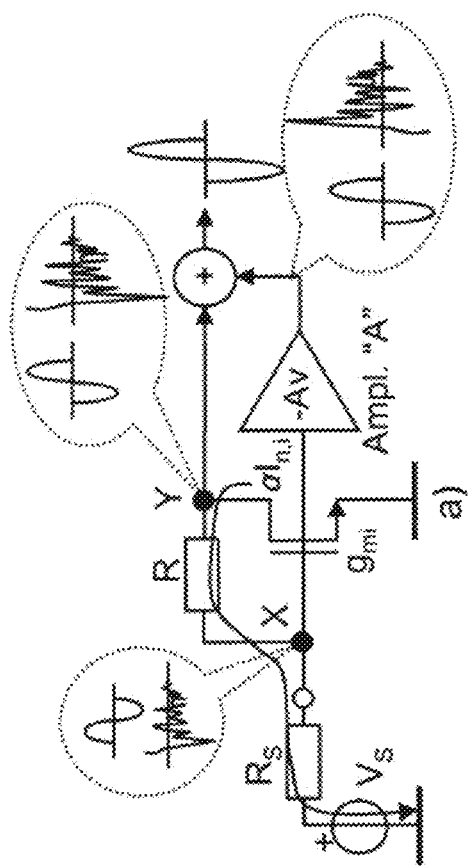
Fig 22A. Noise canceling LNA topology
PRIOR ART

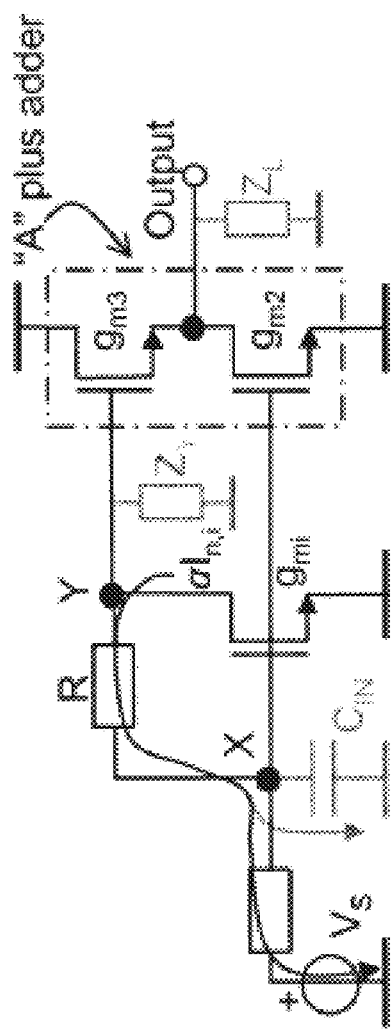
Fig. 22B
PRIOR ART

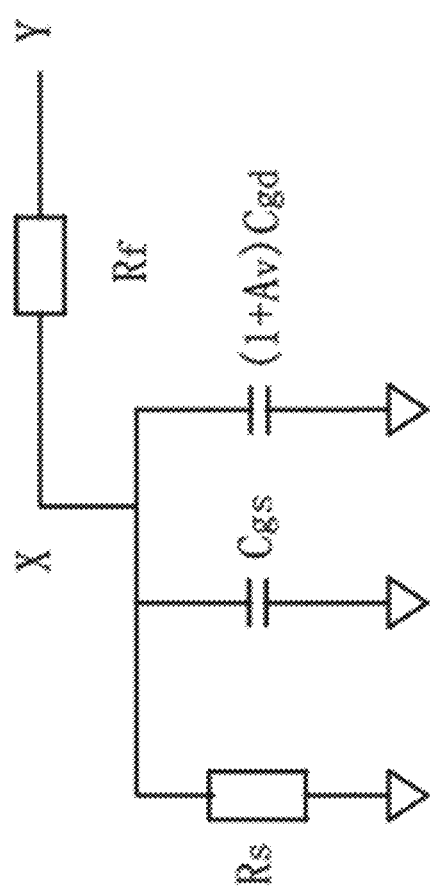
Fig. 23

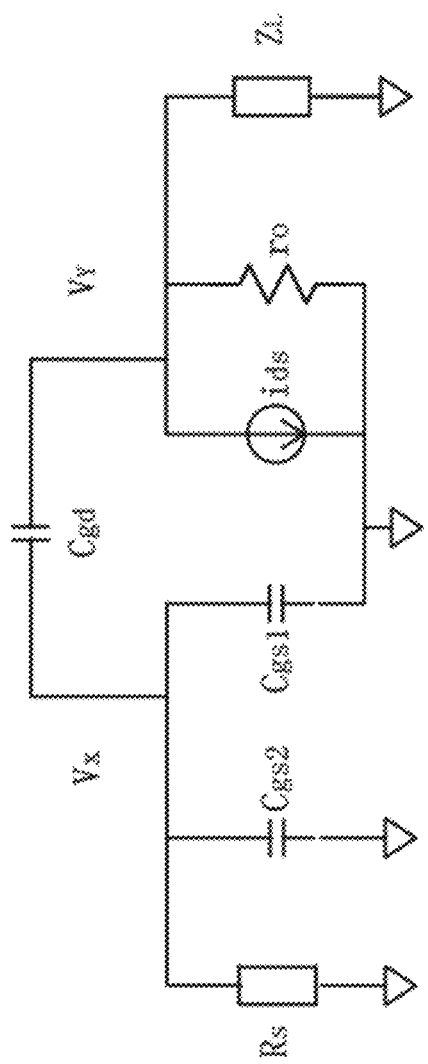
Fig. 24

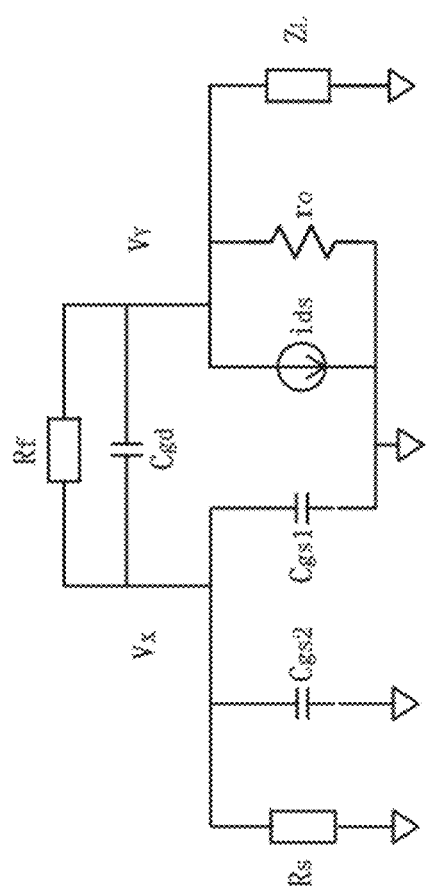
Fig. 25

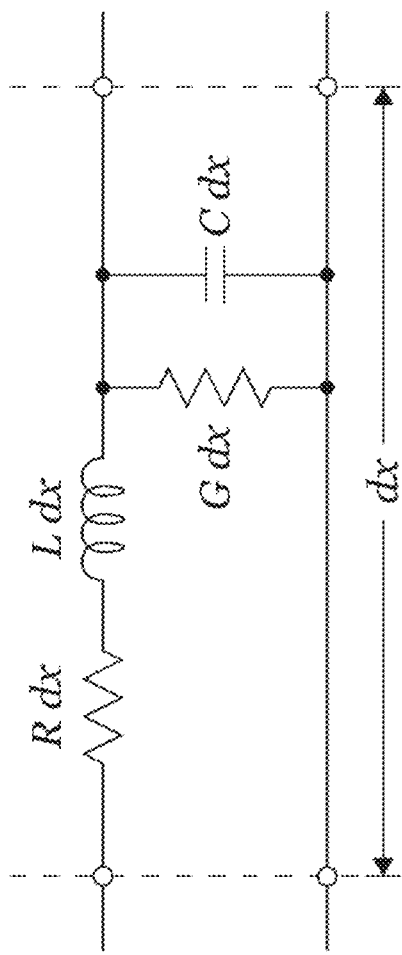
Fig. 26

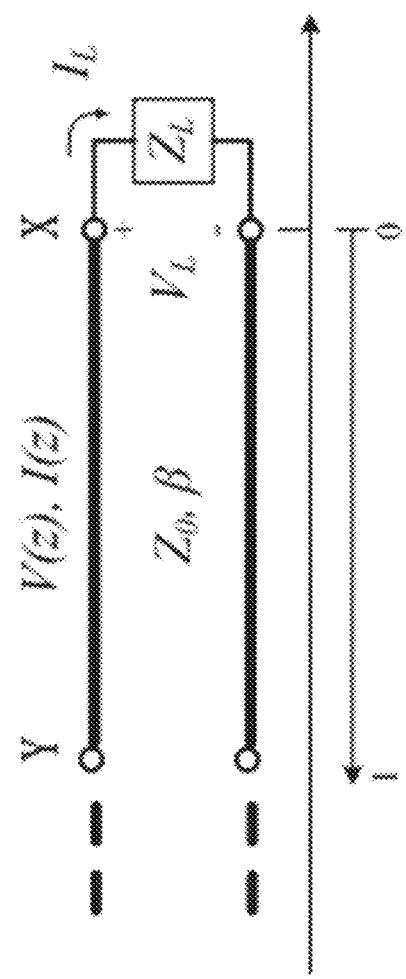
Fig. 27

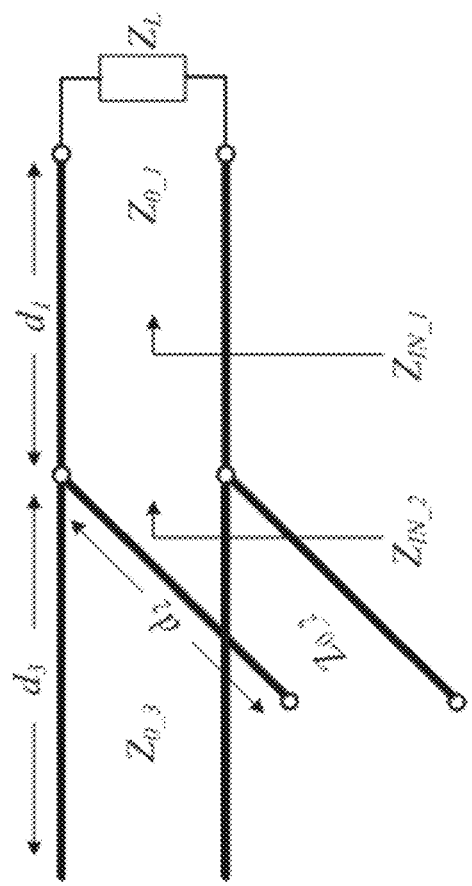
Fig. 28B
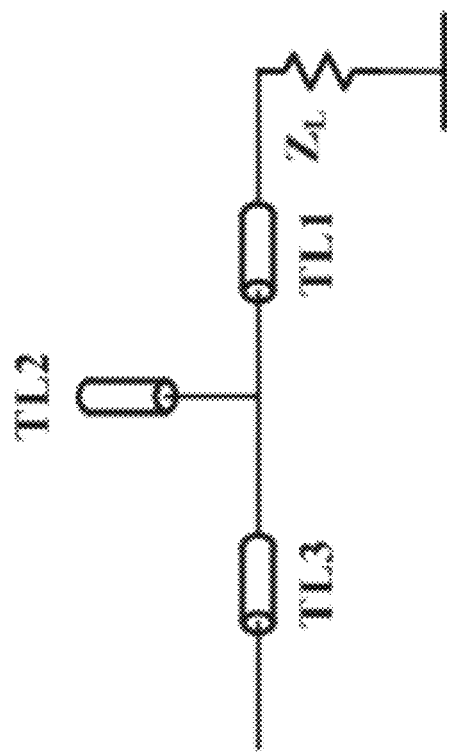
Fig. 28A

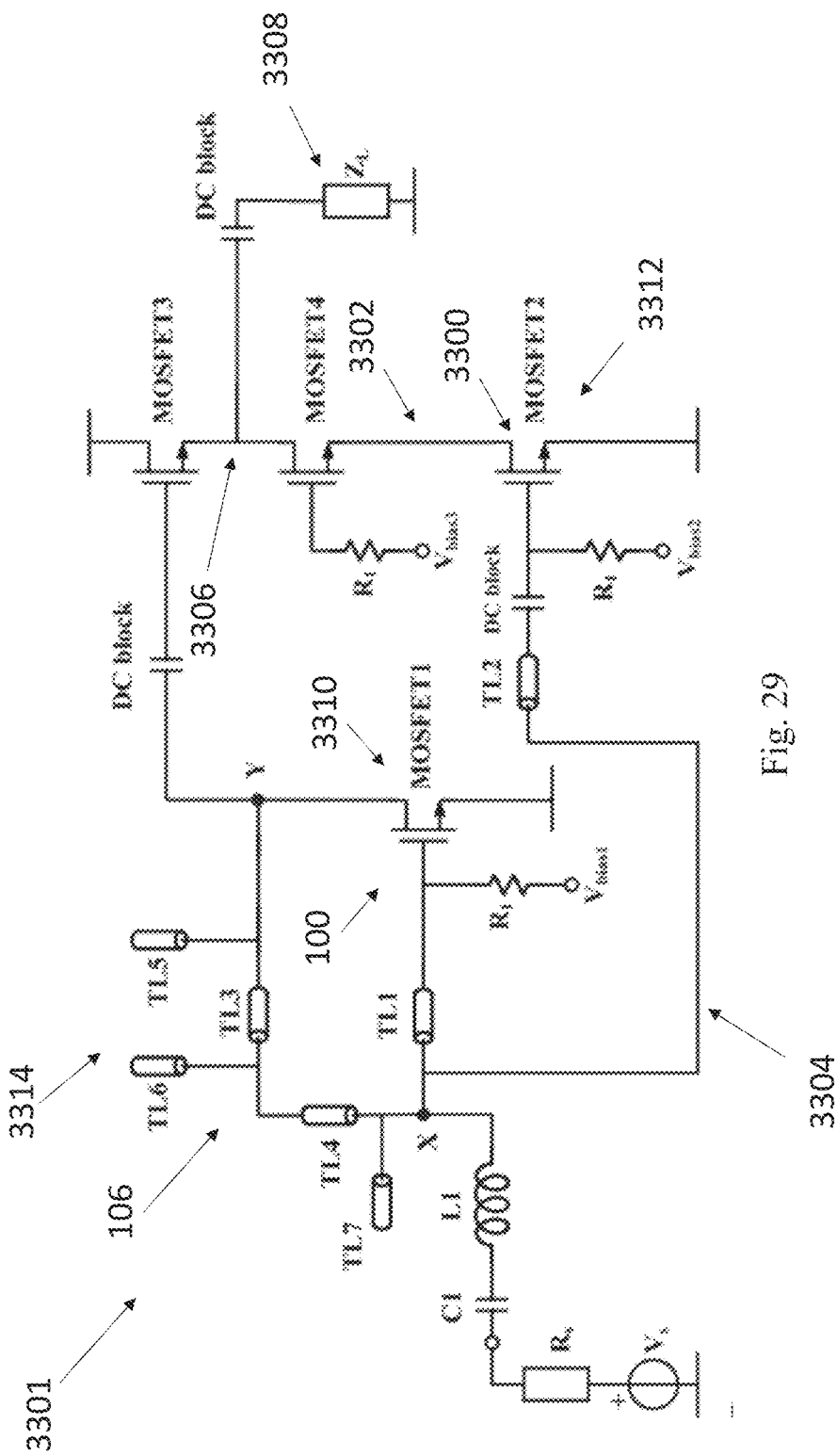
Fig. 29

| | | |
|---|---|---|
| 0 | total | 1,040 pV |
| 1 | MOSFET1 | 665.8 pV |
| 2 | MOSFET1.ids | 659.3 pV |
| 3 | MOSFET1.flicker | 66.23 pV |
| 4 | MOSFET1.Rg | 35.37 pV |
| 5 | MOSFET1.Rbpb | 24.49 pV |
| 6 | MOSFET1.Rbdb | 16.66 pV |
| 7 | MOSFET1.Rbpd | 14.90 pV |
| 8 | MOSFET1.Rbsb | 7.119 pV |
| 9 | MOSFET1.Rbps | 7.024 pV |
| 10 | MOSFET1.igs | 3.743 pV |
| 11 | MOSFET1.igd | 2.445 pV |
| 12 | MOSFET1.igb | 1.430 pV |
| 13 | MOSFET3 | 1.349 pV |
| 14 | MOSFET3.ids | 551.8 pV |
| 15 | MOSFET3.flicker | 547.4 pV |
| 16 | MOSFET3.Rbpb | 55.48 pV |
| 17 | MOSFET3.Rg | 28.36 pV |
| 18 | MOSFET3.Rbsb | 18.28 pV |
| 19 | MOSFET3.Rbpd | 16.35 pV |
| 20 | MOSFET3.Rbdb | 12.76 pV |
| 21 | MOSFET3.Rbps | 8.194 pV |
| 22 | MOSFET3.igs | 8.164 pV |
| 23 | MOSFET3.igd | 1.589 pV |
| 24 | MOSFET3.igb | 1.046 pV |
| 25 | R11 | 455.9 pV |
| 26 | MOSFET4.ids | 292.4 pV |
| 27 | MOSFET4.flicker | 72.74 pV |
| 28 | MOSFET4.Rbpb | 7.479 pV |
| 29 | MOSFET4.Rbdb | 6.200 pV |
| 30 | MOSFET4.Rg | 5.082 pV |
| 31 | MOSFET4.Rbpd | 5.027 pV |
| 32 | MOSFET4.Rbsb | 2.432 pV |
| 33 | MOSFET4.Rbps | 2.406 pV |
| 34 | MOSFET4.igd | 1.017 pV |

Fig. 30

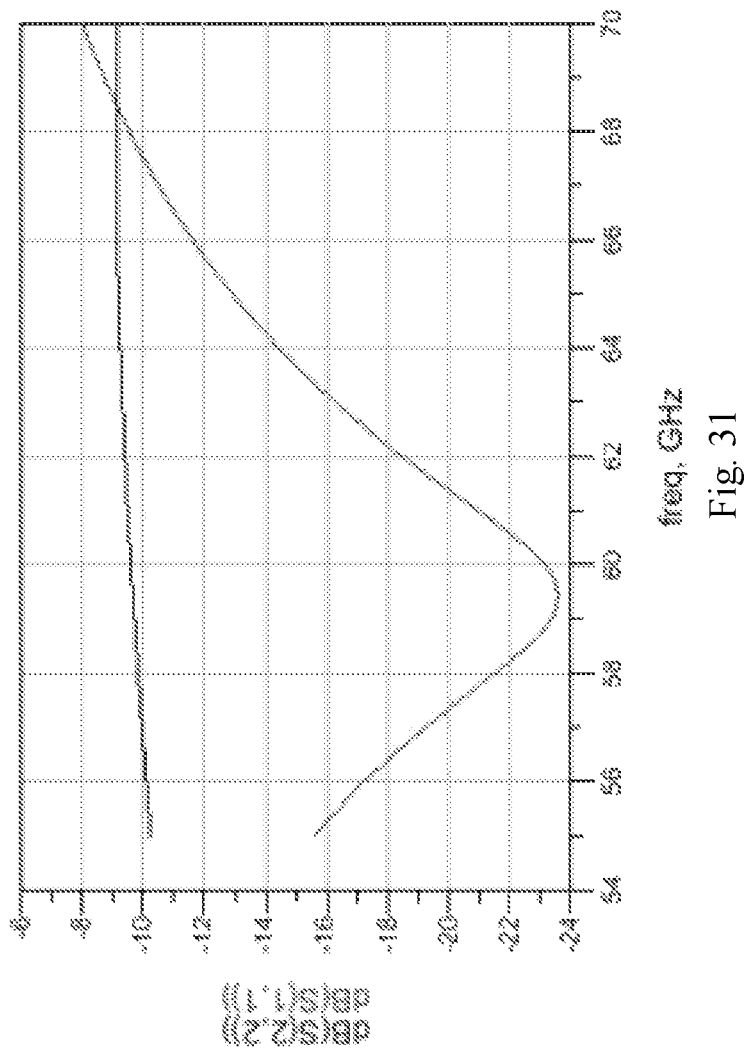
Fig. 31

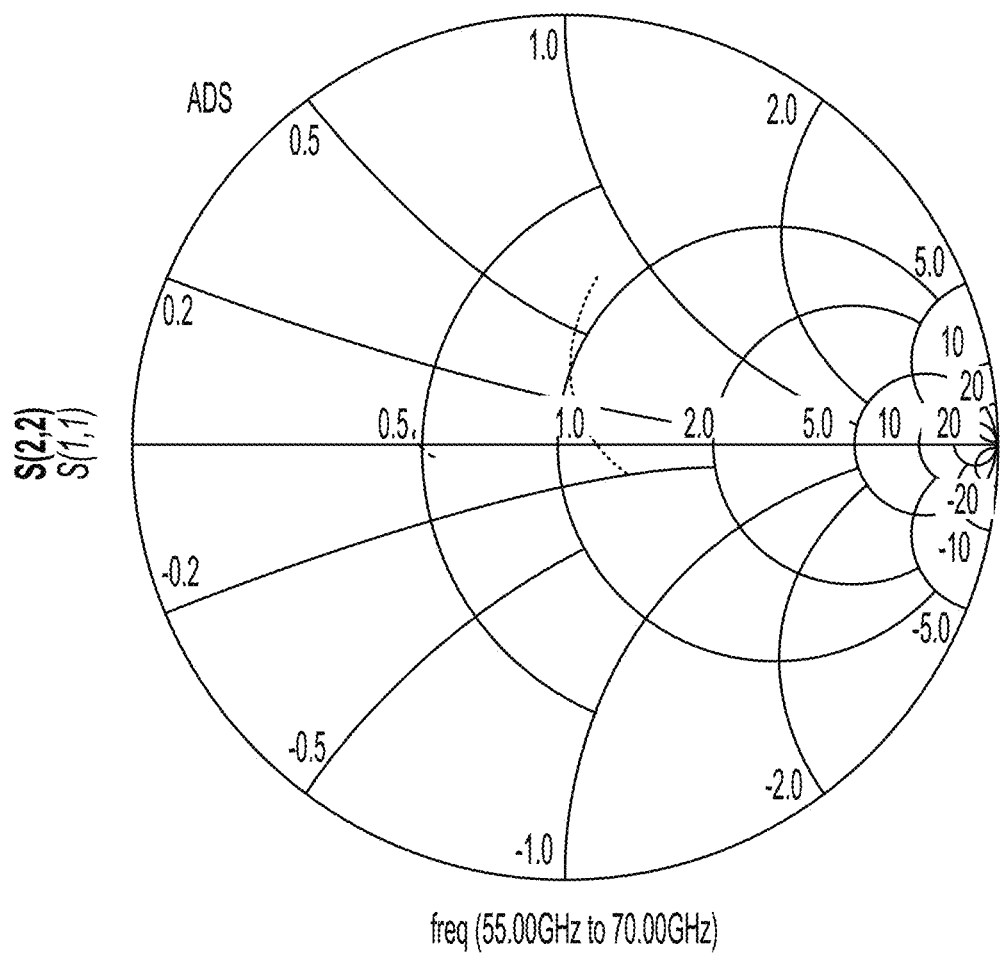
FIG. 32

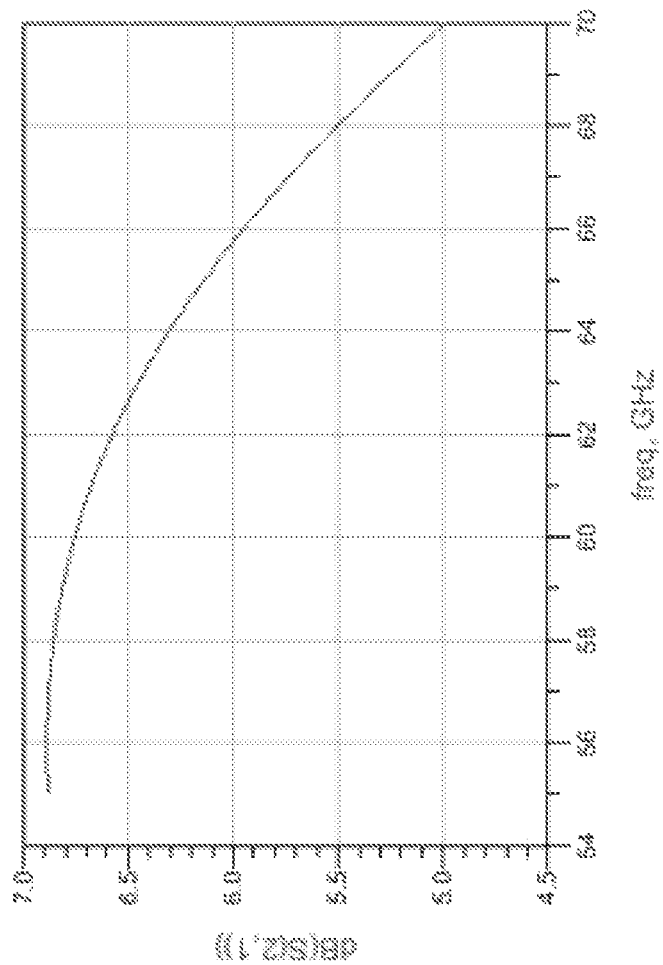
Fig. 33

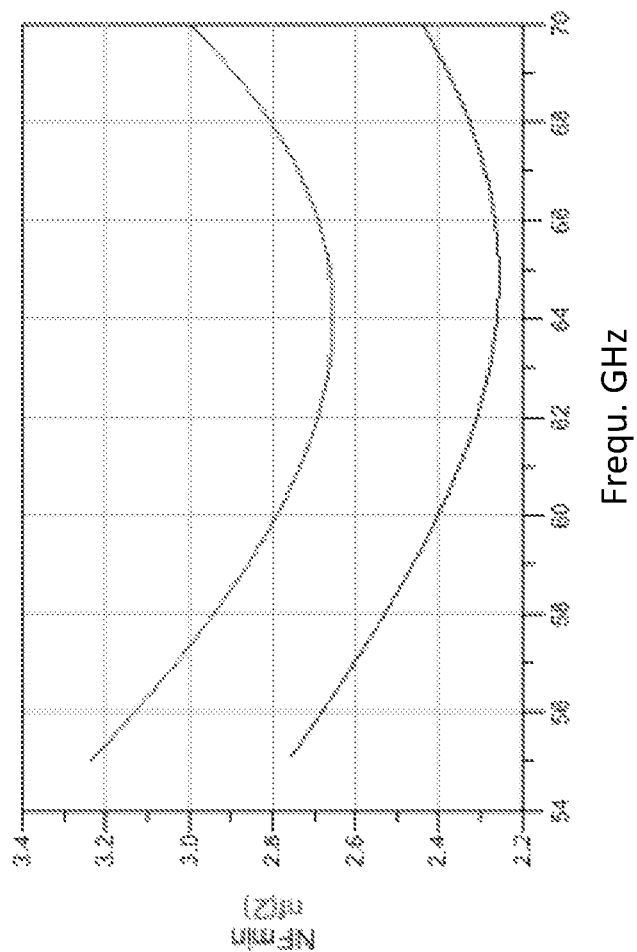
Fig. 34

| index | pnc2 NC name | pnc2 NC src |
|---|---|---|
| freq=56.00 GHz | | |
| 0 | total | 1.192 nV |
| 1 | MOSFET2 | 893.3 pV |
| 2 | MOSFET2.ids | 881.7 pV |
| 3 | MOSFET2.Rg | 95.27 pV |
| 4 | MOSFET2.flicker | 66.37 pV |
| 5 | MOSFET2.Rbpb | 33.28 pV |
| 6 | MOSFET2.Rbsb | 28.24 pV |
| 7 | MOSFET2.Rbpd | 24.18 pV |
| 8 | MOSFET2.Rbps | 9.614 pV |
| 9 | MOSFET2.Rbdb | 8.619 pV |
| 10 | MOSFET2.igs | 3.731 pV |
| 11 | MOSFET2.igd | 2.222 pV |
| 12 | MOSFET2.igb | 1.046 fV |
| 13 | MOSFET4 | 890.6 pV |
| 14 | MOSFET4.ids | 897.8 pV |
| 15 | MOSFET4.flicker | 37.74 pV |
| 16 | MOSFET4.Rpcb | 29.68 pV |
| 17 | MOSFET4.Rbpd | 24.41 pV |
| 18 | MOSFET4.Rbpd | 20.54 pV |
| 19 | MOSFET4.Rbps | 16.67 pV |
| 20 | MOSFET4.Rbpb | 7.481 pV |
| 21 | MOSFET4.igs | 1.818 pV |
| 22 | MOSFET4.igd | 1.553 pV |
| 23 | MOSFET4.Rg | 693.0 fV |
| 24 | MOSFET4.igb | 3.691 aV |
| 25 | MOSFET6 | 370.1 pV |
| 26 | MOSFET6.ids | 366.6 pV |
| 27 | MOSFET6.flicker | 34.18 pV |
| 28 | MOSFET6.Rg | 13.34 pV |
| 29 | MOSFET6.Rbpb | 7.857 pV |
| 30 | MOSFET6.Rbsb | 6.966 pV |
| 31 | MOSFET6.Rbps | 5.392 pV |
| 32 | MOSFET6.Rbpd | 2.268 pV |
| 33 | MOSFET6.Rbdb | 2.268 pV |
| 34 | MOSFET6.igd | 183.6 fV |
| 35 | MOSFET6.igs | 17.07 fV |
| 36 | MOSFET6.igb | 14.43 fV |
| 37 | MOSFET3 | 283.3 pV |
| 38 | MOSFET3.ids | 278.9 pV |
| 39 | MOSFET3.flicker | 47.68 pV |
| 40 | MOSFET3.Rbpb | 2.436 pV |
| 41 | MOSFET3.Rbsb | 1.448 pV |
| 42 | MOSFET3.Rbps | 1.168 pV |
| 43 | MOSFET3.Rg | 899.6 fV |
| 44 | MOSFET3.Rbpd | 695.6 fV |
| 45 | MOSFET3.Rbdb | 685.8 fV |
| 46 | MOSFET3.igs | 647.4 fV |
| 47 | MOSFET3.igd | 6.869 aV |
| 48 | MOSFET3.igb | 1.525 aV |
| 49 | MOSFET5 | 212.2 pV |
| 50 | MOSFET5.ids | 210.3 pV |
| 51 | MOSFET5.flicker | 21.09 pV |
| 52 | MOSFET5.Rg | 10.57 pV |
| 53 | MOSFET5.Rbpd | 4.558 pV |
| 54 | MOSFET5.Rbsb | 3.656 pV |
| 55 | MOSFET5.Rbps | 2.831 pV |
| 56 | MOSFET5.Rbpd | 1.316 pV |
| 57 | MOSFET5.Rbdb | 1.316 pV |
| 58 | MOSFET5.igd | 193.0 fV |
| 59 | MOSFET5.igb | 17.45 fV |
| 60 | MOSFET5.igs | 0.07794E-18V |
| 61 | TL18 | 47.84 pV |
| 62 | TL19 | 43.15 pV |
| 63 | TL15 | 20.72 pV |
| 64 | TL17 | 9.138 pV |
| 65 | TL12 | 1.248 pV |

Fig. 35A

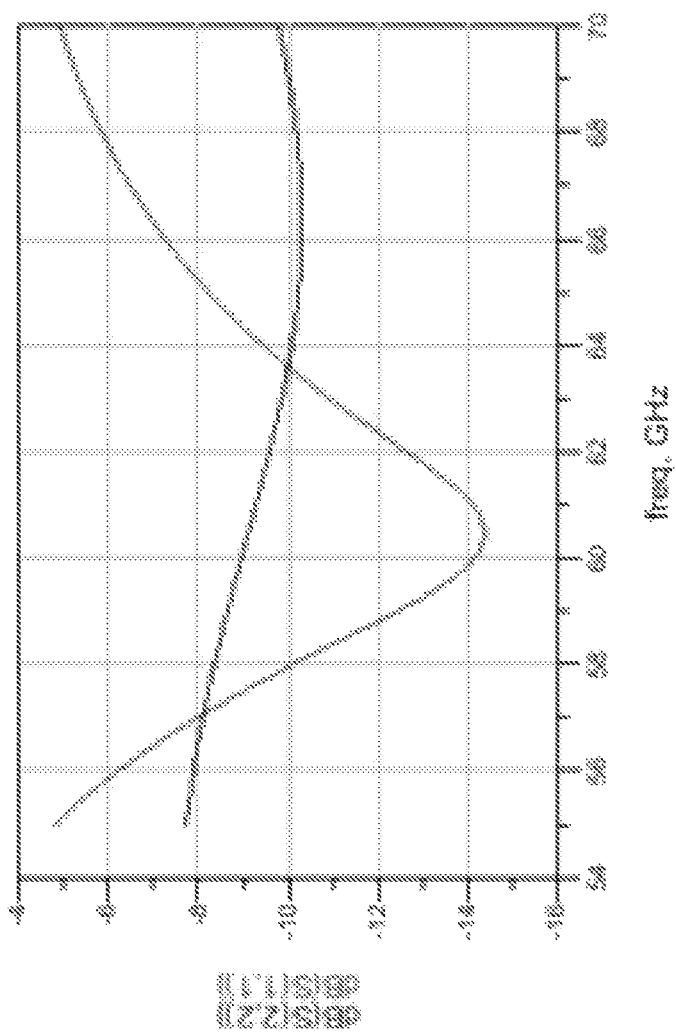
Fig. 35B

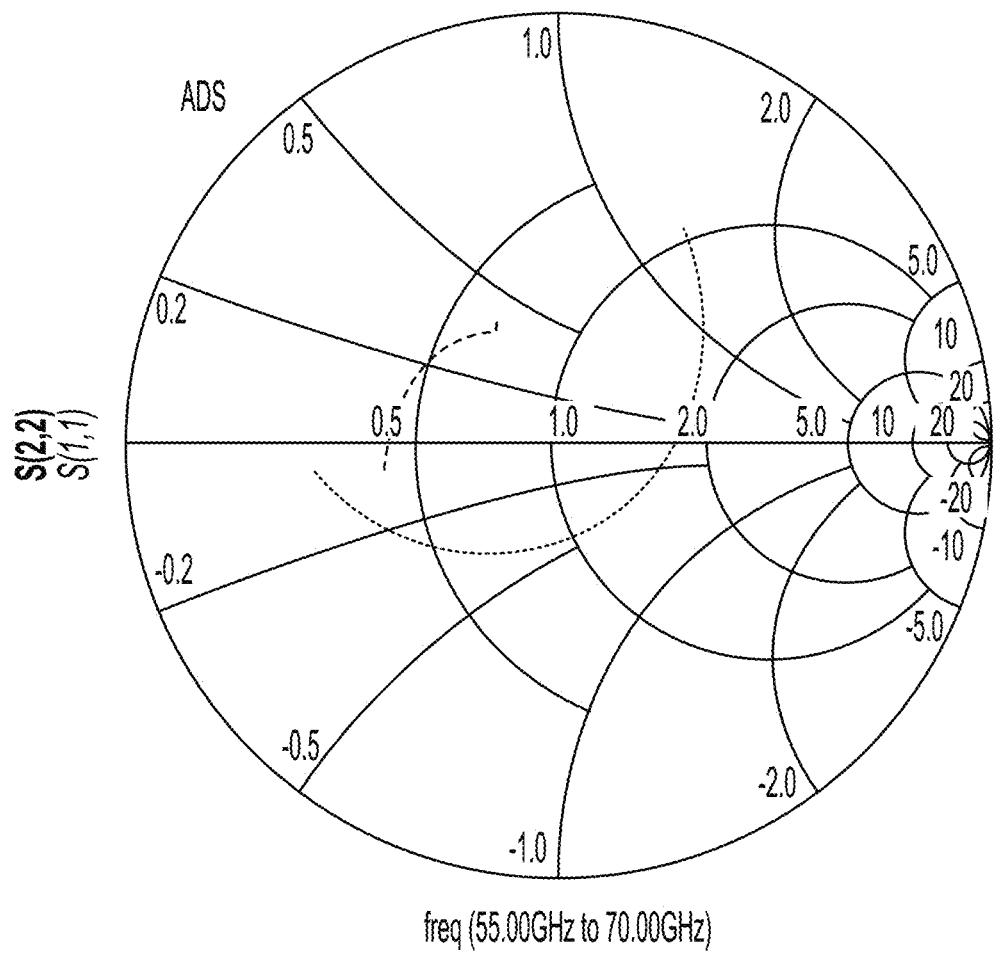
FIG. 35C

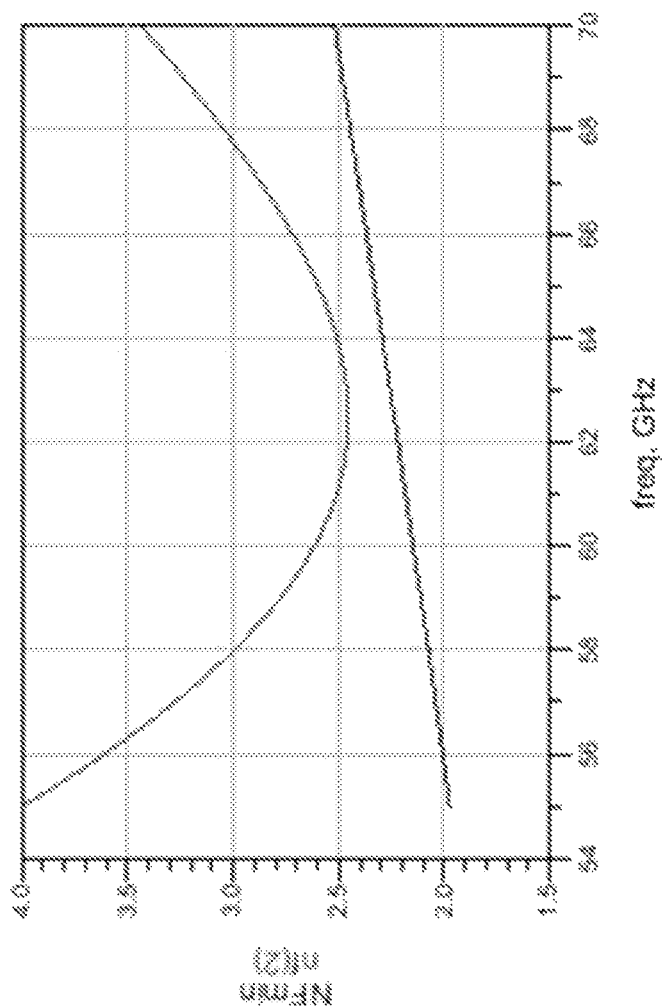
Fig. 35D

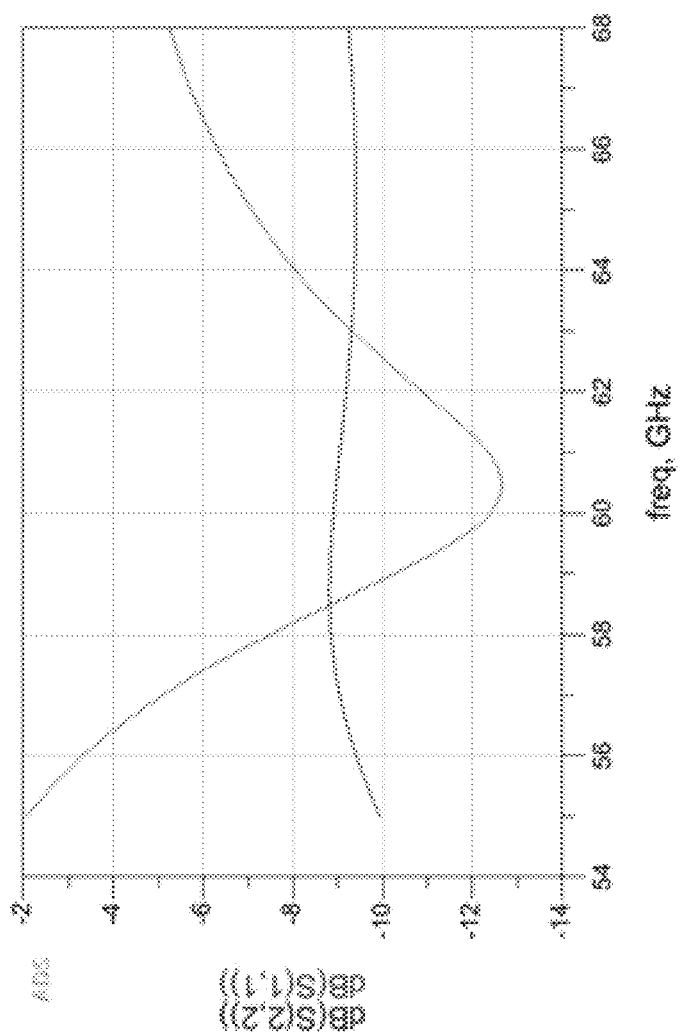
Fig. 36A

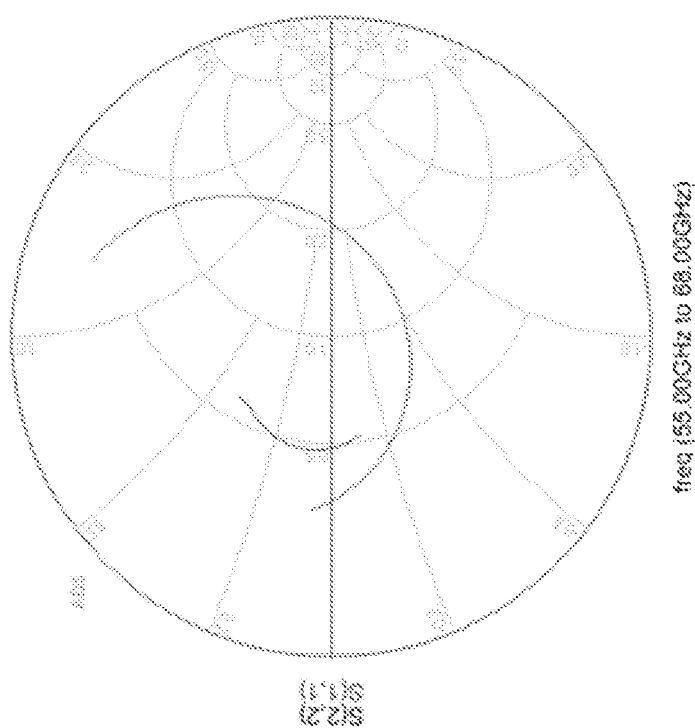
Fig. 36B

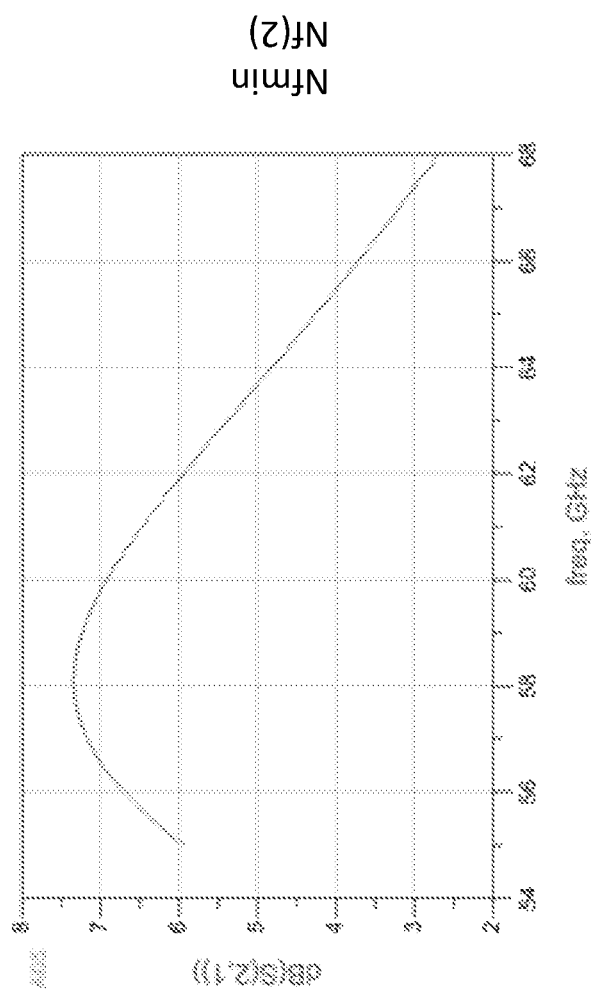
Fig. 36C

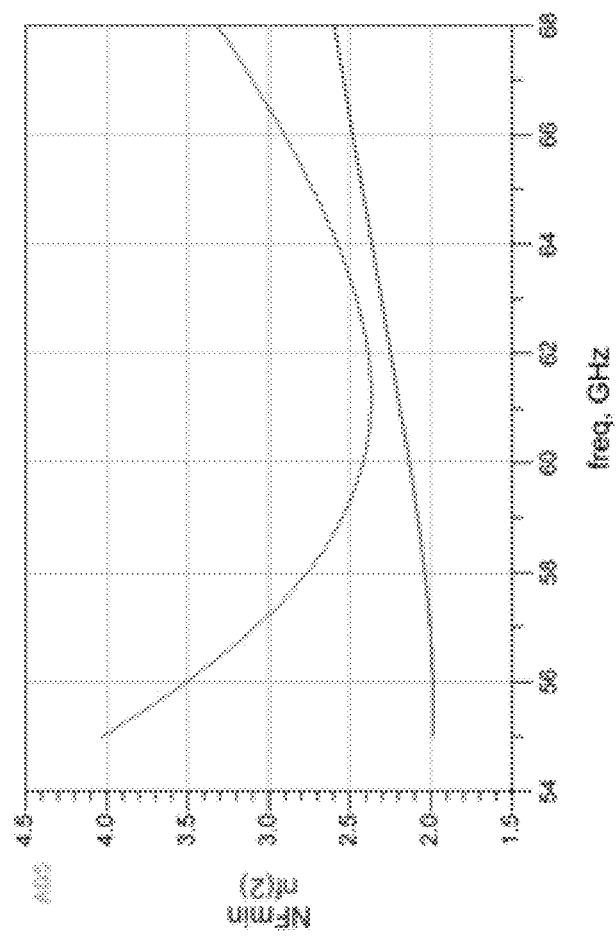
Fig. 36D

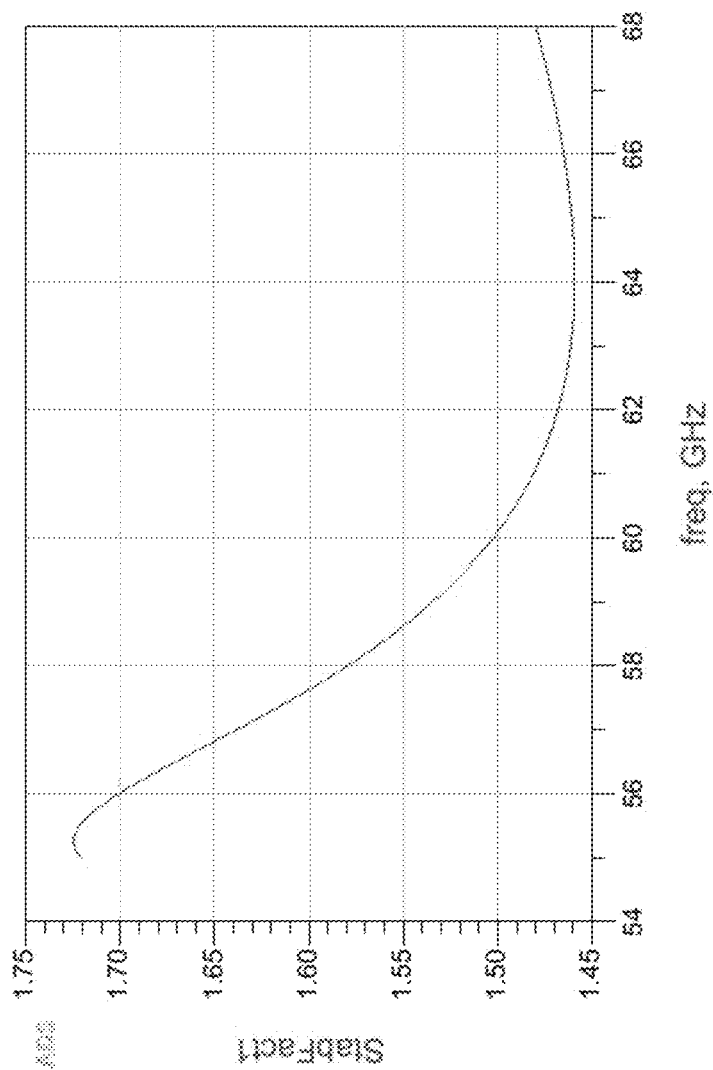
Fig. 37A

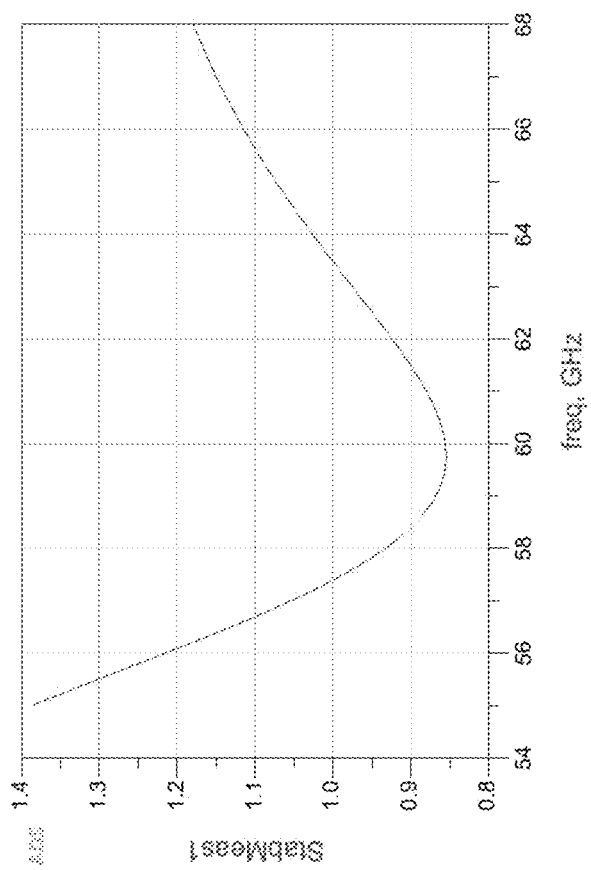
Fig. 37B

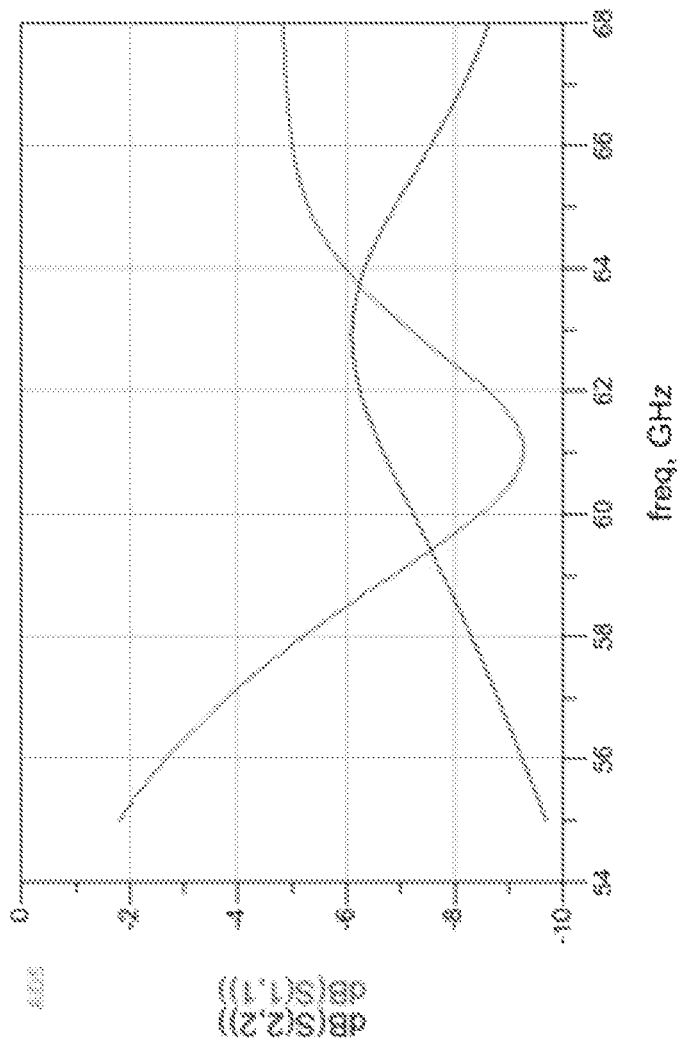
Fig. 38A

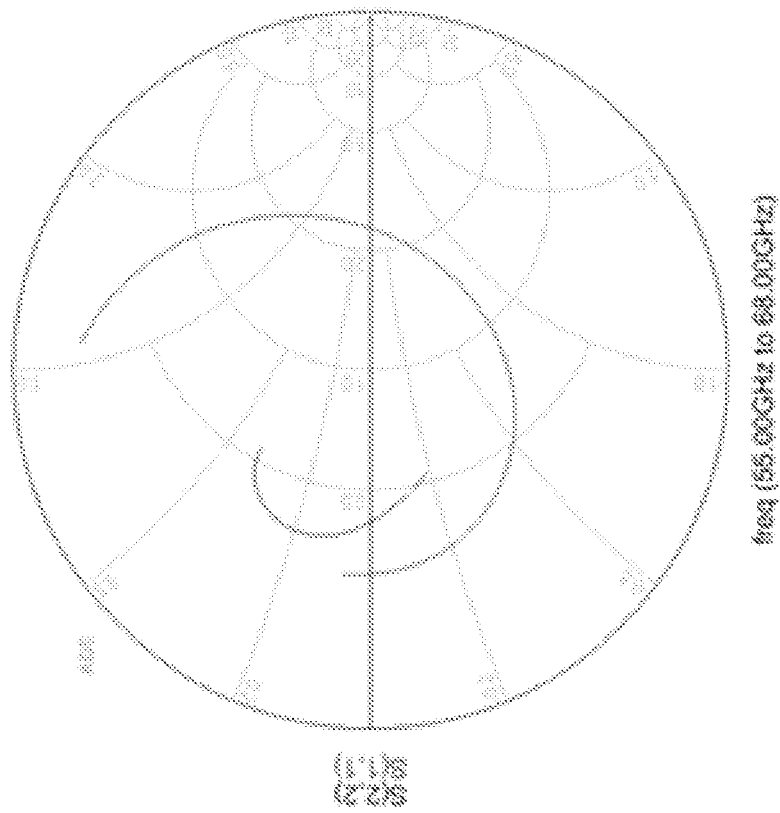
Fig. 38B

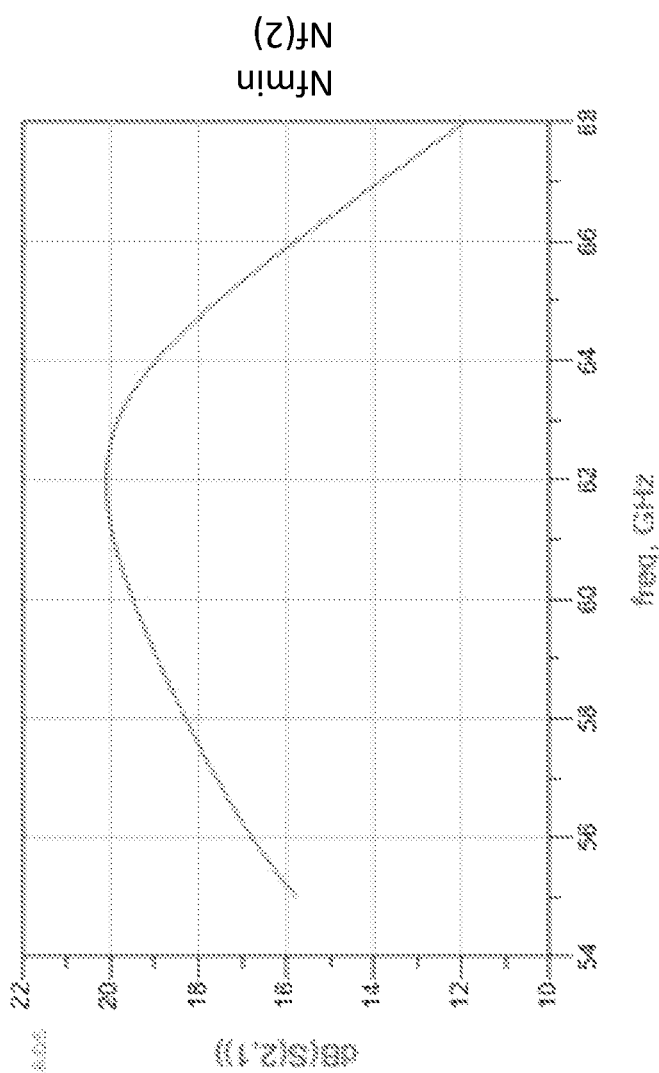
Fig. 38C

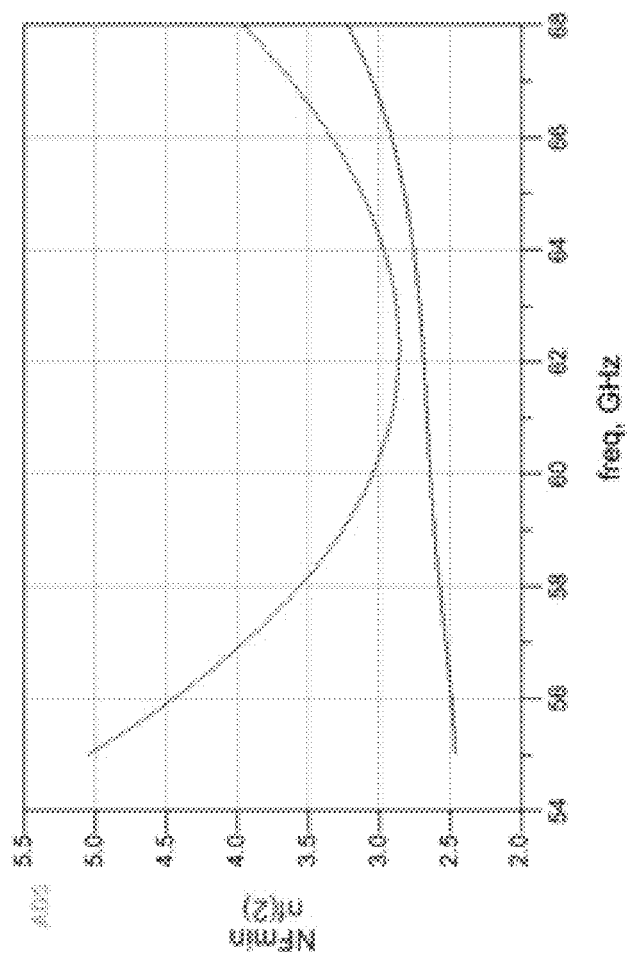
Fig. 38D

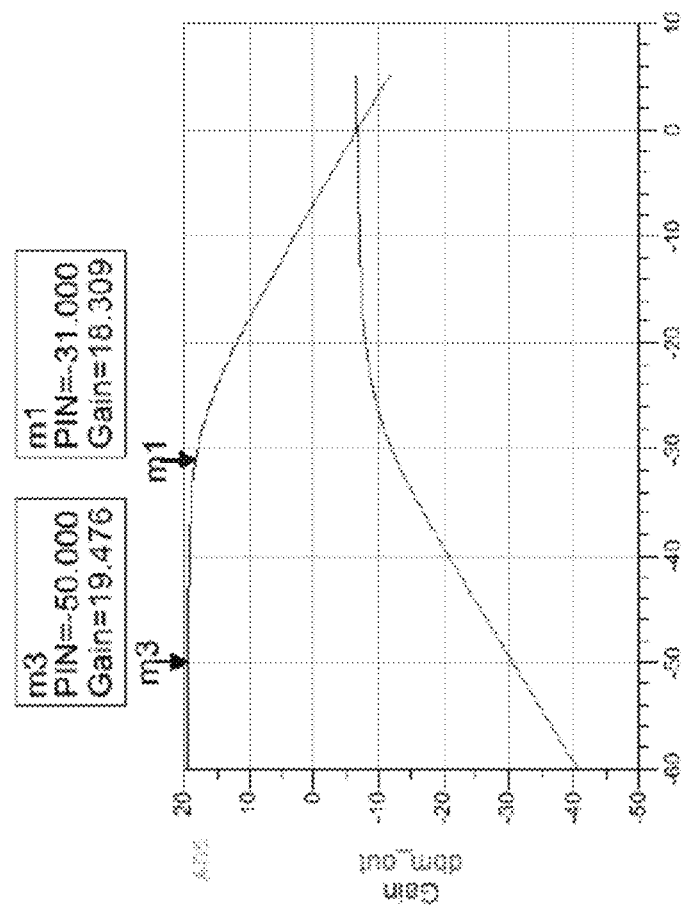
Fig. 39

TABLE I  TABLE TYPE STYLES

| Ref | Tech [nm] | Freq [GHz] | Max Gain [dB] | P.1dB [dBm] | min NF [dB] | Vdd [V] | Power [mW] | Technology |
|---|---|---|---|---|---|---|---|---|
| [1] | 65 | 56 | 22.4 | -3.4 | 4.5 | 1.5 | 16.8 | 2 cascode |
| [1] | 65 | 56 | 18.7 | -6.5 | 5.2 | 1.0 | 8.5 | 2 cascode |
| [2] | 65 | 60 | 23 | -3.5 | 4 | 1.25 | 8 | 3 CS TF+CF* |
| [3] | 65 | 59 | 16.2 | -4.85 | 3.8 | 1 | 8.3 | 3 CS+CPW |
| [4] | 65 | 60 | 20.6 | -8.4 | 4.9 | 1.2 | 33.6 | TL based |
| [4] | 65 | 60 | 18 | -5 | 4.0 | 1.2 | 28.8 | Inductor based |
| [5] | 65 | 60 | 15 | -6 | 5.9 | 1.5 | 31 | 4 cascode |
| [6] | 65 | 60 | 22.3 (19.3) | 2.7 | 6.1 | 1.2 | 35 | differential |
| [7] | 65 | 60.2 | 18.9 | -22.3 | 6.06 | 1.8 | 45 | 3 cascode |
| This work | 65 | 60 | 21 | -31* | 2.87 | 1.2 | 9.6 | 3 NCT Luse FB† |

*TF+CF = transformer + capacitive feedback
†Decorative Superposition

Fig. 40

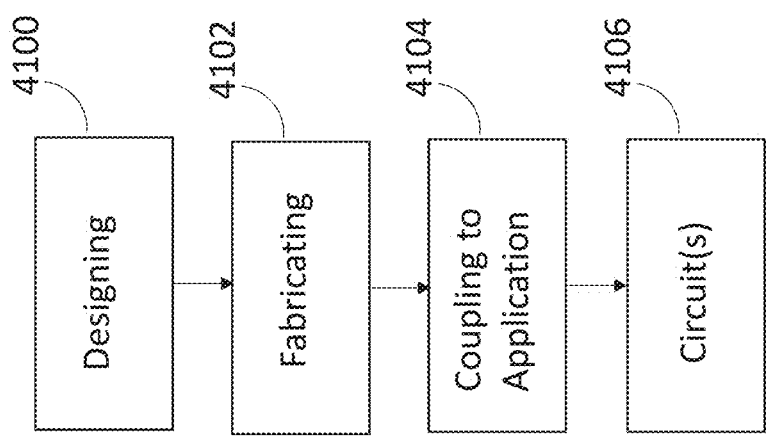
Fig. 41

NOISE REDUCTION IN HIGH FREQUENCY AMPLIFIERS USING TRANSMISSION LINES TO PROVIDE FEEDBACK

CROSS REFERENCE TO RELATED APPLICATIONS

This application claims the benefit under 35 U.S.C. Section 119(e) and commonly-assigned U.S. Provisional Patent Application No. 62/884,299, filed Aug. 8, 2019, by Tianchi Zeng and Kenneth Pedrotti, entitled "NOISE REDUCTION IN HIGH FREQUENCY AMPLIFIERS USING TRANSMISSION LINES TO PROVIDE FEEDBACK," 284.0002USP1 (UC Ref 2019-970-1), which application is incorporated by reference herein.

BACKGROUND OF THE INVENTION

1. Field of the Invention

The present invention relates to methods and devices for providing feedback in an amplifier.

2. Description of the Related Art

Feedback amplifiers are widely used in electronic circuit design. In the early days positive feedback was used to increase the gain available from vacuum tubes. Subsequently negative feedback was widely employed in amplifier designs to achieve broader bandwidth operation and lower distortion. Resistor networks are often used to sense the output signal and return a portion of it to the input summing node. One disadvantage of this approach is that the resistors add noise. A number of alternatives have been used to provide feedback using much lower noise circuit elements to avoid this problem. Among these are capacitor dividers, inductive dividers and transformers. At high frequencies the parasitics associated with these devices and control of the component values make design more challenging.

For high Radio Frequency (RF) or microwave applications complicated feedback networks, multistage amplifiers and multiple nested feedback loops become impractical due to stability concerns. For such applications local feedback topologies such as emitter or source degeneration of direct collector-to-base or drain-to-gate feedback connections are used.

The trend in wireless communications has been toward ever higher frequency of operation. Wireless communication for specialized applications has extended the use of microwave up to the mm wave portion of the electromagnetic spectrum. Recently with the advent of 5G networks and other protocols, large portions of the spectrum above 10 GHz have been made available for widespread use for wireless data communication. Recent examples of this trend in the pursuit of higher bandwidth, or higher data rates are provided by new communication standards. IEEE proposed 802.11ad (December 2012) and 802.11ay (January 2017) to define communication in the 60 gigahertz (GHz) frequency range. IEEE 802.11ad protocol was announced by WiGig (Wireless Gigabit Alliance). This protocol was developed from the previous IEEE 802.11ac protocol that used 2.4 GHz and 5 GHz for the WiFi protocol. IEEE 802.11.ad enabled devices to operate in the 2.4, 5 and 60 GHz band and deliver data transfer rates up to 7 Gbit/s. In 2017, IEEE 802.11.ay was proposed as a supplementary to IEEE 802.11.ad, adding MIMO up to 4 streams and adding four times the bandwidth of the previous version. 5G communications have been proposed for frequencies spanning from 24.25 GHz to 52.6 GHz and from 64 to 86 GHz in the mm-wave range. Aside from the broad bandwidth and speed advantages, communication at mm-Wave frequencies also benefits from lower power, shorter communication distance (improving security), and smaller antenna size, amongst other benefits. However, the advantage of mm-waves does not come for free. The disadvantages of mm-Wave frequency communication can include strong pathloss, atmospheric and rain absorption, low diffraction around obstacles and penetration through objects, significant phase noise, and higher equipment costs.

In low-frequency regions, there have been attempts [2] at noise canceling to manage to further reduce receive noise figures. However, there have been few to no attempts at such noise reduction in mm-Wave low noise amplifier (LNA) designs. Techniques developed for sub-6 GHz frequencies often are not practical for mm-Waves. The increasing parasitics of transistors/passive components becomes a major factor in circuit modeling for mm-Waves. What is needed then, are methods to reduce or cancel noise at higher frequencies. The present disclosure satisfies this need.

SUMMARY OF THE INVENTION

The present disclosure describes a circuit comprising an amplifier using a transmission line to provide feedback. The circuit can be embodied in many ways including, but not limited to, the following.

1. A circuit comprising an amplifier having an input and an output; and a feedback path comprising a transmission line between the output and the input.

2. The circuit of clause 1, wherein:
   the transmission line has a first end and second end, and
   the feedback path comprises at least one of:
      one or more first impedance matching components connected to the first end; or
      one or more second impedance matching components connected to the second end.

3. The circuit of clause 2, wherein the first impedance matching components and the second impedance matching components each comprise a capacitor and an inductor.

4. The circuit of clause 1, wherein:
   the transmission line comprises a first end and a second end, and
   the feedback path comprises at least one of:
      a first transmission line stub connected to the first end; or
      a second transmission line stub connected to the second end.

5. The circuit of clause 1, wherein the feedback path comprises one or more bandwidth matching components electrically connected to the transmission line, wherein the bandwidth matching components match or tune a bandwidth of the circuit to a center frequency in a narrow band application or to a range of frequencies in a broadband application of the circuit.

6. The circuit of clause 1, wherein the feedback path comprises a feedback structure including a plurality of transmission lines including the transmission line, one or more additional transmission lines in series with the transmission line, and one or more stub transmission lines.

7. The circuit of clause 1, wherein the feedback path comprises a plurality of transmission lines including the transmission line in a series-shunt-series configuration or a shunt-series-shunt configuration.

8. The circuit of clause 1, wherein:

the feedback path has an impedance reflecting a portion of a feedback from the output so such that a feedback ratio Vin/Vout is less than 1, and Vout is voltage at the output and Vin is voltage at the input.

9. A low noise amplifier circuit including the circuit of clause 1.

10. The circuit of clause 9, further comprising:

the amplifier comprising a first amplifier having a first output comprising a first input, wherein the first output outputs a first output signal in response to an input signal at the first input;

a second amplifier having a second output and a second input, the second output outputting a second output signal in response to the input signal at the second input and an adder transmitting the first output signal and the second output signal to a load connected to the adder.

11. The circuit of clause 10, wherein:

the first amplifier comprises a first transistor having the first output and the first input, and the second amplifier comprises a second transistor having the second output and the second input.

12. The circuit of clause 11, wherein:

the first transistor and the second transistor are each independently selected from an n-channel field effect transistor and a p-channel field effect transistor.

13. The circuit of clause 10, wherein:

the feedback path has an impedance reflecting a portion of the first output signal transmitted from the load to the input, and the first output signal, the input signal, and the second output signal each have a frequency:

greater than 6 gigahertz (GHz), and/or in a range defined by an IEEE standard for wireless communication, and/or in a range of 6 GHz-10 THz.

14. The circuit of clause 13, wherein the feedback path reflects the portion of the first output signal such that the amplifier circuit has a noise figure of 3 dB or less 15. A wireless receiver, cell tower, or base station for a mobile communication network including the low noise amplifier circuit of clause 10.

16. One or more integrated circuits or one or more chips including the circuit of clause 1.

17. The one or more integrated circuits of clause 16, further comprising a first substrate including the amplifier comprising a transistor and a second substrate including the one or more transmission lines.

18. A method of making circuit, comprising:

fabricating an amplifier having an input and an output on a first substrate; and fabricating a feedback path comprising a transmission line or a plurality of transmission lines between the output and the input, wherein the feedback path is fabricated on the first substrate or a second substrate different from the first substrate.

19. The method of clause 18, further comprising fabricating a low noise amplifier circuit or multistage noise canceling low noise amplifier comprising the circuit.

BRIEF DESCRIPTION OF THE DRAWINGS

Referring now to the drawings in which like reference numbers represent corresponding parts throughout:

FIG. 1A Resistive feedback common source amplifier.

FIG. 1B. Transmission line feedback common source amplifier

FIG. 2. Small signal equivalent circuit of FIG. 1A.

FIG. 3. Small signal equivalent circuit of FIG. 1B

FIG. 4. feedforward voltage ratio through transmission line.

FIG. 5. Input impedance looking from gate.

FIG. 6. Noise model of resistive feedback amplifier.

FIG. 7. Noise model of transmission line feedback amplifier.

FIG. 8A. Testbench for resistive feedback amplifier.

FIG. 8B. Testbench for transmission line feedback amplifier

FIGS. 9A-9C show figures of merit for resistive feedback, wherein FIG. 9A shows gain in dB; FIG. 9B shows gain in Mag and Real/Img part; and FIG. 9C shows the Noise Figure.

FIGS. 10A-10C show figures or merit for transmission line feedback, wherein FIG. 10A shows gain in dB; FIG. 10B shows gain Real/Img parts; and FIG. 10C shows Noise Figure.

FIG. 11. Gain bandwidth of transmission line feedback LNA

FIGS. 12-13 show frequency response of (FIG. 12) resistive and transmission line (FIG. 13) feedback with 160 fF parasitic capacitance FIG. 14. Transmission line feedback amplifier with shunt-stub at the left side of TL1.

FIG. 15. Circuit used for shunt-stub bandwidth compensation and impedance matching.

FIGS. 16A-16B Gain plot in dB of circuit in FIG. 15, from 55-70 GHz (FIG. 16A) and from 10-100 GHz (FIG. 16B), so that FIG. 16A and FIG. 16B are the same graphs but with different vertical scales.

FIGS. 17A-17B. Schematic of LNA including resistive feedback (FIG. 17A) and t-line based feedback (FIG. 17B).

FIGS. 18A-18E. Simulation results for LNA with resistive feedback (FIGS. 18A-18D) and transmission line based feedback (FIG. 18E-18H), wherein FIGS. 18A and 18E plot $S_{22}$ and $S_{11}$ as a function of frequency, FIGS. 18B and 18D plots gain ($S_{2,1}$) as a function of frequency. FIGS. 18C and 18G show Smith Chart plots of plots for $S_{11}$ and $S_{22}$, and FIGS. 18D and 18H plot noise figure.

FIGS. 19A-19D show Optimized transmission line feedback LNA simulation results, showing gain (FIG. 19A); NF (FIG. 19B); S11&S22 (FIG. 19C); stability circle (FIG. 19D).

FIG. 20. Table: Comparison of the proposed design with other 60 GHz results reported using 65 nm processes.

FIGS. 21A-21B. Matching MOSFET noise (FIG. 22A) and signal (FIG. 22B) voltage nodes at X and Y (taken from reference [1]).

FIG. 22A. Noise canceling LNA topology (taken from reference [1]).

FIG. 22B. Elementary implementation of amplifier A plus adder (biasing not shown) (taken from reference [1]).

FIG. 23. The equivalent feedback circuit of noise current from node Y to source, where $C_{gs}$ and $C_{gd}$ is the combination $g_s$ and $g_d$ capacitance, $A_v$ is numerically positive or the absolute value of gain.

FIG. 24. the equivalent model of common source amplifier (transistor M2). Traditionally, at lower-frequencies, the gain of common source amplifier is $-g_m R_{load}$. FIG. 26 shows $R_{load}$ becomes $Z_{load}$ as frequency is increased, where $Z_{load}$ reflects a combination of the effects of channel length modulation, effective resistor $r_0$, $C_{gd}$ of transistor M2, $C_{gs}$ of transistor M3 and load impedance (from the following stage).

FIG. 25. The equivalent model of common source amplifier (transistor M1).

FIG. 26. Lumped RLC model of infinitesimal transmission-line segment.

FIG. 27. A transmission line terminated in a load impedance $Z_L$.

FIG. 28A. A shunt stub Transmission line terminated in a load impedance $Z_L$'FIG. 28B. Simplified topology of NCLNA with Transmission line.

FIG. 29. Schematic of CMOS NC-LNA utilizing a Transmission line.

FIGS. 30-34. Single stage NC-LNA with resistive feedback simulation results: FIG. 30: Noise contributors; FIG. 31: Input/output impedance S11&S22; FIG. 32: S11&S22 in Smith Chart; FIG. 33: Gain S21; FIG. 34: Noise Figure NF(2) and NFmin FIGS. 35A-35D. Single stage NC-LNA with Transmission line feedback simulation results, noise contributors and corresponding input/output impedance match in dB (FIG. 35B) and on Smith Chart (FIG. 35C) and the Minimum noise figure (Nfmin) and noise figure (Nf) versus (vs) frequency in FIG. 35D.

FIGS. 36A-36D. Optimized single stage NC-LNA with Transmission line feedback simulation results: FIG. 36A: S11&S22 in dB; FIG. 36B: S11&S22 in Smith Chart; FIG. 36C: gain S21 in dB; FIG. 36D: NF and NFmin in dB.

FIG. 37A-37B. Optimized single stage NC-LNA with Transmission line feedback simulation results: FIG. 37A: stability factor "StabFact"; FIG. 37B: stability measure "StabMeas."

FIGS. 38A-38D. 3-stage NC-LNA with Transmission line feedback simulation results: FIG. 38A: S11&S22 in dB; FIG. 38B: S11&S22 in Smith Chart; FIG. 38C: gain S21 in dB; FIG. 38D: NF and NFmin in dB.

FIG. 39 1 dB compression point of a 3-stage NCLNA with Transmission line feedback.

FIG. 40. Table 1.

FIG. 41 is a flowchart illustrating a method of making a circuit.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Feedback amplifier designs are widely used in low-noise amplifier (LNA) designs. In general, the adoption of feedback architectures in LNA designs are useful for gain desensitization, bandwidth broadening and increased linearity. In the mmWave frequency range, small wavelengths make transmission lines practical for use in IC designs. In this disclosure, a transmission line feedback path is analyzed as a method to realize the benefits of a feedback amplifier without introducing additional noise via the feedback network.

A. First Example: Amplifier Feedback Comprising a Transmission Line

I. Transmission-Line Feedback Amplifier Theory

FIG. 1A shows a resistive feedback common source (CS) amplifier and FIG. 1B shows a circuit 100 including transmission line feedback amplifier 102 wherein a transmission line TL, 104 replaces the resistor to provide the feedback path 106 between the output 108 and the input 110. In the next sections, we compare a resistive feedback CS amplifier with a transmission line (TL) based feedback amplifier. Gain, input impedance, output impedance, noise and bandwidth are derived using a theoretical model.

1. Gain

The small-signal low frequency equivalent circuit of the resistive feedback CS amplifier is shown in FIG. 2. The gain Av, is given by:

$$A_v = -g_m \frac{(R_S + R_F)R_L}{R_S + R_F + R_L} + \frac{R_L}{R_S + R_F + R_L} \quad (1)$$

where the first term is the gain without the feedback and the second is the voltage feedforward ratio. The superposition of these two terms provides the overall gain of the amplifier [1].

When the feedback resistor is replaced with a transmission line, as shown in FIG. 3, the resistance (impedance) looking back along the feedback path changes. The voltage gain from transistor conductance is:

$$A_{Vgm} = -g_m(Z_{TLr}/R_L) \quad (2)$$

where $R_{TLr}$ is the impedance looking into the transmission line from right side, as shown in FIG. 3. From transmission line theory we have [8]:

$$Z_{TRr} = Z_0 \frac{Z_S + jZ_0 \tan\beta d}{Z_0 + jZ_S \tan\beta d} \quad (3)$$

where $Z_0$ is the characteristic impedance of transmission line, Zs is the driving source impedance (not shown), and d is the length transmission line. $\beta$ is propagation constant given by $\beta = 2\pi/\lambda$.

The feedforward voltage ratio using a transmission line is very different from its resistive counterpart. As shown in FIG. 4, given an incident voltage $V_0^+$, there is a reflection wave $V_0^-$ generated at the opposite end of the transmission line at the load impedance (assuming that $Z_L \neq Z_0$). Therefore, the voltage at the right side of transmission line (the output side), is given by:

$$V_{X(0)} = V_0^+ e^{-j\beta 0} + V_0^- e^{j\beta 0} = V_0^+ + V_0^- \quad (4)$$

where $V_0^+$ and $V_0^-$ are related through the reflection coefficient $\Gamma$:

$$\Gamma = \frac{V_0^-}{V_0^+} = \frac{Z_L - Z_0}{Z_L + Z_0} \quad (5)$$

Therefore we can rewrite equation 4 as:

$$V_{X(0)} = V_0^+ + V_0^- = V_0^+(1+\Gamma) \quad (5b)$$

The voltage at the input end of the transmission line (the input voltage applied on the transistor gate) is given by:

$$V_{t(-d)} = V_0^+ e^{j\beta d} + V_0^- e^{-j\beta d} \quad (6)$$

Replacing $V_0^-$ with $\Gamma$ we have:

$$V_{Y(-d)} = V_0^+ e^{j\beta d} + V_0^- e^{-j\beta d} = V_0^+[\cos(\beta d)(1+\Gamma) + j\sin(\beta d)(1-\Gamma)] \quad (7)$$

The feedforward voltage ratio due to transmission line is then:

$$A_{FF2} = V_{x(0)}/V_{t(-d)} = \frac{V_0^+[(1+\Gamma)]}{V_0^+[\cos(\beta d)(1+\Gamma) + j\sin(\beta d)(1-\Gamma)]} \quad (8)$$

Replacing $\Gamma$ with equation 5 we have:

$$A_{FF} = V_{x(0)}/V_{t(-d)} = \frac{Z_L}{Z_L\cos(\beta d) + jZ_0\sin(\beta d)} \quad (9)$$

To incorporate the finite source resistance the above expression is multiplied by the transfer function from the source to the transmission line input $$A_{FF1} = \frac{Z_{TL1}}{Z_{TL1} + Z_S} \quad (10)$$

Where $Z_{TL1}$ is the impedance looking into the transmission line terminated by $Z_L$. This is given by:

$$Z_{TRl} = Z_0 \frac{Z_L + jZ_0\tan\beta d}{Z_0 + jZ_L\tan\beta d} \quad (11)$$

Therefore, the overall amplifier gain, the superposition of transconductance gain and feedforward gain, is provided by:

$$A_v = A_{V_{gm}} + A_{FF1}A_{FF2} = -g_m(Z_{TLr} // Z_L) + \left(\frac{Z_{TL1}}{Z_{Tl1} + Z_S}\right)\left(\frac{Z_L}{Z_L\cos(\beta d) + jZ_0\sin(\beta d)}\right) \quad (12)$$

2. Input and Output Impedance

In the resistive case, as in FIG. 2, the input impedance is given by:

$$Z_{in} = \frac{R_F + R_L}{1 + g_m R_L} \quad (13)$$

For the transmission line, an equivalent small signal analysis of FIG. 2 is redrawn as FIG. 5.

The input impedance is the impedance looking into transmission line from left side [8]:

$$Z_{in} = \frac{V_{t(-d)}}{I_{t(-d)}} = Z_0 \frac{V_0^+(e^{j\beta d} + \Gamma e^{-j\beta d})}{V_0^+(e^{j\beta d} - \Gamma e^{-j\beta d})} = Z_0 \frac{1 + \Gamma e^{-2j\beta d}}{1 - \Gamma e^{-2j\beta d}} \quad (14)$$

However, due to the existence of a dependent source, the reflection coefficient F will also depend on the input voltage by way of the effective load impedance $Z'_L$ given by:

$$Z'_L = \frac{V_X}{I_X} = \frac{V_{X(0)}}{\frac{V_{X(0)}}{R_L} + g_m V_{t(-d)}} \quad (15)$$

Substituting one obtains:

$$Z'_L = \frac{(1+\Gamma)}{\frac{(1+\Gamma)}{R_L} + g_m(e^{j\beta d} + \Gamma e^{-j\beta d})} \quad (16)$$

Using the effective load impedance we have $\Gamma$ as:

$$\Gamma = \frac{\frac{1}{Z_0} - \frac{1}{R_L} - g_m e^{j\beta d}}{\frac{1}{Z_0} + \frac{1}{R_L} + g_m e^{-j\beta d}} \quad (17)$$

In summary, the input impedance of FIG. 5 is:

$$Z_{in} = \frac{1 + \Gamma e^{-2j\beta d}}{1 - \Gamma e^{-2j\beta d}} Z_0 \quad (18)$$

where $\Gamma$ is given by:

$$\Gamma = \frac{\frac{1}{Z_0} - \frac{1}{R_L} - g_m e^{j\beta d}}{\frac{1}{Z_0} + \frac{1}{R_L} + g_m e^{-j\beta d}} \quad (19)$$

This simplified analysis is presented to show the basic principles involved in a tractable form. Parasitic capacitances have been neglected and one can see that in general the purely real quantities associated with the resistive feedback implementation become complex, indicating the need for addition impedance matching elements to reduce reflections at the input and the output for a practical design. When matching elements are provided then the impedances at each end of the line will change thus changing the gain. In general an iterative approach is used to achieve the desired performance.

3. Noise Analysis

To make a reasonable noise analysis, some additional noise sources are added to the circuit. Resistors are added to input and output respectively along with various current noise generators, as shown in FIG. 6.

The shunt resistor at the input accounts for the noise generated at the gate and the output resistor accounts for any noise generated at the output (like channel noise). In noise analysis, a noisy resistor (or a noise source in general) could be represented as a noiseless resistance in parallel with a noise current (as shown in FIG. 6), and the noise factor is calculated as $$F = 1 + \frac{G_m^2 i_{in}^2}{G_m^2 i_s^2} + \frac{(G_m+1)^2 i_{RF}^2}{G_m^2 i_s^2} + \frac{i_{out}^2}{G_m^2 i_s^2} \quad (20)$$

where $G_m$ is the effective gain of amplifier. $i^2_{RF}$ represents the noise power of the possible noise at the source and represents the noise power of possible noise at the drain (channel noise, for example). By replacing the feedback resistor with a transmission line (assuming a noiseless transmission line) in a circuit that has the exact same gain $G_m$, the $i^2_{RF}$ term is eliminated completely, and the noise factor reduced to:

$$F = 1 + \frac{G_m^2 i_{in}^2}{G_m^2 i_s^2} + \frac{i_{out}^2}{G_m^2 i_s^2} \quad (21)$$

As operating frequency goes higher and higher (60 GHz for example), the effective $G_m$, or the amplification ability a transistor can provide within a given technology becomes smaller and smaller. Therefore, removing the noise source in the feedback path is of more value for higher frequency operation.

To summarize, the transmission line feedback can improve noise performance of a feedback amplifier by removing feedback path noise source, with no sacrifice of gain.

4. Example Model Circuit Demonstration

To illustrate the gain, impedance and noise performance of a transmission line based feedback amplifier as compared with a resistive feedback amplifier, the two circuits shown in FIGS. 8A and 8B are used.

The Voltage Controlled Current Source (VCCS) acts as a transistor with transconductance $g_m$=0.2. For the resistive case, the feedback resistor is set to 200Ω and for the transmission line case the feedback transmission line is set to have characteristic impedance $Z_0$=100Ω and electrical wavelength βd=83 degrees. A 50Ω resistor is added as a termination and input noise source and a 200Ω resistor is added to provide an output noise source.

The resistive feedback amplifier gain and noise figure (NF) in the range 55-70 GHz are roughly |S21|=10.5 dB and 3.788, respectively (see FIG. 9). FIG. 10 illustrates the results for replacing the feedback resistor with a transmission line and adjusting it for the same gain at 60 GHz. This transmission line version has |S21|=10.6 dB and NF of 3.03 dB which shows slightly higher gain as well as an improved noise figure. The results shown in in FIG. 9 and FIG. 10 agree with the calculations presented above for the appropriate component values.

5. Bandwidth and Compensation

From the gain plot in FIG. 10, we can see the gain using transmission line feedback is frequency dependent even in the absence of other reactances. To illustrate the frequency dependent gain and input impedance, we can extend FIG. 10 from 10 GHz to 100 GHz.

The result FIG. 11 shows a −0.5 db bandwidth of roughly 45 GHz due solely to the transmission line. This demonstrates a bandwidth limitation of the transmission line approach but for many applications the biggest bandwidth limitation factor would come from the parasitic capacitances and matching networks not from the transmission line.

To demonstrate the effect of parasitic capacitance, 160 fF shunt capacitors are added at the input and output respectively. The resulting frequency response is shown in FIGS. 12-13.

The gain and bandwidth reduction is primarily due to the lack of impedance matching at the input and output. Many techniques have been developed for impedance matching. In the example shown in FIG. 15, we use shunt transmission line tuning stubs but other approaches can be used instead.

When the open circuit stub is placed in shunt with feedback transmission line at the input node, shown in FIG. 14, there are two advantages:

1. The shunt stub provides an imaginary component to the impedances which could be inductive or capacitive.
2. Although the shunt stub changes the impedance looking towards the right (meaning the incident wave $V_0^+$, reflected wave $V_0^-$ and the node voltage $V_L$ (−d) all change), the voltage ratio of Vt(−d)/Vx(0) is not changed as the ratio is not related to either $V_0^+$ or $V_0^-$.

FIG. 15 shows a transmission line feedback amplifier with the addition of shunt stubs TL2 and TL3 to allow impedance matching and tuning of the feedback ratio and the inclusion of the node capacitances $C_{in}$ and $C_{out}$. FIGS. 16A and 16B illustrate the performance of the shown in FIG. 15. The results show a flatter gain as compared to FIG. 13B with a −3 db bandwidth of 45 GHz and a −1 dB bandwidth of 15 GHz. In comparison with FIG. 11, where no parasitics are considered, we see that the bandwidth is due mostly to the Q of the matching network. Other broadband matching techniques can be applied to further extend bandwidth if necessary. In summary, although the transmission line feedback amplifier does provide some limitation on the bandwidth it is less than that due to the matching network. In the analysis of numerous matched amplifiers we find that the total transmission line length required for both the feedback and matching is in the range of 0.25-0.75λ (where λ is the wavelength of the signal amplified by the amplifier), which at high frequencies does not impose a serious area penalty for integrated designs.

II. Transmission Line Feedback Amplifier Design

Part I discussed a comparison of the performance of a single stage transmission line based LNA (e.g., as illustrated in FIG. 14) with a resistive feedback LNA. The comparison illustrates the NF improvement of LNAs at the same gain using idealized circuit elements suited to developing a theoretical understanding. In this section, an LNA with transmission line feedback is designed using a more complex topology and multi-stage post amplification to facilitate comparison with published designs and to show the gain/NF improvement, along with bandwidth, stability, and power performance of a more realistic design. All circuits are designed using 65 nm bulk CMOS predictive models. Transmission lines are designed with reference parameters provided by [7][9]. Inductors are designed using ideal components to have a Q=15.

1. Noise Reduction for a Given Gain

FIG. 17 illustrates two feedback LNA designs, one with resistive feedback and the other using transmission line feedback. For a fair comparison, both transistors are set with same length/width and DC biasing (therefore, same parasitics/transconductance). Drain currents were identical and provided by a current mirror. NF is related to gain, and higher gain in general provides a better noise figure. Therefore, in the comparison circuit designs, both transistors are set for the same gain. The matching and transmission line sizing can get quite complex and so a software based optimizer was used for both designs rather than manual iteration.

FIGS. 18E-18H illustrates simulated performance of the two amplifier designs shown in FIG. 17B, and the simulation results are summarized and compared in Table 1 below.

TABLE 1

Comparison of single stage Resistive and Transmission line amplifiers at 60 GHz with equal gain.

| Amp Type | S21 dB | NF dB | S11 dB | S22 dB |
|---|---|---|---|---|
| Resistive | 4.139 | 3.595 | −19.091 | −19.091 |
| T-Line | 4.047 | 2.305 | −18.864 | −12.668 |

Note that a significant improvement in noise figure was obtained for the transmission line based amplifier despite it having slightly less gain and poorer matching.

2. Optimum Transmission Line Feedback LNA Design

To facilitate comparison with amplifiers reported in the literature we remove the artificial gain and transistor size constraints, provide two additional gain stages and realistic transistor biasing in an attempt to include all possible noise sources. Simulation results are shown in FIG. 19A-19D. A maximum gain of 20.8 dB and 3.1 dB NF is achieved at 60 GHz. Input/output impedance is reasonably well matched and both source and load stability circle indicate this LNA is stable within the Smith chart unity circle.

3. State of Art Comparisons

The table in FIG. 20 compares performance of this amplifier with transmission line feedback to various state-of-the-art 60 GHz LNAs. A clear improvement of NF is observed without significant degradation in other performance metrics.

4. Example Matching Networks

FIGS. 14-15 illustrate examples wherein the transmission line TL1 104 has a first end 1300 and second end 1302, and the feedback path comprises at least one of:

(1) one or more first matching components 1304 or matching networks connected to the first end 1300; or (2) one or more second matching components 1308 or matching networks connected to the second end 1302.

FIG. 14 illustrates an example where the matching component or network 1304 is connected to one end of the transmission line TL1, and FIG. 15 illustrates an example where a first matching component or network 1304 is connected to the first end 1300 and a second matching component or network 1308 is connected to the second end.

While FIGS. 14-15 illustrate examples of the first matching network 1304 comprising a first transmission line stub TL2 and the second matching network or component 1308 including a second transmission line stub TL3, in other examples the matching networks or components 1304, 1308 comprise, but are not limited to, one or more capacitors and one or more inductors, chebyshev transformers, or binomial transformers.

Moreover, while FIG. 15 illustrates an example wherein the feedback path comprises a plurality of transmission lines including the transmission line in a shunt-series-shunt configuration (TL2-TL1-TL3), the transmission lines can also be configured in a series-shunt-series configuration or other feedback structure 1350 including a plurality of transmission lines in series or parallel with one another. In one or more examples, the feedback structure comprises a voltage divider 1350 including the transmission line 104.

As illustrated herein, the matching components or matching networks 1304, 1308 comprise at least one of impedance matching components or networks, bandwidth matching components or networks, or gain/feedback ratio tuning components or networks. In various examples, the bandwidth matching components match, tune, or optimize a bandwidth of the circuit to a center frequency in a narrow band application or to a range of frequencies in a broadband application of the circuit. Example narrowband impedance matching network include, but are not limited to, a lumped element, a single stub, double stub, or a quarter-wave transformer.

III. REFERENCES FOR FIRST EXAMPLE

[1] Thomas Lee, "The Design of CMOS Radio-Frequency Integrated Circuits, second edition", 2004

[2] Federico Bruccoleri, Eric A. M. Klumperink, Bram Nauta, "Wide-Band CMOS Low-Noise Amplifier Exploiting Thermal Noise Canceling," IEEE Journal of Solid-State Circuit, vol. 39, NO. 2, 2004

[3] Stephan C. Blaakmeer, Eric A. M. Klumperink, Domine M. W. Leenaerts and Brain Nauta, "Wideband Balun-LNA with Simultaneous Output Balancing, Noise-Canceling and Distortion-Canceling," IEEE Journal of Solid-State Circuit, vol. 43, NO. 6, June 2008

[4] Stephan C. Blaakmeer, Eric A. M. Klumperink, Domine M. W. Leenaerts and Bram Nauta, "A wideband Noise-Canceling CMOS LNA exploiting a Transformer", IEEE RFIC Symposium, 2006

[5] Liang Wu, Hiu Fai Leung, Howard Luong, "Design and Analysis of CMOS LNAs with Transformer Feedback for Wideband Input Matching and Noise Cancellation", IEEE Transactions on Circuits and Systems, June 2017

[6] Ehsan Adabi, Ali Niknejad, "CMOS Low Noise Amplifier with Capacitive Feedback Matching", IEEE Custom Integrated Circuit Conference, 2007

[7] Sheng-Chun Wang, Pin Su, Kun-Ming Chen, Kuo-Hsiang Liao, Bo-Yuan Chen, Sheng-Yi Huang, Cheng-Chou Hung, and Guo-Wei Huang, "Comprehensive Noise Characterization and Modeling for 65-nm MOSFETs for Millimeter-Wave Applications", IEEE Transaction on Microwave Theory and Techniques, vol. 58, NO. 4, 2010

[8] David M. Pozar, "Microwave Engineering, fourth edition", 2011

[9] Mounir Youssef Bohsali, "Millimeter—Wave CMOS Power Amplifiers Design," UC Berkeley, PhD Dissertation, 2009.

[10] Michael Kraemer, Daniela Dragomirescu, Robert Plana, "A low-power high gain LNA for the 60 GHz band in a 65 nm CMOS technology," IEEE P1156-P1159, 2009.

[11] Emanuel Cohen, Ofir Degani, and Dan Ritter, "A Wideband Gain-Boosting 8 mW LNA with 23 dB gain and 4 dB NF in 65 nm CMOS process for 60 GHz applications", IEEE Radio Frequency Integrated Circuits Symposium, 2012.

[12] Saihua Lin, K. B. Ng, Hang Wong, K. M. Luk, S. Simon Wong, and Ada S. Y. Poon, "A 60 GHz Digitally controlled RF Beamforming Array in 65 nm CMOS with Off-Chip Antennas", IEEE, 2011.

[13] Hsieh-Hung Hsieh, Po-Yi Wu, Chewn-Pu Jou, Fu-Lung Hsueh and Guo-Wei Huang, "60 GHz High-Gain Low-Noise Amplifiers with a Common-Gate Inductive Feedback in 65 nm CMOS", IEEE, 2011.

[14] Arun Natarajan, Sean Nicholson, Ming-Da Tsai and Brain Floyd, "A 60 GHz Variable-Gain LNA in 65 nm CMOS", IEEE Asian Soid-State Circuits Conference, 2008.

[15] Christopher Weyers, Pierre Mayr, Johannes W. Kunze, "A 22.3 dB Voltage Gain 6.1 dB NF 60 GHz LNA in 65 nm CMOS with differential output", ISSCC, mm-Wave & Phased Arrays, 2008.

[16] Yi-Keng Hsieh, Jing-Lin Kuo, Huei Want and Liang-Hung Lu, "A 60 GHz Broadband Low-Noise Amplifier with Variable-Gain Control in 65 nm CMOS", IEEE Microwave and wireless components letters, November 2011.

Second Example: Noise Canceling Low Noise Amplifier with Transmission Line Feedback 1. Introduction Noise canceling amplifiers cancel the channel noise of a transistor in the input stage of What we will refer to as the main amplifier of an LNA by sampling this noise at the amplifier input amplifying and inverting the noise using an auxiliary amplifier and then summing the outputs of the main and auxiliary so that the channel noise of the main amplifier is canceled but the amplified signals from each path add. This does not eliminate all noise sources but is significant because the channel noise in MOSFETs is usually a large if not the largest noise contributor. The noise and signal waveforms at the nodes of the main amplifier are shown in FIG. 21. The amplifier in FIG. 21A has an input impedance at node X of $Z_{in}=1/g_{mi}$ and a voltage gain $A_{vf,mi}=V_y/V_x=1-g_{mi}R_f$, where the index mi refers to the main amplifier stage and Vy, Vx are the voltages at nodes Y and X, respectively. Depending on the relationship between $Z_{in}=1/g_{mi}$ and Rs, a noise current $\alpha(R_S, g_{mi}) \times I_{n,i}$ flows out of the MOSFET through $R_f$ and $R_S$, where $0<\alpha<1$ and $I_{n,i}$ is the channel thermal noise current of the MOSFET. This current causes instantaneous noise voltages at nodes X and Y, which are not inverted relative to one another. On the other hand, the signal voltages at nodes X and Y are inverted, because the gain $A_{vf,mi}$ is negative.

This difference in sign for noise and signal makes it possible to cancel the noise of the matching device, while simultaneously adding the signal contribution constructively. This is done by creating a new output (as shown in FIG. 22A), where the voltage at node Y is added to a scaled inverted replica of the voltage at node X. A proper value for this scaling factor results in noise canceling at the output node, for the thermal noise originating from the MOSFET channel.

$$V_{X,n,i}=\alpha(R_S,g_{mi}) \cdot I_{n,i} R_S \qquad (22.a)$$

$$V_{Y,n,i}=\alpha(R_S,g_{mi}) \cdot I_{n,i}(R_S+R) \qquad (22.b)$$

The noise seen at output due to the channel noise is:

$$V_{out}=V_{Y,n,i}-V_{X,n,i} \cdot A_V = \alpha(R_S, g_{mi}) \cdot I_{n,i}(R_S+R-A_V R_S) \qquad (23)$$

The noise cancellation is achieved when $V_{out}=0$, which occurs when the gain of the auxiliary amplifier (Ampl. "A") is:

$$A_{V,C} = \frac{V_{Y,n,i}}{V_{X,n,i}} = 1 + \frac{R}{R_S} \qquad (24)$$

For mm-Wave circuitry applications up to 60 GHz using 65 nm CMOS technology [4], channel thermal noise remains the dominant noise source in the intrinsic part of the device, and can be predicted using traditional thermal noise theory. Therefore, eliminating the thermal noise of transistors remains the top priority for the noise canceling LNA design at 60 GHz. However, the analytical theory of noise canceling discussed above is a low frequency model. At low frequency all the noise current that. We know that the thermal noise is given by:

$$\frac{\overline{i_d^2}}{\Delta f} = 4kT\gamma g_{d0} \qquad (25)$$

where $i_d$ is the noise current, $g_{d0}$ is the zero-bias drain conductance of the device, $\gamma$ is a bias-dependent factor, K is Boltzmann constant and T is temperature FIG. 22B illustrates a noise canceling LNA realizing the topology in FIG. 22A at higher frequencies using real devices and taking the parasitics into account. $C_{IN}$, $C_Y$ and $C_L$ are the net parasitic node capacitances at the input, Y and load nodes respectively.

In order to investigate the dominant frequency limitations of noise canceling, we can safely assume $C_Y=C_L=0$, because neither are in the feedback path from node Y to X. $C_{IN}$ is the sum of the gate-source capacitance $C_{gs}$ and gate-drain capacitance $C_{ds}$, in both transistor M1 and M2. At low frequencies all of the noise current that flows through R also flows through the source resistance and none flows through $C_{IN}$. At high frequencies the noise current $\alpha I_{n,i}$ flows out from the drain node of transistor M1 through feedback resistor R and 'sees' a complex source impedance $Z_S$.

From the analysis of noise canceling provided above, we know the key to cancel the thermal channel noise is as shown in equation (24), i.e., matching the gain and feedback resistor ratio. Replacing $R_S$ in equation (24) with complex impedance $Z_S$ means that the equality can no longer be satisfied. Bruccoleri [1] also noticed this high frequency limitation and pointed out the divergence from equality of equation (24) becomes more severe as frequency increases. From his observation, this mismatch effect due to increased frequency can be modest up to relatively high frequencies because of the low input-node resistance but will eventually limit the effectiveness of the noise canceling amplifier at high frequencies.

Although reference [1] discussed the effectiveness of the noise canceling theory up to 2 GHz, reference [1] concluded noise canceling fails at higher frequency because the real value $R_S$ in equation (3) turns into a complex value $Z_S$ (as shown in FIG. 23 a simplified feedback path from Y to X). Surprisingly, we find that favorable high frequency performance is still possible when $A_{V,C}$ (on the left side of equation (24)) is also not a purely real value. Therefore, the left side and right side of equation 3 are both complex values at higher frequencies. Moreover, if we draw a small signal equivalent circuit of transistor M1, as in FIG. 25, it is clear that the feedback path including $R_f$ and $C_{gd}$ is also not purely resistive. Thus, $A_{V,C}$ and $Z_S$ in equation (24) and feedback path impedance, are all complex values at higher frequencies.

Therefore, we can rewrite the noise-canceling condition in Eq. 24 as follows:

$$A_{v,c} = 1 + \frac{Z_f}{Z_s} \quad (25)$$

where $A_{V,C}$ is a complex gain; $Z_f$ is feedback impedance, and $Z_S$ is the source impedance. For suitable choice of component values and with the addition of matching components this equality can be maintained at high frequencies over a considerable bandwidth.

In summary, at low-frequency or at mm-Wave frequencies, channel thermal current noise remains the biggest noise figure contributor to LNA circuits and channel noise cancelation at high frequencies (e.g. in a 60 GHz LNA) is still possible.

2. Transmission Line Impedance Transformation

Prior to showing how the feedback network of a NCLNA is designed we review the impedance transformation capability of transmission lines. FIG. 26 shows the lumped RLC model of an infinitesimal transmission line segment. The intrinsic impedance characterizing this segment of transmission line is:

$$Z_0 = \sqrt{\frac{R + j\omega L}{G + j\omega C}} \quad (26)$$

and at high frequency can be approximated by:

$$Z_0 = \sqrt{L/C} \quad (27)$$

The Transmission line can be used to transform impedance [5] when it is terminated by an arbitrary termination $Z_L$, as in FIG. 27.

$$Z_{in}(d) = Z_0 \frac{(Z_L + Z_0)e^{j\beta d} + (Z_L - Z_0)e^{-j\beta d}}{(Z_L + Z_0)e^{j\beta d} - (Z_L - Z_0)e^{-j\beta d}} \quad (28)$$

$$= Z_0 \frac{Z_L \cos\beta d + jZ_0 \sin\beta d}{Z_0 \cos\beta d + jZ_L \sin\beta d}$$

$$= Z_0 \frac{Z_L + jZ_0 \tan\beta d}{Z_0 + jZ_L \tan\beta d}$$

where the $Z_0$ is characteristic transmission line impedance, $Z_L$ is the load impedance β is the propagation constant (2π/λ) and d is the length of Transmission line from the load.

Another application of impedance transformation (which is related to the present disclosure) is that the transformed impedance can be viewed as a lumped impedance. This is important in understanding the LNA design in two ways: 1) the drain of the transistor sees the load impedance in parallel with Transmission line terminated back to the source; and 2) the source sees the input impedance (gate of the transistor) in parallel with Transmission line terminated into the load.

3. Voltage Division Using a Transmission Line

The reason a transmission line can change impedance is waveform reflection. Assume an incident waveform $V_0^+ e^{-j\beta z}$ is generated from a source at z<0 and $Z_0$ is the characteristic impedance of the transmission line (the ratio of voltage to current of the traveling wave in that transmission line). If the line is terminated in an arbitrary load $Z_L \neq Z_0$, as shown in FIG. 27 then the voltage to current ratio of the load must be forced to $Z_L$ (leading to the definition of 'reflected voltage wave' $V_0^- e^{j\beta z}$ and 'voltage reflection coefficient' Γ). Assuming the load is at z=0, we have following equations:

$$V(z) = V_0^+ e^{-j\beta z} + V_0^- e^{j\beta z} \quad (29)$$

$$I(z) = \frac{V_0^+}{Z_0} e^{-j\beta z} - \frac{V_0^-}{Z_0} e^{j\beta z} \quad (30)$$

$$\Gamma = \frac{V_0^-}{V_0^+} = \frac{Z_L - Z_0}{Z_L - Z_0} \quad (31)$$

Often it is desired for the reflection coefficient Γ to be zero, meaning there is no voltage reflected (widely used in impedance matching theory to deliver maximum power from source to the load). However, in a noise canceling feedback circuit as described herein, the zero-reflection feature is not desired. Instead we want the voltage at two sides of the transmission line ($V_Y$ and $V_X$) to be different so as to realize $V_Y/V_X = A_{V,C}$.

In the example of FIG. 27, assuming $V_X$ is at z=0 and $V_Y$ is at z=-d, we can write equations for $V_X$ and $V_Y$ respectively:

$$V_{X(0)} = V_0^+ e^{-j\beta 0} + V_0^- e^{j\beta 0} = V_0^+ + V_0^- = V_0^+ (1 + \Gamma) \quad (32)$$

$$V_{Y(-d)} = V_0^+ e^{j\beta d} + V_0^- e^{-j\beta d} = V_0^+ [\cos(\beta d)(1+\Gamma) + j\sin(\beta d)(1-\Gamma)] \quad (33)$$

$$A_{V,C} = V_{Y(-d)}/V_{X(0)} \quad (34)$$

$$= \frac{\cos(\beta d)(1+\Gamma) + j\sin(\beta d)(1-\Gamma)}{(1+\Gamma)}$$

$$= \cos(\beta d) + j\sin(\beta d)\frac{Z_0}{Z_L}$$

where β=2π/λ, d is the length of Transmission line, $Z_0$ is the characteristic impedance of the transmission line and $Z_L$ is the impedance looking from $V_X$ backwards to source (in the simplest case, if ignoring the impact of transistor, $Z_L = R_S$ load impedance).

In the real LNA design, the '$Z_L$' in the noise canceling low noise amplifier (NCLNA) is a complex impedance of the combination of (e.g., the network of) source impedance and the matching network. Although a complex $Z_L$ renders Eq.34 even more complicated, it does provide a situation wherein $V_Y/V_X = A_{V,C}$. In this application, maximum power delivery is not the goal—instead some magnitude of reflected voltage wave is desired so that $V_X$ and $V_Y$ achieve the desired ratio.

The "voltage dividing" property not only applies to single series Transmission line topologies, but also applies to more advanced topologies such as those using additional impedance transformation structures. Stub tuning, as shown in FIG. 28A, is a common but not unique technique for performing impedance transformation. The role of the shunt stub is to introduce a pure imaginary component in parallel with the load impedance. Therefore, when analyzing "voltage dividing" of a stub tuning topology, we can break the Transmission line into 1) a Transmission line terminated into $Z_L$ a 2) the shunt stub changing part 1) into a new $Z_L'$; and 3) a Transmission line terminated into a $Z_L'$ (which changes Γ as in Eq. 31).

Using additional impedance transformation elements such as stubs the voltage ratio at Y and X can be made purely real as was initially explained in the original paper on the NCLNA. At higher frequencies additional phase shift will be encountered along the signal path through the auxiliary amplifier and to the summing node. For noise cancelation to occur the amplitude of the noise signal that is to be cancelled must be equal and of opposite sign at the summing node. This does not require that the ratio of $V_Y$ and $V_X$ be purely real.

The circuit design principles discussed above have been verified using simulation software Advanced Design System (ADS).

The essence of noise canceling is to create a feedback path that brings both thermal noise ($I_{n,i}$) and the amplified signal from node X with:

$$A_{V,C} = \frac{V_{Y,n,i}}{V_{X,n,i}}$$

Such that approximate cancellation occurs at the summing node over the desired range of frequencies. The advantage of using a Transmission line feedback over resistive feedback (or a more complex feedback network containing resistors) is that the thermal noise created by the feedback path is negligible when using the transmission line due to its much lower resistive losses.

4. Example Noise-Canceling LNA Design

A transmission-line noise-canceling LNA according to embodiments described herein was designed for application in the 9 GHz license free spectrum from 57-66 GHz with bandwidth per channel of 2.16 GHz, target voltage gain at 20 dB or higher, and noise figure (NF) below 3.5 dB across the channel bandwidth. Reasonable input/output impedance matching is also desired.

Applications in different frequency regions may also be implemented. The low noise amplifier can be designed to operate over a range of narrow or wide bandwidths (e.g., bandwidths in a range of 0-10 GHz).

FIG. 29 is a schematic of a noise-canceling LNA with a transmission line structure to provide the noise sampling in the main amplifier. M1 provides $g_{m1}$ and M2 provides the transconductance $g_{m2}$ of the auxiliary amplifier in FIG. 22. The cascode transistor M4 improves the isolation and reduces the input capacitance by decreasing the Miller effect due to M2. The output signal of the first amplifier goes through a high-pass DC Blocking filter and is fed to a source follower M3. The signals from the main and auxiliary amplifiers are combined at the node connecting M3 and M4. A source follower combines the amplified signal (from M1) feeding into the gate with the other amplified signal from M2 and feeds the combined signal to the output.

The transmission lines TL1 and TL2 are connected to transistors M1 and M2, respectively, to provide impedance transformation of their gate impedances as seen at node X. TL3 and TL4 are the transmission lines that create the feedback path setting the gain of the main amplifier at high frequency. At low frequencies, TL3 and TL4 act like a short setting the bias of M1 so that $V_{gs1} = V_{ds1} = V_{bias}$ with $V_{source} = 0$. The drain-source current $I_{ds1}$ and transconductance $g_{m1}$ are both determined by $V_{g1}$, $V_{s1}$, $V_{d1}$, and the width of M1.

At high frequencies (60 GHz) transmission lines TL3 through TL7 perform "voltage division" and also play a role in impedance matching the input of the LNA. As discussed above, the noise voltage from Y through the transmission lines to X is "divided" making the voltages at node Y and X ($V_Y$ and $V_X$ respectively) have a ratio and phase shift so that when amplified and summed the noise cancellation occurs at the output. TL5, TL6 and TL7 are shunt-stubs that provide extra degrees of freedom, by inserting pure imaginary components, so as to facilitate input impedance matching while also achieving the desired $V_Y/V_X$.

$$A_{v,c} = 1 + \frac{Z_f}{Z_s} = V_{Y(-d)}/V_{X(0)}$$

Contrary to a traditional Noise Canceling LNA topology, in which Eq. 24 must be realized by a proper value of $Z_f/Z_s$, the design of Noise Canceling LNA with transmission line feedback does not require the feedback path and source impedance to have specific values. This eases circuit design since both $Z_s$ and $Z_f$ are part of the input impedance matching network in the traditional design. Designing a good impedance match while simultaneously maintaining a proper value of $Z_f/Z_s$ can be challenging.

Since TL3 and TL4 are connected to the drain of MOSFET1 and gate of MOSFET3, TL3 and TL4 will impact input impedance so that the feedback path will be part of the impedance matching network. The input impedance is the combination of Transmission line path, and the matched gates of M1 and M2 combined in parallel.

Using a simulator (e.g., ADS or Cadence), we can carefully design the transmission line so as to realize both the voltage division and impedance matching requirements.

TL3 and TL4 behave differently in different frequency regions. Therefore, when designing the LNA, we should take these different properties into consideration. The following summarizes an example methodology for designing a noise canceling LNA (as shown in FIG. 29) with transmission line feedback (as well as differences from the design of a traditional LNA):

1) Design a Common Source amplifier, MOSFET1, with drain and gate biased at the same DC voltage, terminated into a source follower MOSFET3. Optimize transistor width/length to maximize mi.

2) Create auxiliary Common Source amplifier MOSFET2 and cascode transistor MOSFET4 (optional). The dimensions and bias of MOSFET2 are set to satisfy "derivative superposition" [15], requiring MOSFET2 $g_{m2}'' = -g_{m1}''$, to maximize linearity of system.

3) Create a feedback structure terminated into 50Ω, separately. The feedback path could be series-shunt-series stubs, shunt-series-shunt stubs or more complicated topologies like series-shunt-series-shunt-series shown in the example designs. The goal initial goal of this feedback, as discussed above, is to provide voltage dividing at the center frequency of interest from $V_Y/V_X = A_{V,C}$, where $A_{V,C}$ is the gain of the auxiliary amplifier including MOSFET2.

4) Connect gate and drain of transistor MOSFET1 with the Transmission line structure described above in 3).

5) Input impedance match by providing either LC or transmission lines (as shown) to the gates of transistor MOSFET1 & MOSFET2 independently.

6) Refine the noise cancellation and impedance matching from this initial design by changing the lengths and optionally the characteristic impedances of the transmission lines. Track s-parameter and NF while doing the refining. Additionally the gain and phase shift of the auxiliary amplifier can be adjusted as well to facilitate the noise cancellation.

There are many variable combinations that can be used to achieve the desired noise cancellation, gain and impedance matching.

FIG. 29 illustrates one example of a low noise amplifier circuit 3301 including a first amplifier 100 having a first output 108 (Y) and a first input 110 (X), wherein the first output outputs a first output signal in response to an input signal at the first input; a second amplifier 3300 having a second output 3302 and a second input 3304, the second output outputting a second output signal in response to the input signal at the second input; and a summing node 3306 transmitting the first output signal and the second output signal to a load 3308 connected to the adder. As illustrated herein, the feedback path 106 has a reflection coefficient such that an amplified amplifier noise that gets fed back through the feedback path arrives at the summing node with an amplitude and phase that cancels or acts to reduce the amplifier noise.

In the example of FIG. 29, the first amplifier 100 comprises a first transistor 3310 having the first output and the first input and the second amplifier 3300 comprises a second transistor 3312 having the second output and the second input. Example transistors include, but are not limited to, an n-channel field effect transistor (e.g., n-channel MOSFET1 or MOSFET2) or a p-channel field effect transistor (e.g., p-channel MOSFET).

The first transistor 3310 has a first gate and a first channel coupled to the first gate (e.g., coupling a signal/noise from drain to the gate), wherein the first gate controls a first current through the first channel such that a first output signal is outputted from the first output in response to the input signal inputted to the first gate. The second transistor 3312 is connected in parallel with the first transistor, the second transistor having a second gate and a second channel. The second gate controls a second current through the second channel such that a second output signal is outputted from the second output in response to the input signal inputted to the second gate, and the first output and the second output are summed. The summation of the first output signal and the second output signal is transmitted to a. The feedback path comprises voltage divider 3314 electrically coupling the first output of the first transistor to the first gate of the first transistor, the voltage divider allows a portion of the first output signal to be transmitted from the load to the first gate.

5. Example Simulation Results and Comparisons

The transmission-line noise-canceling LNA described in the example of section 5 was simulated using ADS.

a. Comparison Showing Noise Reduction Achieved Using the Transmission Line

FIGS. 30-34 illustrate simulation results for a single stage resistive feedback Noise-Canceling LNA, demonstrating how much noise a feedback resistor generates. FIG. 30 shows the noise voltage from the feedback resistor is 456 pV. From a power point of view, noise power from the feedback resistor is 20% of the noise power for the whole LNA. FIGS. 31 and 32 show the input S11 and output S22 S parameters for this design. FIG. 33 shows S21, the amplifier gain vs frequency and FIG. 34 shows the minimum noise figure and the actual noise figure vs. frequency. The best noise figure was 2.7 dB.

FIGS. 35A-35D show the simulated results for a comparable single stage Transmission line Feedback Noise Canceling LNA. The feedback transmission line only generates 40 pV noise voltage and the combination of transmission lines generates only 1% of the total noise power. The lowest noise figure was <2.5 dB as shown in FIG. 35D. Thus, the Transmission line NC-LNA successfully eliminated the thermal noise created by a feedback resistor and reduced the NF, showing the effectiveness of this approach.

FIGS. 36A-36D illustrates simulation results for the single stage Noise Canceling LNA with transmission line feedback illustrated in FIG. 29. From 57-66 GHz, the maximum gain is 7.34 dB. The noise figure NF is well below 3 dB over the entire range, and can reach as low as 2.37 dB. Input/output impedance matching is good. FIGS. 37A-37B shows the stability factor "StabFact" is greater than unity and stability measure "StabMeas" is positive, proving the LNA is unconditionally stable.

b. NC-LNA with Transmission Line Feedback

A plurality of LNAs as illustrated in FIG. 29 can be cascaded so that the output of one the LNAs is fed to the input of the next LNA. Transistor level simulation using 65 nm CMOS predictive models of this cascade is performed to better facilitate comparison with reported results. Results for a 3 stage cascade of the LNA of FIG. 29 are shown in FIGS. 38A-38D. In the intended operating frequency range from 57-66 GHz, the gain is well over 16 dB with peak gain at 21.0 dB. The noise figure is below 3.5 dB with minimum NF at 2.87 dB. Input/output impedances are well matched. FIG. 39 is a 1-dB compression point plot illustrating linearity of the cascade LNA. The gain dropped 1 dB at an input power=−31 dB.

For the LNA system, power and area consumption are also very important. There are two DC power sources feeding power into the system: (1) biasing voltage source for MOSFET1 gate (also responsible for providing DC biasing current Ids for MOSFET1, and (2) DC biasing current Ids for MOSFET2/3/4. The 3 stage LNA consumes 9.6 mW (two power sources multiplied by 3-stages).

Table 1 in FIG. 40 compares the performance of this 60 GHz Noise Canceling LNA with transmission line feedback and with other 60 GHz LNA designs. It is clear that the noise figure is well below other published results.

Possible Modifications and Variations

The LNA incorporating voltage dividing as described herein can be implemented in many applications including, but not limited to, in a receiver of a (e.g., 5G) wireless base station.

Amplifier structures including the voltage dividing structures can be implemented in a variety of ways. In one example, the amplifier includes a single stage feedback amplified with a TL instead of with a LNA In a further example, the LNA comprises a superposition or combination of two (e.g., common source) LNA, one with feedback and the other without feedback

Advantages and Improvements

Low noise amplifiers are ubiquitous in wireless data network receivers and radios. The maximum transmission distance is limited by the receiver noise which is mostly determined by the noise figure of the first amplifier stage, the LNA. Reduction of LNA noise is thus always desirable in that it can increase transmission range or reduce power consumption resulting in higher performance or reduced system cost.

At lower frequencies resistors are used for feedback in LNAs because they are cheap and accurate in modeling but at higher frequencies the resistors do not work as expected. Inductors work at somewhat higher frequencies, but accurate inductance in 60 GHz frequency is also difficult to fabricate.

Embodiments described herein lower the noise of the LNA and improve linearity of the noise canceling relative to conventional devices. For example, reference [1] teaches away from using the topology of FIG. 2 for achieving noise cancelation at higher frequencies (e.g., 60 GHz). Specifically, reference [1] at page 279 states that exact noise cancellation occurs only at DC and the cancellation degrades as the frequency increases because the complex source impedance affects the noise voltage at node X and Y in a different manner. In another example, reference [2] uses an inductive load or a transformer that only operates at certain frequencies (not including the 60 GHz ranges or other higher frequencies useful for wireless communication), certain restrictive amplification levels and certain restrictive bandwidth ranges. Specifically, the circuits in reference [2] only function at lower frequencies that fall well below the frequency ranges achievable using embodiments described herein.

Reference [1] also assumes that the feedback ratio for a NCLNA also needs to be explicitly real. Initial attempts to achieve this using a single transmission line were unsuccessful except, for special cases, and general feedback ratios could not be achieved while maintaining this constraint. It was found however that by using more complicated transmission line structures incorporating shunt stubs could in fact provide sufficient degrees of freedom to allow the design of a feedback network with a desired feedback ratio while also keeping this ratio as a real number. Later it was realized that this ratio did not in fact need to be real for high frequency designs incorporating realistic parasitics and additional phase delays for noise canceling to be achieved.

In the typical descriptions and use of transmission lines, impedance matching is desired. In the use of transmission lines for a feedback network intentional mismatching is needed contrary to their conventional use.

Thus, the low noise amplifier embodiments described herein using transmission line based feedback structures (or voltage dividing for feedback) are surprising and unexpected in view of conventional knowledge. However, the benefits of using transmission line based voltage dividing for noise cancelation are also surprising and unexpected in view of our detailed investigations.

Moreover, a transmission line solution as described herein has potentially higher Q than one using inductors or transformers and achieves noise cancellation at higher frequencies while still being practical and small enough to fit on a chip. While at low frequencies (below 2 GHz) the integrated designs and solution described herein would require prohibitively large device geometries which cannot be economically fit on chip, for higher frequency ranges (60 GHz) the device geometries work well for fabrication on an integrated circuit or chip. However, the circuits described herein can be fabricated on any platform or using any technology (including, but not limited to, fabrication in integrated circuits or chip packages).

REFERENCES FOR SECOND EXAMPLE

The following references are incorporated by reference herein.

[1] Federico Bruccoleri, Eric A. M. Klumperink, Brain Nauta, "Wide-Band CMOS Low-Noise Amplifier Exploiting Thermal Noise Canceling," IEEE Journal of Solid-State Circuit, vol. 39, NO. 2, 2004

[2] Stephan C. Blaakmeer, Eric A. M. Klumperink, Domine M. W. Leenaerts and Brain Nauta, "Wideband Balun-LNA with Simultaneous Output Balancing, Noise-Canceling and Distortion-Canceling," IEEE Journal of Solid-State Circuit, vol. 43, NO. 6, June 2008

[3] Stephan C. Blaakmeer, Eric A. M. Klumperink, Domine M. W. Leenaerts and Brain Nauta, "A wideband Noise-Canceling CMOS LNA exploiting a Transformer", IEEE RFIC Symposium, 2006

[4] Sheng-Chun Wang, Pin Su, Kun-Ming Chen, Kuo-Hsiang Liao, Bo-Yuan Chen, Sheng-Yi Huang, Cheng-Chou Hung, and Guo-Wei Huang, "Comprehensive Noise Characterization and Modeling for 65-nm MOSFETs for Millimeter-Wave Applications", IEEE Transaction on Microwave Theory and Techniques, vol. 58, NO. 4, 2010

[5] Thomas Lee, "The Design of CMOS Radio-Frequency Integrated Circuits, second edition", 2004

[6] David M. Pozar, "Microwave Engineering, fourth edition", 2011

[7] Michael Kraemer, Daniela Dragomirescu, Robert Plana, "A low-power high gain LNA for the 60 GHz band in a 65 nm CMOS technology," IEEE P1156-P1159, 2009.

[8] Emanuel Cohen, Ofir Degani, and Dan Ritter, "A Wideband Gain-Boosting 8 mW LNA with 23 dB gain and 4 dB NF in 65 nm CMOS process for 60 GHz applications", IEEE Radio Frequency Integrated Circuits Symposium, 2012.

[9] Saihua Lin, K. B. Ng, Hang Wong, K. M. Luk, S. Simon Wong, and Ada S. Y. Poon, "A 60 GHz Digitally controlled RF Beamforming Array in 65 nm CMOS with Off-Chip Antennas", IEEE, 2011.

[10] Hsieh-Hung Hsieh, Po-Yi Wu, Chewn-Pu Jou, Fu-Lung Hsueh and Guo-Wei Huang, "60 GHz High-Gain Low-Noise Amplifiers with a Common-Gate Inductive Feedback in 65 nm CMOS", IEEE, 2011.

[11] Arun Natarajan, Sean Nicholson, Ming-Da Tsai and Brain Floyd, "A 60 GHz Variable-Gain LNA in 65 nm CMOS", IEEE Asian Soid-State Circuits Conference, 2008.

[12] Christopher Weyers, Pierre Mayr, Johannes W. Kunze, "A 22.3 dB Voltage Gain 6.1 dB NF 60 GHz LNA in 65 nm CMOS with differential output", ISSCC, mm-Wave & Phased Arrays, 2008.

[13] Yi-Keng Hsieh, Jing-Lin Kuo, Huei Want and Liang-Hung Lu, "A 60 GHz Broadband Low-Noise Amplifier with Variable-Gain Control in 65 nm CMOS", IEEE Mircowave and wireless components letters, November 2011

[14] U.S. Pat. No. 8,310,309.

[15] Vladimir Aparin, Lawrence E. Larson, "Modified Derivative Superposition Method for Linearizing FET Low-Noise Amplifiers", IEEE Transactions on Microwave Theory and Techniques, February 2005.

Process Steps

FIG. 41 is a flowchart illustrating a method of making a circuit including an amplifier having an input and an output.

Block 4100 represents designing a feedback path for the amplifier, wherein the feedback path includes one or more transmission lines electrically coupled or connected to the output and the input.

In one or more examples, the feedback path includes at least one of an input matching network connected to the input and an output matching network connected to the output. The matching networks are designed to perform one or more of a variety of functions including, but not limited to, impedance matching, bandwidth matching/tuning, and gain or feedback ratio tuning. The input matching network and the output matching network are co-designed taking into account the interaction between the input matching network and the output matching network through the one or more transmission lines. In various examples, in order to achieve the desirable performance across a variety of functionalities (e.g., desired feedback ratio and good impedance matching simultaneously), both the transmission line feedback elements and the matching networks are designed together (co-designed). In one or more examples, the co-design is performed iteratively guided by intuition and analysis. In other examples, the co-design is performed using a computer optimizer and the gain, bandwidth and allowable input and output reflections are incorporated in the optimizer goal function. Thus, the matching networks are not providing just an impedance matching function since they also influence the performance of the feedback ratio. Thus, an impedance matching network can be designed for additional matching functionalities (or taking into account the impact on other functionalities) in addition to the impedance matching since the matching network affects the amount of feedback, the gain, the bandwidth as well.

In contrast, for feedback paths including a resistive feedback amplifier, impedance matching networks are added at each end to minimize reflections and increase power coupling. At low frequencies, such feedback paths can be designed independently considering the impedance seen at the unmatched input and output respectively and ignoring, for instance, the input impedance change seen at the input due to the output matching network. In these low frequency cases the function of the matching networks are clearly for impedance matching only.

In various applications of the amplifier circuit described herein, it is desirable to independently select the gain (feedback ratio) and matching at the input and output. In order to independently tailor all 3, a sufficient number of tuning degrees of freedom are required. In some examples, this has been empirically shown to be provided by the transmission line and an input matching network and an output matching network. In special cases one or the other, or both matching networks could be eliminated.

More degrees of freedom may be obtained by the substitution of a more complicated structure for the transmission line. We have investigated lines that are broken into more sections with differing lengths, broken by transmission line stubs, but other methodologies may be used. In other examples, the matching networks comprise one or more capacitors and/or one or more inductors.

Example design methodologies include, but are not limited to, simulation software or algorithms (e.g., CADENCE and ADS) and the use of a Smith Chart.

Block 4102 represents manufacturing/obtaining the feedback path and coupling the feedback path to the amplifier.

In some examples, the amplifier and feedback path are manufactured on the same substrate, chip, or integrated circuit. In other examples, the circuit comprises a hybrid circuit wherein the amplifier and feedback path are assembled on separate substrates, chips, or ICs (e.g., board level assembly).

Block 4104 represents optionally coupling the amplifier having the feedback path to one or more additional amplifiers, a load, one or more additional circuits, or one or more components including, but not limited to, a voltage adder.

In one example, the amplifier with feedback is combined with a second amplifier so as to form a low noise amplifier (LNA). In one or more examples, the LNA comprises noise canceling LNA wherein the feedback path has a defined feedback ratio that cancels noise in the LNA. The feedback ratio may comprise a real or complex value, e.g., so that the amplified amplifier noise (e.g., channel noise) that gets fed back arrives at a summing node with an amplitude and phase that cancels the amplifier noise. In one or more examples, optimal gain may be achieved when Vy is phase shifted with respect to Vx.

In one example, the LNA is included in a receiver connected to an antenna in a mobile or smart phone and the feedback is tailored to amplify signals received by the antenna.

Block 4106 represents the end result, a circuit comprising the amplifier including a feedback path comprising one or more transmission lines.

Example device and method embodiments include, but are not limited to, the following (referring also to FIGS. 1-41).

1. A circuit 100, comprising an amplifier 102 having an input 110 and an output 108; and a feedback path 106 comprising a transmission line 104 electrically coupled or electrically connected to the output 108 and the input 110.

2. The circuit of clause 1, wherein the transmission line has a first end 1300 and second end 1302, and the feedback path comprises at least one of:

(1) one or more first matching components or matching networks 1304 connected to the first end; or (2) one or more second matching components or matching networks 1308 connected to the second end.

3. The circuit of clause 2, wherein the matching components or matching networks comprise at least one of impedance matching components or networks, bandwidth matching components or networks, or gain/feedback ratio tuning components or networks.

4. The circuit of clause 2 or 3, wherein the input and output matching components or networks each include one or more capacitors and/or one or more inductors.

5. The circuit of any of the clauses 2-4, wherein the matching components or networks comprise one or more bandwidth matching components electrically connected to the transmission line, wherein the bandwidth matching components match, tune, or optimize a bandwidth of the circuit to a center frequency in a narrow band application or to a range of frequencies in a broadband application of the circuit.

6. The circuit of any of the clauses 1-5, wherein the transmission line comprises a first end and a second end, and the feedback path comprises at least one of:

(1) a first transmission line stub 1306 connected to the first end; or (2) a second transmission line stub 1310 connected to the second end.

7. The circuit of any of the clauses 1-6, wherein the feedback path comprises a feedback structure 1350 including a plurality of transmission lines including the transmission line 104, one or more additional transmission lines in series with the transmission line, and one or more stub transmission lines.

8. The circuit of any of the clauses 1-7, wherein the matching components or networks comprise a narrowband impedance matching network including a lumped element, a single stub, double stub, or a quarter-wave transformer.

9. The circuit of any of the clauses 1-7, wherein the matching components or networks comprise a broadband impedance matching network such as, but not limited to, a binomial transformer or a chebyshev transformer.

10. The circuit of any of the clauses 1-9, wherein the feedback path comprises a plurality of transmission lines including the transmission line in a series-shunt-series configuration.

11. The circuit of any of the clauses 1-9, wherein the feedback path comprises a plurality of transmission lines including the transmission line in a shunt-series-shunt configuration.

12. The circuit of any of the clauses 1-11, wherein:
the feedback path has a reflection coefficient reflecting a portion of a feedback from the output so such that a feedback ratio Vin/Vout is less than 1, and
Vout is voltage at the output 108 and Vin is voltage at the input 110.

13. The circuit of any of the clauses 1-10, wherein the feedback path has a reflection coefficient reflecting a portion of a feedback from the output such that a feedback ratio Vin/Vout is a complex number, wherein Vout is voltage at the output 108 and Vin is voltage at the input 110.

14. The circuit of any of the clauses 1-13, wherein the feedback path has a reflection coefficient reflecting a portion of the feedback from the output such that Vin is in phase or out of phase with Vout, wherein Vout is voltage at the output 108 and Vin is voltage at the input 110.

15. The circuit of any of the clauses 1-14, wherein the feedback path includes the transmission line having at least one of a length l or an impedance $Z_L$ tailoring the reflection coefficient (see FIG. 4).

16. The circuit of clause 15, wherein the transmission line has a length l, or a total length of the transmission lines, is in a range of 0.25-0.75, or less than λ (where λ is the wavelength of the signal amplified by the amplifier).

17. The circuit of any of the clauses 1-16, wherein the feedback path comprises a voltage divider 1352 including the transmission lines 104, tailoring a phase and/or amplitude or the feedback by reflecting a portion of the input transmitted through the feedback path from the output 108 so that the voltage at the output Vout is larger than the voltage at the input 110 Vin and comprises a scaled portion of Vout. In one or more examples, the portion of Vin due to the output is subtracted from the output 108 of the amplifier.

18. A low noise amplifier circuit 3301 including the circuit of any of the clauses 1-17.

19 The circuit of clause 18, further comprising:
the amplifier 100 comprising a first amplifier having the output 108 comprising a first output Y and the input 110 comprising a first input X, wherein the first output outputs a first output signal in response to an input signal at the first input;
a second amplifier 3300 having a second output 3302 and a second input 3304, the second output outputting a second output signal in response to the input signal at the second input; and an adder 3306 (e.g., voltage adder or current adder) or summing node transmitting the first output signal and the second output signal to a load 3308 connected to the adder 3306.

20. The circuit of clause 19, wherein the feedback path has a reflection coefficient such that an amplified amplifier noise that gets fed back through the feedback path arrives at the summing node with an amplitude and phase that cancels the amplifier noise.

21. The circuit of any of the clauses 1-20, wherein:
the first amplifier comprises a first transistor 3310 having the first output and the first input.

22. The circuit of any of the clauses 19-21, wherein the second amplifier comprises a second transistor 3312 having the second output and the second input.

23 The circuit of any of the clauses 1-22, wherein:
the first transistor and/or the second transistor are each independently selected from an n-channel field effect transistor (e.g., n-channel MOSFET) and a p-channel field effect transistor (e.g., p-channel MOSFET).

24. The circuit of clause 23, wherein:
the first transistor has a first gate; a first channel coupled to the first gate (e.g., coupling a signal/noise from drain to the gate); and the first output from the first channel, wherein the first gate controls a first current through the first channel such that a first output signal is outputted from the first output Y in response to the input signal inputted to the first gate, and
the second transistor is connected in parallel with the first transistor, the second transistor having a second gate; a second channel; and the second channel having the second output 3302, wherein:
the second gate controls a second current through the second channel such that a second output signal is outputted from the second output 3302 in response to the input signal inputted to the second gate, and
the first output and the second output are electrically connected through the adder 3306, the adder transmitting the first output signal and the second output signal to a load 3308 connected to the adder 3306; and
the feedback path 106 comprises voltage divider 3314 electrically coupling the first output of the first transistor to the first gate of the first transistor, the voltage divider allowing a portion of the first output signal to be reflected from the load to the first gate.

25. The circuit of any of the clauses 21-24, wherein:
the first transistor and/or the second transistor comprise n-channel FETs each having a source and a drain, wherein the outputs comprise the drain, or the first transistor and the second transistor comprise p-channel MOSFETs each having a drain and a source, and wherein the outputs comprise the source.

26. The circuit of any of the clauses 19-25, wherein:
the feedback path has an impedance reflecting a portion of the first output signal transmitted from the load to the input, and
the first output signal, the input signal, and the second output signal each have a frequency:
greater than 6 gigahertz (GHz), and/or
in a range defined by an IEEE standard for wireless communication, and/or
in a range of 6 GHz-10 THz, 2 GHz-10 THz, or 30-60 GHz.

27. The circuit of any of the clauses 19-26, wherein the feedback path reflects the portion of the first output signal such that the amplifier circuit has a noise figure of 3 dB or less 28. The circuit of any of the clauses 1-27, wherein a signal inputted to the input has an frequency f wherein 57≤f≤66 GHz.

29. The circuit of any of the clauses 1-28, wherein a signal inputted to the input has an input frequency in a range defined by an IEEE standard for wireless communication (e.g., but not limited to, 802.11.ad or 802.11.ay).

30. The circuit of any of the clauses 1-29, wherein a signal inputted to the input has an input frequency in a range of 6 GHz-10 THz.

31. A wireless receiver including the circuit of any of the clauses 1-30.

32. A cell tower or base station for a mobile communication network including the circuit of any of the clauses 1-31.

33. One or more integrated circuits or one or more chips including the circuit of any of the clauses 1-32.

34. The one or more integrated circuits of clause 33, further comprising a first substrate including the amplifier comprising a transistor and a second substrate including the one or more transmission lines.

35. The circuit of any of the clauses 1-34, wherein the transmission line comprises a microstrip, stripline, coplanar line or grounded coplanar line.

36. A method of making circuit, comprising:
fabricating an amplifier having an input and an output; and
fabricating a feedback path comprising a transmission line or a plurality of transmission lines between the output and the input.

37. The method of clause 36, wherein amplifier and the feedback path are fabricated on separate substrates or using board level assembly.

38. The method of clause 36 or 37, further comprising fabricating a low noise amplifier circuit or multistage noise canceling low noise amplifier comprising the circuit.

39. The circuit of any of the clauses 1-35 manufactured using the method of any of the clauses 36-38.

40. The method of clause 39, wherein the impedance, bandwidth, and gain of the matching networks or components and the one or more transmission lines are co-designed using a simulation taking into account an interaction between the one or more transmission lines and the matching networks.

41. A method of making a low noise amplifier circuit, comprising:
selecting, configuring, and/or providing a first transistor having a first gate; a first channel coupled to the first gate (e.g., channel coupling signals/noise from drain to gate); and a first output from the first channel, wherein the first gate controls a first current through the first channel such that a first output signal is outputted from the first output in response to an input signal inputted to the first gate, the input signal having an input frequency greater than 6 gigahertz (GHz);
selecting, configuring, and/or providing a second transistor connected in parallel with the first transistor, the second transistor having a second gate; a second channel; and the second channel having a second output, wherein:
the second gate controls a second current through the second channel such that a second output signal is outputted from the second output in response to the input signal inputted to the second gate, and
the first output and the second output are electrically connected through a voltage adder or current adder, the voltage adder or current adder transmitting the first output signal and the second output signal to a load connected to the voltage adder or the current adder; and
designing and/or providing a voltage divider electrically coupling the first output of the first transistor to the first gate of the first transistor, the voltage divider allowing a portion of the first output signal to be reflected from the load to the first gate.

42. The method of clause 41, wherein the portion of the first output signal reflected from the load to the first gate is such that the low noise amplifier has a noise figure of 3 dB or less at the input frequency greater than 6 gigahertz (GHz).

43. The method of clauses 41 or 42, wherein the configuring and designing includes simulating the circuit using simulation software or algorithms (e.g., but not limited to, CADENCE and ADS).

44. The method of any of the clauses 41-43, wherein the voltage divider includes a plurality of transmission lines, and the simulating includes optimizing a value of at least one parameter selected from characteristic impedances of the transmission lines and lengths of the one or more transmission lines.

45. The method of any of the clauses 41-44, wherein the configuring and designing includes using a Smith chart.

46. The method of clause 45, further comprising:
obtaining the Smith chart for analyzing the circuit comprising the low noise amplifier transmitting the output signals to the load, wherein the Smith chart plots reflection coefficient of the first and/or second output signals at the load as a function of frequency of the output signals and impedance of the low noise amplifier;
using the Smith chart to identify the one or more impedances for which the reflection coefficient is non zero at a selected gain and a selected bandwidth for the low noise amplifier, such that the first output signal is reflected from the load to the first gate of the first transistor; and
selecting one or more of the impedances for which a noise figure of the low noise amplifier is 3 dB or less at the frequency of at least 6 GHz.

47. The method of clause 46, wherein the reflection coefficient is selected so as to counter a reflection of the first output signal including a component generated from thermal noise in the low noise amplifier.

48. The method of any of the clauses 41-47, further comprising impedance matching an input impedance of the low noise amplifier to an output impedance of a source providing the input signal, such that an $S_{11}$ of the low noise amplifier circuit is −10 dB or lower.

49. A method of making a low noise amplifier circuit, comprising:
(a) connecting a first transistor in a common source amplifier configuration (MOSFET1), wherein the first transistor's drain and gate are biased at a same DC voltage;
(b) connecting a second transistor (MOSFET2) in parallel with the first transistor so that the gate of the first transistor is electrically connected to the gate of the second transistor and the second transistor and the first transistor are configured to achieve derivative superposition ($g_{m2}"=-g_{m1}"$);
(c) connecting the drain of the first transistor to a third transistor (MOSFET 3) configured as a source follower;
(d) creating a feedback structure terminated into a 50Ω impedance;
(e) connecting the gate and the drain of the first transistor (MOSFET1) with the feedback structure created in (d);
(f) impedance matching by independently providing an impedance matching structure, comprising either an LC component or a Transmission line, to each of the gates of the first transistor and the second transistor; and (f) refining a voltage dividing ratio (comprising a voltage and the output of the first transistor divided by a voltage at the input to the first transistor), by tuning impedances of the feedback structure and/or the impedance matching structure, while tracking an s-parameter and noise figure at an output of the low noise amplifier circuit.

50. The method of clause 49, further comprising refining the voltage dividing ratio while maintaining the impedance at the input and output of the feedback structure of at least 50 Ohms.

51. The method of clause 49 or 50, wherein the voltage ratio is refined so that the noise figure in the circuit is reduced or is 3 dB or less.

52. The method of any of the clauses 49-51, comprising tuning the feedback using a Smith Chart or simulation software.

53. The method of any of the clauses 41-52, wherein the low noise amplifier is formed in an integrated circuit or chip.

54. The circuit of any of the clauses 1-40 manufactured using the method of any of the clauses 41-53.

55. A circuit, comprising:
a first amplifier comprising a first transistor, the first transistor comprising a gate and an output;
a voltage divider comprising a network of transmission lines connected between the gate and the output.

56. The circuit of clause 55, further comprising a second amplifier comprising a second transistor in parallel with the first transistor.

57. The circuit of clause 56, wherein:
the first transistor comprises the gate, a source, and a drain, and
the first transistor is configured as a common source amplifier, and
the output is the drain.

58. The circuit of any of the clauses 55-58, wherein:
the second transistor and the first transistor are biased and configured (e.g., sized with length and width) to achieve derivative superposition, and
the output of the low noise amplifier comprises the output of the first transistor combined with the output of the second transistor.

59. The circuit of any of the clauses 55-58, further comprising a voltage adder connected to and combining the outputs of the first transistor and the second transistor.

60. The circuit of any of the clauses 55-59 comprising the circuit of any of the clauses 1-40.

61. The circuit of any of the clauses 1-40, wherein the matching networks are such that the input impedance to the feedback path is purely resistive.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A low noise amplifier circuit comprising, comprising:
an amplifier having an input and an output; and
a feedback path comprising a voltage divider comprising
a transmission line between the output and the input, the transmission line providing feedback between the output and the input so that an output voltage Vout at the output is larger than an input voltage Vin at the input; and wherein:
the amplifier comprises a first amplifier having a first output and the input comprising a first input, wherein the first output outputs the output voltage comprising a first output signal in response to the input voltage comprising an input signal at the first input;
a second amplifier having a second output and a second input, the second output outputting a second output signal in response to the input signal at the second input; and
an adder transmitting the first output signal and the second output signal to a load connected to the adder.

2. A circuit, comprising:
an amplifier having an input and an output; and
a feedback path comprising at least one of:
a transmission line having a first end and a second end; and
at least one of:
one or more first components connected to the first end and the second end connected directly to the output; or
one or more second components connected to the second end and the first end connected directly to the input, or
the one or more first components connected to the first end and the one or more second components connected to the second end.

3. The circuit of claim 2, wherein the first components and the second components each comprise a capacitor and an inductor.

4. The circuit of claim 2, wherein:
the feedback path comprises at least one of:
the one or more first components comprising a first transmission line stub connected to the first end; or
the one or more second components comprising a second transmission line stub connected to the second end.

5. The circuit of claim 2, wherein at least one of the one or more first components or the one or more second components comprise one or more bandwidth matching components electrically connected to the transmission line, wherein the bandwidth matching components match or tune a bandwidth of the circuit to a center frequency in a narrow band application or to a range of frequencies in a broadband application of the circuit.

6. The circuit of claim 2, wherein the feedback path comprises a plurality of transmission lines including the transmission line, one or more additional transmission lines in series with the transmission line, and one or more stub transmission lines.

7. The circuit of claim 2, wherein the feedback path comprises a plurality of transmission lines including the transmission line in a series-shunt-series configuration or a shunt-series-shunt configuration.

8. The circuit of claim 1, wherein:
the feedback path has an impedance reflecting a portion of a feedback from the output so such that a feedback ratio Vin/Vout is less than 1.

9. The circuit of claim 1, wherein:
the first amplifier comprises a first transistor having the first output and the first input, and
the second amplifier comprises a second transistor having the second output and the second input.

10. The circuit of claim 9, wherein:
the first transistor and the second transistor are each independently selected from an re-channel field effect transistor and a p-channel field effect transistor.

11. The circuit of claim 1, wherein:
the feedback path has an impedance reflecting a portion of the first output signal transmitted from the load to the input, and
the first output signal, the input signal, and the second output signal each have a frequency:
greater than 6 gigahertz (GHz), and/or
in a range defined by an IEEE standard for wireless communication, and/or
in a range of 6 GHz 10 THz.

12. The circuit of claim 11, wherein the feedback path reflects the portion of the first output signal such that the amplifier circuit has a noise figure of 3 dB or less.

13. A wireless receiver, cell tower, or base station for a mobile communication network including the low noise amplifier circuit of claim 1.

14. One or more integrated circuits or one or more chips including the circuit of claim 1.

15. The one or more integrated circuits of claim 14, further comprising a first substrate including the amplifier comprising a transistor, wherein the feedback path is on the first substrate or on a second substrate different from the first substrate.

16. A method of making circuit, comprising:
fabricating an amplifier having an input and an output on a first substrate; and
fabricating a feedback path comprising a transmission line or a plurality of transmission lines between the output and the input, wherein the feedback path is fabricated on the first substrate or a second substrate different from the first substrate, wherein the feedback path comprises
a transmission line having a first end and second end; and
at least one of:
one or more first components connected to the first end and the second end connected directly to the output; or
one or more second components connected to the second end and the first end connected directly to the input, or
one or more first components connected to the first end and one or more second components connected to the second end.

17. The method of claim 16, further comprising fabricating a low noise amplifier circuit or multistage noise canceling low noise amplifier comprising the circuit.

18. The method of claim 16, wherein the feedback path comprises a plurality of transmission lines including the transmission line in a series-shunt-series configuration or a shunt-series-shunt configuration.

* * * * *